(12) United States Patent
Kim et al.

(10) Patent No.: US 10,797,250 B2
(45) Date of Patent: Oct. 6, 2020

(54) ELECTRONIC APPARATUS AND LIGHTING APPARATUS

(71) Applicant: Samsung Display Co., Ltd., Yongin-Si, Gyeonggi-Do (KR)

(72) Inventors: Dongchan Kim, Yongin-si (KR);
Wonjong Kim, Yongin-si (KR);
Dongkyu Seo, Yongin-si (KR);
Myungchul Yeo, Yongin-si (KR);
Hyungseok Jang, Yongin-si (KR);
Yoonhyeung Cho, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/286,327

(22) Filed: Feb. 26, 2019

(65) Prior Publication Data

US 2019/0267556 A1 Aug. 29, 2019

(30) Foreign Application Priority Data

Feb. 26, 2018 (KR) .................. 10-2018-0022970

(51) Int. Cl.
*H01L 51/00* (2006.01)
*H01L 33/04* (2010.01)
(Continued)

(52) U.S. Cl.
CPC .......... *H01L 51/0089* (2013.01); *H01L 33/04* (2013.01); *H01L 33/502* (2013.01);
(Continued)

(58) Field of Classification Search
CPC .............. H01L 51/0089; H01L 51/502; H01L 51/0054; H01L 51/0058; H01L 51/006;
(Continued)

(56) References Cited

U.S. PATENT DOCUMENTS

| 5,882,548 A | 3/1999 | Liang et al. |
| 6,429,318 B1 | 8/2002 | Mitzi |

(Continued)

FOREIGN PATENT DOCUMENTS

| CN | 104795505 A | 7/2015 |
| EP | 2942826 A2 | 11/2015 |

(Continued)

OTHER PUBLICATIONS

Edith Rogers, "Engineering the electronic structure of lanthanide based materials" Dec. 18, 2012, 177 pages.

(Continued)

*Primary Examiner* — Anthony Ho
(74) *Attorney, Agent, or Firm* — Kile Park Reed Houtteman PLLC

(57) ABSTRACT

An electronic apparatus and a lighting apparatus are provided. The apparatus includes a light-emitting device that has an intermediate layer between two electrodes, wherein the intermediate layer includes an emission layer having a perovskite compound represented by one of the following formulas: 1) $[A][B^1_{n1}B^2_{(1-n1)}][X]_3$, 2) $[A]_2[B^1_{n2}B^2_{(1-n2)}][X]_4$, 3) $[A]_3[B^1_{n2}B^2_{(1-n2)}]_2[X]_7$, and 4) $[A]_4[B^1_{n2}B^2_{(1-n2)}]_3[X]_{10}$, wherein, in Formula 1), A is at least one monovalent organic-cation, a monovalent inorganic cation, or any combination thereof, $B^1$ is a $Sm^{2+}$ ion, $B^2$ is at least one divalent inorganic cation and does not include a $Sm^{2+}$ ion, n1 is a real number satisfying $0 < n1 \leq 1$, n2 is a real number satisfying $0 < n2 \leq 1$, and X is at least one monovalent anion.

23 Claims, 4 Drawing Sheets

(51) Int. Cl.
| | |
|---|---|
| H01L 33/50 | (2010.01) |
| H01L 33/60 | (2010.01) |
| H01L 51/50 | (2006.01) |
| H01L 51/52 | (2006.01) |

(52) U.S. Cl.
CPC ............ *H01L 33/60* (2013.01); *H01L 51/006* (2013.01); *H01L 51/0054* (2013.01); *H01L 51/0058* (2013.01); *H01L 51/0061* (2013.01); *H01L 51/0065* (2013.01); *H01L 51/0067* (2013.01); *H01L 51/0072* (2013.01); *H01L 51/0073* (2013.01); *H01L 51/0074* (2013.01); *H01L 51/0085* (2013.01); *H01L 51/502* (2013.01); *H01L 51/504* (2013.01); *H01L 51/5284* (2013.01); H01L 2251/308 (2013.01)

(58) Field of Classification Search
CPC ............ H01L 51/0061; H01L 51/0065; H01L 51/0067; H01L 51/0072; H01L 51/0073; H01L 51/0074; H01L 51/0085; H01L 51/504; H01L 51/5284
See application file for complete search history.

(56) References Cited

U.S. PATENT DOCUMENTS

| | | |
|---|---|---|
| 6,730,416 B1 | 5/2004 | Chondroudis et al. |
| 2009/0325782 A1 | 12/2009 | Venkataramani et al. |
| 2015/0136232 A1 | 5/2015 | Snaith et al. |
| 2016/0372714 A1 | 12/2016 | Kim |
| 2017/0294607 A1 | 10/2017 | Kim et al. |
| 2017/0352823 A1 | 12/2017 | Kim et al. |
| 2017/0356623 A1 | 12/2017 | Kim et al. |
| 2017/0365645 A1 | 12/2017 | Kim et al. |
| 2018/0047928 A1 | 2/2018 | Kim et al. |
| 2018/0083213 A1 | 3/2018 | Snaith et al. |
| 2018/0122613 A1 | 5/2018 | Sadasivan et al. |

FOREIGN PATENT DOCUMENTS

| | | |
|---|---|---|
| JP | 2016-021488 A | 2/2016 |
| KR | 10-2001-0015084 A | 2/2001 |
| KR | 10-2001-0078173 A | 8/2001 |
| KR | 10-2011-0012246 A | 2/2011 |
| KR | 10-2013-0099045 A | 9/2013 |
| KR | 10-2014-0042274 A | 4/2014 |
| KR | 10-2015-0011002 A | 1/2015 |
| KR | 10-2015-0089961 A | 8/2015 |
| KR | 10-2017-0000053 A | 1/2017 |
| KR | 10-2017-0116630 A | 10/2017 |
| WO | 2016-083783 A1 | 6/2016 |

OTHER PUBLICATIONS

A. Poglitsch and D. Weber, "Dynamic disorder in methylammoniumtrihalogenoplumbates (II) observed by millimeterwave spectroscopy" Dec. 1, 1987, 7 pages.
Ivo Borriello, "Ab initio investigation of hybrid organic-inorganic perovskites based on tin halides", Jul. 6, 2016, 10 pages.
Constantinos C. Stoumpos, "Semiconducting Tin and Lead Iodide Perovskites with Organic Cations: Phase Transitions, High Mobilities, and Near-Infrared Photoluminescent Properties", Jul. 8, 2013, 20 pages.
Mingzhen Liu, "Efficient planar heterojunction perovskite solar cells by vapour deposition", Sep. 19, 2013, 8 pages.
Mei-Feng Xu et al, "A low temperature gradual annealing scheme for achieving high performance perovskite solar cells with no hysteresis", Jun. 5, 2015, 7 pages.
Ivan E. Castelli et al, "Bandgap calculations and trends of organometal halide perovskites", Aug. 15, 2014, 8 pages.
Zhi-Kuang Tan et al, "Bright light-emitting diodes based on organometal halide perovskite", Aug. 3, 2014, 6 pages.
Yonghua Chen et al, "Layer-by-Layer Growth of CH 3 NH 3 PbI 3—x Cl x for Highly Effi cient Planar Heterojunction Perovskite Solar Cells", Dec. 23, 2014, 7 pages.
Mohammad I. Hossain et al, "Copper oxide as inorganic hole transport material for lead halide perovskite based solar cells", Jul. 24, 2015, 11 pages.
Chun-Chao Chen et al, "Perovskite/polymer monolithic hybrid tandem solar cells utilizing a low-temperature, full solution process", Jan. 5, 2015, 10 pages.
E Rogers et al, "Systematics in the optical and electronic properties of the binary lanthanide halide, chalcogenide and onictide compounds: an overview", Sep. 28, 2011, 33 pages.
Jizhong Song et al, "Quantum Dot Light-Emitting Diodes Based on Inorganic Perovskite Cesium Lead Halides", Aug. 9, 2015, 6 pages.
Himchan Cho et al, "Overcoming the electroluminescence efficiency limitations of perovskite light-emitting diodes", Dec. 3, 2015, 5 pages.
Feng Zhang et al, "Brightly Luminescent and Color-Tunable Colloidal CH3NH3PbX3 (X=Br, I, Cl) Quantum Dots: Potential Alternatives for Display Technology", Mar. 30, 2015, 10 pages.
Loredana Protesescu et al, "Nanocrystals of Cesium Lead Halide Perovskites (CsPbX3, X=Cl, Br, and I): Novel Optoelectronic Materials Showing Bright Emission with Wide Color Gamut", Jan. 19, 2015, 5 pages.
David B. Mitzi et al, "Preparation and Properties of (C4H9NH3)2EuI4: A Luminescent Organic-Inorganic Perovskite with a Divalent Rare-Earth Metal Halide Framework", May 9, 1997.
Himchan Cho et al., "Overcoming the electroluminescence efficiency limitations of perovskite light-emitting diodes" Science, 350, 6265, 1222-1224 (Dec. 2015). 5pages.
Sandeep Pathak et al. "Perovskite Crystals for Tunable White Light Emission", Chem. Mater., 27, 8066-8075 (2015), 10 pages.
Edith Rogers, "Engineering the electronic structure of lanthanide based materials", Uitgeverij BOXPress, Oisterwijk, 176pages.
Sjoerd A. et al., "Perovskite Materials for Light-Emitting Diodes and Lasers", Advanced Materials, vol. 28, No. 32, Aug. 1, 2016, p. 6804-6834, XP55460556.
Gencai Pan et al., "Doping Lanthanide into Perovskite Nanocrystals: Highly Improved and Expanded Optical Properties" vol. 17, Nov. 28, 2017, pp. 8005-8011, XP002792764 Properties, Nano Letters, vol. 17.
Gerd Meyer, "Neue Chlor-Perowskite mit zweiwertigenLanthaniden:CsLn1lCl3", Naturwissenchaftem. vol. 65, Jan. 1, 1978, pp. 258, XP002792765.
Gaby Schilling et al., "Ternare Bromide und Iodie zweiwertiger Lanthanide und ihre Erdalkali-Analoga vom Typ AMX3 und AM2x5", Zeitschrift fur anorganische und Allgemeine Chemie, vol. 622, Jun. 12, 1996, pp. 759-765, XP002792766.
Jialong Duan et al,"Lanthanide Ions Doped CsPbBr3 Halide for HTM-Free 10.14%—Efficiency Inorganic Perovskite Solar Cell with an Ultrahigh Open-Circuit Voltage of 1.594 V", Adv. Energy Mater., vol. 8, 1802346, Sep. 24, 2018, XP002792767.
European Communication corresponding to European Patent Application No. 19158937.3 dated Jul. 23, 2019 9 pages.

10

| 19 |
| 17 |
| 15 |
| 13 |
| 11 |

ELECTRONIC APPARATUS AND LIGHTING APPARATUS

CROSS-REFERENCE TO RELATED APPLICATION

This application claims the benefit of Korean Patent Application No. 10-2018-0022970 filed on Feb. 26, 2018 in the Korean Intellectual Property Office, the disclosure of which is incorporated herein in its entirety by reference.

BACKGROUND

1. Field

One or more embodiments relate to an electronic apparatus including a perovskite compound and a lighting apparatus including a perovskite compound.

2. Description of the Related Art

A perovskite compound refers to a material having a three-dimensional crystal structure associated with a $CaTiO_3$ crystal structure, and may be used in various electronic apparatuses.

For example, a perovskite compound may be used as a light-emitting material, an electrode material, a light sensitive material, a light-absorbing material, or the like in a light-emitting device.

However, a conventional perovskite compound has a limitation in terms of implementing an electronic apparatus having high efficiency and a long lifespan. In particular, a perovskite compound including a $Pb^{2+}$ cation may adversely affect the environment.

SUMMARY

Aspects of the present disclosure provide a high-quality electronic apparatus including a perovskite compound and a lighting apparatus.

Additional aspects will be set forth in part in the description which follows and, in part, will be apparent from the description, or may be learned by practice of the presented embodiments.

An aspect provides an electronic apparatus including a light-emitting device including: a first electrode; a second electrode facing the first electrode; and an intermediate layer between the first electrode and the second electrode and including an emission layer, wherein the emission layer includes a perovskite compound represented by one of Formulae 1 to 4:

  <Formula 1>

  <Formula 2>

  <Formula 3>

  <Formula 4>

In Formula 1,
A may be at least one monovalent organic-cation, a monovalent inorganic cation, or any combination thereof,
$B^1$ may be a $Sm^{2+}$ ion,
$B^2$ may be at least one divalent inorganic cation and may not include a $Sm^{2+}$ ion,
n1 may be a real number satisfying $0<n1\leq1$,
n2 may be a real number satisfying $0<n2\leq1$, and
X may be at least one monovalent anion.

Another aspect provides an electronic apparatus including: a first substrate; an organic light-emitting device; and a thin film located in at least one traveling path of light emitted from the organic light-emitting device, wherein the thin film includes the perovskite compound:

  <Formula 1>

  <Formula 2>

  <Formula 3>

  <Formula 4>

In Formula 1,
A may include at least one monovalent organic-cation, a monovalent inorganic cation, or any combination thereof,
$B^1$ may be a $Sm^{2+}$ ion,
$B^2$ may be at least one divalent inorganic cation and may not include a $Sm^{2+}$ ion,
n1 is a real number satisfying $0<n1\leq1$,
n2 is a real number satisfying $0<n2\leq1$, and
X may be at least one monovalent anion.

Another aspect provides a lighting apparatus including: a light source; and a light conversion layer that absorbs at least part of light emitted from the light source and emits light having a wavelength band different from that of the absorbed light, wherein the light conversion layer includes a perovskite compound represented by one of Formulae 1 to 4:

  <Formula 1>

  <Formula 2>

  <Formula 3>

  <Formula 4>

In Formula 1,
A may be at least one monovalent organic-cation, a monovalent inorganic cation, or any combination thereof,
$B^1$ may be a $Sm^{2+}$ ion,
$B^2$ may be at least one divalent inorganic cation and may not include a $Sm^{2+}$ ion,
n1 may be a real number satisfying $0<n1\leq1$,
n2 may be a real number satisfying $0<n2\leq1$, and
X may be at least one monovalent anion.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figures 1, 2:
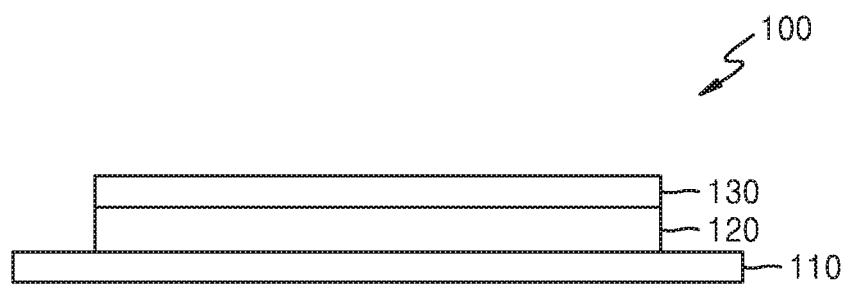
FIG. 1 is a schematic view of a light-emitting device according to an embodiment.
FIG. 2 is a schematic view of an organic light-emitting display apparatus according to an embodiment.

The present disclosure will now be described more fully with reference to exemplary embodiments. The disclosure may, however, be embodied in many different forms and should not be construed as being limited to the embodiments set forth herein; rather, these embodiments are provided so that this disclosure will be thorough and complete, and will fully convey the concept of the disclosure to those skilled in the art. Advantages, features, and how to achieve them of the present inventive concept will become apparent by reference to the embodiment that will be described later in detail, together with the accompanying drawings. This inventive concept may, however, be embodied in many different forms and should not be limited to the exemplary embodiments.

As used herein, the terms "first", "second", etc., are used only to distinguish one component from another, and such components should not be limited by these terms.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

A perovskite compound included in an electronic apparatus or a lighting apparatus according to an embodiment is represented by one of Formulae 1 to 4:

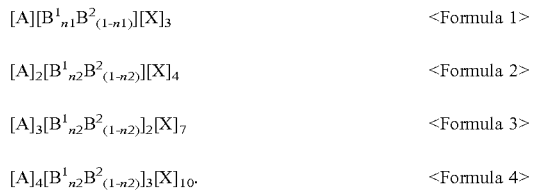

The perovskite compound refers to a compound having a perovskite crystal structure. The perovskite crystal structure refers to a three-dimensional crystal structure associated with a $CaTiO_3$ crystal structure.

A in Formulae 1 to 4 may be at least one monovalent organic-cation, a monovalent inorganic cation, or any combination thereof.

For example, A may be i) one monovalent organic-cation, ii) one monovalent inorganic cation, iii) a combination of at least two different monovalent organic-cations, iv) a combination of at least two different monovalent inorganic cations, or v) a combination of a monovalent organic-cation and a monovalent inorganic cation.

In one embodiment, A may be $(R_1R_2R_3C)^+$, $(R_1R_2R_3R_4N)^+$, $(R_1R_2R_3R_4P)^+$, $(R_1R_2R_3R_4As)^+$, $(R_1R_2R_3R_4Sb)^+$, $(R_1R_2N=C(R_3)-NR_4R_5)^+$, a substituted or unsubstituted cycloheptatrienyl cation, a monovalent cation of a substituted or unsubstituted 5-membered nitrogen-containing ring, a monovalent cation of a substituted or unsubstituted 6-membered nitrogen-containing ring, $Li^+$, $Na^+$, $K^+$, $Rb^+$, $Cs^+$, $Fr^+$, or any combination thereof, $R_1$ to $R_5$ may each independently be selected from hydrogen, deuterium, —F, —Cl, —Br, —I, a hydroxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_6$-$C_{60}$ aryl group, and —$N(Q_1)(Q_2)$, at least one substituent of the substituted cycloheptatrienyl cation, the monovalent cation of the substituted 5-membered nitrogen-containing ring, and the monovalent cation of the substituted 6-membered nitrogen-containing ring may be selected from deuterium, —F, —Cl, —Br, —I, a hydroxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_6$-$C_{60}$ aryl group, and —$N(Q_3)(Q_4)$, and $Q_1$ to $Q_4$ may each independently be selected from hydrogen, deuterium, a hydroxyl group, a $C_1$-$C_{60}$ alkyl group, a $C_2$-$C_{60}$ alkenyl group, a $C_2$-$C_{60}$ alkynyl group, a $C_1$-$C_{60}$ alkoxy group, and a $C_6$-$C_{60}$ aryl group.

The "5-membered nitrogen-containing ring" and the "6-membered nitrogen-containing ring" refer to an organic cyclic group including at least one N and at least one C as a ring-forming atom. For example, the "5-membered nitrogen-containing ring" may be an imidazole, a pyrazole, a thiazole, an oxazole, a pyrrolidine, a pyrroline, a pyrrole, or a triazolyl, and the "6-membered nitrogen-containing ring" may be a pyridine, a pyridazine, a pyrimidine, a pyrazine, or a piperidine, but embodiments of the present disclosure are not limited thereto.

For example, A in Formulae 1 to 4 may be $(R_1R_2R_3C)^+$, $(R_1R_2R_3R_4N)^+$, $(R_1R_2R_3R_4P)^+$, $(R_1R_2R_3R_4As)^+$, $(R_1R_2R_3R_4Sb)^+$, $(R_1R_2N=C(R_3)-NR_4R_5)^+$, a substituted or unsubstituted cycloheptatrienyl cation, a substituted or unsubstituted imidazolium, a substituted or unsubstituted pyridinium, a substituted or unsubstituted pyridazinium, a substituted or unsubstituted pyrimidinium, a substituted or unsubstituted pyrazinium, a substituted or unsubstituted pyrazolium, a substituted or unsubstituted thiazolium, a substituted or unsubstituted oxazolium, a substituted or unsubstituted piperidinium, a substituted or unsubstituted pyrrolidinium, a substituted or unsubstituted pyrrolium, a substituted or unsubstituted pyrrolium, a substituted or unsubstituted triazolium, $Li^+$, $Na^+$, $K^+$, $Rb^+$, $Cs^+$, $Fr^+$, or any combination thereof, $R_1$ to $R_5$ may each independently be selected from:

hydrogen, deuterium, —F, —Cl, —Br, —I, a hydroxyl group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, and a hydroxyl group;

a phenyl group, a naphthyl group, a biphenyl group, and a terphenyl group;

a phenyl group, a naphthyl group, a biphenyl group, and a terphenyl group, each substituted with at least one selected from deuterium, —F, —Cl, —Br, —I, a hydroxyl group, a $C_1$-$C_{20}$ alkyl group, and a $C_1$-$C_{20}$ alkoxy group; and

—$N(Q_1)(Q_2)$, at least one substituent of the substituted cycloheptatrienyl cation, the substituted imidazolium, the substituted pyridinium, the substituted pyridazinium, the substituted pyrimidinium, the substituted pyrazinium, the substituted pyrazolium, the substituted thiazolium, the substituted oxazolium, the substituted piperidinium, the substituted pyrrolidinium, the substituted pyrrolium, the substituted pyrrolium, and the substituted triazolium may be selected from:

deuterium, —F, —Cl, —Br, —I, a hydroxyl group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, and a hydroxyl group;

a phenyl group, a naphthyl group, a biphenyl group, and a terphenyl group;

a phenyl group, a naphthyl group, a biphenyl group, and a terphenyl group, each substituted with at least one selected from deuterium, —F, —Cl, —Br, —I, a hydroxyl group, a $C_1$-$C_{20}$ alkyl group, and a $C_1$-$C_{20}$ alkoxy group; and
—N($Q_3$)($Q_4$), and $Q_1$ to $Q_4$ may each independently be selected from hydrogen, deuterium, a hydroxyl group, a $C_1$-$C_{20}$ alkyl group, a $C_1$-$C_{20}$ alkoxy group, a phenyl group, a naphthyl group, a biphenyl group, and a terphenyl group.

In one or more embodiments, A in Formulae 1 to 4 may be $(R_1R_2R_3R_4N)^+$, $(R_1R_2R_3R_4P)^+$, $(R_1R_2R_3R_4As)^+$, $(R_1R_2R_3R_4Sb)^+$, $Li^+$, $Na^+$, $K^+$, $Rb^+$, $Cs^+$, $Fr^+$, or any combination thereof, $R_1$ to $R_4$ may each independently be selected from hydrogen, deuterium, —F, —Cl, —Br, —I, a hydroxyl group, a $C_1$-$C_{20}$ alkyl group, a $C_1$-$C_{20}$ alkoxy group, and —N($Q_1$)($Q_2$), and $Q_1$ and $Q_2$ may each independently be selected from hydrogen, deuterium, a hydroxyl group, a $C_1$-$C_{20}$ alkyl group, and a $C_1$-$C_{20}$ alkoxy group.

In one or more embodiments, A in Formulae 1 to 4 may be $(R_1R_2R_3R_4N)^+$, $K^+$, $Rb^+$, $Cs^+$, or any combination thereof, $R_1$ to $R_4$ may each independently be selected from hydrogen, deuterium, —F, —Cl, —Br, —I, a hydroxyl group, a $C_1$-$C_{20}$ alkyl group, a $C_1$-$C_{20}$ alkoxy group, and —N($Q_1$)($Q_2$), and $Q_1$ and $Q_2$ may each independently be selected from hydrogen, deuterium, a hydroxyl group, a $C_1$-$C_{20}$ alkyl group, and a $C_1$-$C_{20}$ alkoxy group.

In one or more embodiments, A in Formula 1 may be $(NH_4)^+$, $(PH_4)^+$, $(AsH_4)^+$, $(SbH_4)^+$, $(NF_4)^+$, $(PF_4)^+$, $(NCl_4)^+$, $(PCl_4)^+$, $(CH_3NH_3)^+$, $(CH_3PH_3)^+$, $(CH_3AsH_3)^+$, $(CH_3SbH_3)^+$, $((CH_3)_2NH_2)^+$, $((CH_3)_2PH_2)^+$, $((CH_3)_2AsH_2)^+$, $((CH_3)_2SbH_2)^+$, $((CH_3)_3NH)^+$, $((CH_3)_3PH)^+$, $((CH_3)_3AsH)^+$, $((CH_3)_3SbH)^+$, $((CH_3CH_2)NH_3)^+$, $((CH_3CH_2)PH_3)^+$, $((CH_3CH_2)AsH_3)^+$, $((CH_3CH_2)SbH_3)^+$, $(CH_2N_2H_4)^+$, $(C_7H_7)^+$, $(NH_3OH)^+$, $(NH_3NH_2)^+$, $((CH_2)_3NH_2)^+$, $(CH(NH_2)_2)^+$, $(C_3N_2H_5)^+$, $(NC_4H_8)^+$, $((NH_2)_3C)^+$, $K^+$, $Rb^+$, $Cs^+$, or any combination thereof, but embodiments of the present disclosure are not limited thereto.

$B^1$ in Formulae 1 to 4 may be a $Sm^{2+}$ ion.

In Formulae 1 to 4, $B^2$ may be at least one divalent inorganic cation, and $B^2$ may not include a $Sm^{2+}$ ion.

For example, $B^2$ in Formulae 1 to 4 may be i) one divalent inorganic cation, or ii) a combination of at least two different inorganic cations.

In one embodiment, $B^2$ in Formulae 1 to 4 may include a divalent cation of a rare earth metal, a divalent cation of an alkali earth metal, a divalent cation of a transition metal, a divalent cation of a late transition metal, or any combination thereof. For example, $B^2$ may be $La^{2+}$, $Ce^{2+}$, $Pr^{2+}$, $Nd^{2+}$, $Pm^{2+}$, $Eu^{2+}$, $Bi^{2+}$, $Ag^{2+}$, $Mn^{2+}$, $Sn^{2+}$, $Gd^{2+}$, $Tb^{2+}$, $Ho^{2+}$, $Er^{2+}$, $Tm^{2+}$, $Yb^{2+}$, $Lu^{2+}$, $Be^{2+}$, $Mg^{2+}$, $Ca^{2+}$, $Sr^{2+}$, $Ba^{2+}$, $Ra^{2+}$, or any combination thereof.

In one embodiment, $B^2$ in Formulae 1 to 4 may be a divalent cation of a rare earth metal, a divalent cation of an alkali earth metal, or any combination thereof.

In one or more embodiments, $B^2$ in Formulae 1 to 4 may be $La^{2+}$, $Ce^{2+}$, $Pr^{2+}$, $Nd^{2+}$, $Pm^{2+}$, $Eu^{2+}$, $Bi^{2+}$, $Ag^{2+}$, $Mn^{2+}$, $Sn^{2+}$, $Gd^{2+}$, $Tb^{2+}$, $Dy^{2+}$, $Ho^{2+}$, $Er^{2+}$, $Yb^{2+}$, $Lu^{2+}$, $Be^{2+}$, $Mg^{2+}$, $Ca^{2+}$, $Sr^{2+}$, $Ba^{2+}$, $Ra^{2+}$, or any combination thereof.

In one or more embodiments, $B^2$ in Formula 1 may also be $Eu^{2+}$, $Bi^{2+}$, $Ag^{2+}$, $Mn^{2+}$, $Sn^{2+}$, or $Yb^{2+}$, but embodiments of the present disclosure are not limited thereto.

n1 in Formula 1 may be a real number satisfying $0<n1\le 1$. That is, since n1 in Formula 1 is not 0, the perovskite compound represented by Formula 1 may essentially include $Sm^{2+}$, and since n1 in Formula 1 is not 1, the perovskite compound represented by Formula 1 may essentially include a divalent organic-cation other than $Sm^{2+}$.

n2 in Formulae 2 to 4 may be a real number satisfying $0.01<n2\le 1$. That is, since n2 in Formulae 2 to 4 is not 0, the perovskite compound represented by Formulae 2 to 4 may essentially include $Sm^{2+}$.

In one embodiment, n2 in Formulae 2 to 4 may be a real number satisfying $0<n2\le 1$. For example, since n2 in Formulae 2 to 4 is not 0, the perovskite compound represented by Formulae 2 to 4 may essentially include $Sm^{2+}$, and since n2 in Formulae 2 to 4 is not 1, the perovskite compound represented by Formulae 2 to 4 may essentially include a divalent organic-cation other than $Sm^{2+}$.

In one embodiment, n1 in Formula 1 may be a real number satisfying $0.01<n1<1$, and n2 in Formulae 2 to 4 may be a real number satisfying $0.01<n2<1$.

In one embodiment, n1 in Formula 1 may be a real number satisfying $0<n1\le 0.6$, for example, a real number satisfying $0.001\le n1\le 0.6$, for example, a real number satisfying $0.05\le n1\le 0.4$. When n1 in Formula 1 is within this range, an optoelectronic device including the perovskite compound, for example, a light-emitting device including the perovskite compound, may effectively emit light in a visible light range.

In one embodiment, n2 in Formulae 2 to 4 may be a real number satisfying $0<n2\le 0.6$, for example, a real number satisfying $0.001\le n2\le 0.6$, for example, a real number satisfying $0.05\le n2\le 0.4$. When n2 in Formulae 2 to 4 is within this range, an optoelectronic device including the perovskite compound, for example, a light-emitting device including the perovskite compound may effectively emit light in a visible light range.

In one or more embodiments, an emission color from the perovskite compound may be adjusted by adjusting the range of n1 and n2 in Formulae 1 to 4.

In one embodiment,
(i) n1 may be a real number satisfying $0.01<n1\le 0.2$, and blue light may be emitted;
n1 may be a real number satisfying $0.21<n1\le 0.4$, and green light may be emitted; or
n1 may be a real number satisfying $0.41<n1\le 1$, and red light may be emitted, and
(ii) n2 may be a real number satisfying $0.01<n2\le 0.2$, and blue light may be emitted;
n2 may be a real number satisfying $0.21<n2\le 0.4$, and green light may be emitted; or
n2 may be a real number satisfying $0.41<n2<1$, and red light may be emitted, but embodiments of the present disclosure are not limited thereto.

In one embodiment,
(i) n1 may be a real number satisfying $0.01<n1<0.2$, and blue light may be emitted;
n1 may be a real number satisfying $0.21<n1<0.4$, and green light may be emitted; or
n1 may be a real number satisfying $0.41<n1<1$, and red light may be emitted, and
(ii) n2 may be a real number satisfying $0.01<n2<0.2$, and blue light may be emitted;
n2 may be a real number satisfying $0.21<n2<0.4$, and green light may be emitted; or
n2 may be a real number satisfying $0.41<n2<1$, and red light may be emitted, but embodiments of the present disclosure are not limited thereto.

X in Formulae 1 to 4 may be at least one monovalent anion.

For example, X in Formulae 1 to 4 may be i) one monovalent anion, or ii) a combination of at least two different monovalent anions.

In one embodiment, X in Formulae 1 to 4 may be at least one halide anion selected from Cl$^-$, Br$^-$, and I$^-$.

For example, X in Formulae 1 to 4 may be i) one halide anion selected from Cl$^-$, Br$^-$, and I$^-$, or ii) a combination of at least two different halide anions selected from Cl$^-$, Br$^-$, and I$^-$.

In one or more embodiments, X in Formulae 1 to 4 may be I$^-$, but embodiments of the present disclosure are not limited thereto.

The perovskite compound represented by one of Formulae 1 to 4 may have an energy bandgap of about 4 eV or less.

In one embodiment, the energy bandgap of the perovskite compound may be adjusted by adjusting i) one halide anion or ii) a combination of at least two different halide anions, which is used as X in Formulae 1 to 4. For example, in a case where X is Br$^-$, the energy bandgap may be expanded to implement a short wavelength, as compared with a case where X is I$^-$. In a case where X is Cl$^-$, the energy bandgap may be expanded to implement a short wavelength, as compared with a case where X is Br$^-$.

An average grain size of the perovskite compound may be changed according to the type of the monovalent anion used as X. For example, in a case where the monovalent halide anion is used as X, when the halide anion is changed to I$^-$, Br$^-$, Cl$^-$, or the like, the energy bandgap may be adjusted and the light-emitting characteristics may be changed.

In one embodiment, the perovskite compound represented by Formula 1 may be selected from:

$[CH_3NH_3][Sm][X]_3$, $[CH_3NH_3][Sm_nSr_{(1-n)}][X]_3$, $[CH_3NH_3][Sm_nMg_{(1-n)}][X]_3$, $[CH_3NH_3][Sm_nCa_{(1-n)}][X]_3$, $[CH_3NH_3][Sm_nBa_{(1-n)}][X]_3$, $[CH_3NH_3][Sm_nEu_{(1-n)}][X]_3$, $[CH_3NH_3][Sm_nBi_{(1-n)}][X]_3$, $[CH_3NH_3][Sm_nAg_{(1-n)}][X]_3$, $[CH_3NH_3][Sm_nMn_{(1-n)}][X]_3$, $[CH_3NH_3][Sm_nSn_{(1-n)}][X]_3$, $[CH_3NH_3][Sm_nYb_{(1-n)}][X]_3$, $[CH_3NH_3][Sm_nTm_{(1-n)}][X]_3$, $[CH_3NH_3][Sm_nLa_{(1-n)}][X]_3$, $[CH_3NH_3][Sm_nCe_{(1-n)}][X]_3$, $[CH_3NH_3][Sm_nPr_{(1-n)}][X]_3$, $[CH_3NH_3][Sm_nNd_{(1-n)}][X]_3$, $[CH_3NH_3][Sm_nPm_{(1-n)}][X]_3$, $[CH_3NH_3][Sm_nGd_{(1-n)}][X]_3$, $[CH_3NH_3][Sm_nTb_{(1-n)}][X]_3$, $[CH_3NH_3][Sm_nHO_{(1-n)}][X]_3$, and $[CH_3NH_3][Sm_nEr_{(1-n)}][X]_3$;

$[Cs][Sm][X]_3$, $[Cs][Sm_nSr_{(1-n)}][X]_3$, $[Cs][Sm_nMg_{(1-n)}][X]_3$, $[Cs][Sm_nCa_{(1-n)}][X]_3$, $[Cs][Sm_nBa_{(1-n)}][X]_3$, $[Cs][Sm_nEu_{(1-n)}][X]_3$, $[Cs][Sm_nBi_{(1-n)}][X]_3$, $[Cs][Sm_nAg_{(1-n)}][X]_3$, $[Cs][Sm_nMn_{(1-n)}][X]_3$, $[Cs][Sm_nSn_{(1-n)}][X]_3$, $[Cs][Sm_nYb_{(1-n)}][X]_3$, $[Cs][Sm_nTm_{(1-n)}][X]_3$, $[Cs][Sm_nLa_{(1-n)}][X]_3$, $[Cs][Sm_nCe_{(1-n)}][X]_3$, $[Cs][Sm_nPr_{(1-n)}][X]_3$, $[Cs][Sm_nNd_{(1-n)}][X]_3$, $[Cs][Sm_nPm_{(1-n)}][X]_3$, $[Cs][Sm_nGd_{(1-n)}][X]_3$, $[Cs][Sm_nTb_{(1-n)}][X]_3$, $[Cs][Sm_nHO_{(1-n)}][X]_3$, and $[Cs][Sm_nEr_{(1-n)}][X]_3$;

$[Rb][Sm][X]_3$, $[Rb][Sm_nSr_{(1-n)}][X]_3$, $[Rb][Sm_nMg_{(1-n)}][X]_3$, $[Rb][Sm_nCa_{(1-n)}][X]_3$, $[Rb][Sm_nBa_{(1-n)}][X]_3$, $[Rb][Sm_nEu_{(1-n)}][X]_3$, $[Rb][Sm_nBi_{(1-n)}][X]_3$, $[Rb][Sm_nAg_{(1-n)}][X]_3$, $[Rb][Sm_nMn_{(1-n)}][X]_3$, $[Rb][Sm_nSn_{(1-n)}][X]_3$, $[Rb][Sm_nYb_{(1-n)}][X]_3$, $[Rb][Sm_nTm_{(1-n)}][X]_3$, $[Rb][Sm_nLa_{(1-n)}][X]_3$, $[Rb][Sm_nCe_{(1-n)}][X]_3$, $[Rb][Sm_nPr_{(1-n)}][X]_3$, $[Rb][Sm_nNd_{(1-n)}][X]_3$, $[Rb][Sm_nPm_{(1-n)}][X]_3$, $[Rb][Sm_nGd_{(1-n)}][X]_3$, $[Rb][Sm_nTb_{(1-n)}][X]_3$, $[Rb][Sm_nHO_{(1-n)}][X]_3$, and $[Rb][Sm_nEr_{(1-n)}][X]_3$; and $[K][Sm][X]_3$, $[K][Sm_nSr_{(1-n)}][X]_3$, $[K][Sm_nMg_{(1-n)}][X]_3$, $[K][Sm_nCa_{(1-n)}][X]_3$, $[K][Sm_nBa_{(1-n)}][X]_3$, $[K][Sm_nEu_{(1-n)}][X]_3$, $[K][Sm_nBi_{(1-n)}][X]_3$, $[K][Sm_nAg_{(1-n)}][X]_3$, $[K][Sm_nMn_{(1-n)}][X]_3$, $[K][Sm_nSn_{(1-n)}][X]_3$, $[K][Sm_nYb_{(1-n)}][X]_3$, $[K][Sm_nTm_{(1-n)}][X]_3$, $[K][Sm_nLa_{(1-n)}][X]_3$, $[K][Sm_nCe_{(1-n)}][X]_3$, $[K][Sm_nPr_{(1-n)}][X]_3$, $[K][Sm_nNd_{(1-n)}][X]_3$, $[K][Sm_nPm_{(1-n)}][X]_3$, $[K][Sm_nGd_{(1-n)}][X]_3$, $[K][Sm_nTb_{(1-n)}][X]_3$, $[K][Sm_nHO_{(1-n)}][X]_3$, and $[K][Sm_nEr_{(1-n)}][X]_3$, and n may be a real number satisfying $0<n<1$, but embodiments of the present disclosure are not limited thereto.

In one embodiment, the perovskite compound represented by Formula 2 may be selected from:

$[CH_3NH_3]_2[Sm][X]_4$, $[CH_3NH_3]_2[Sm_nSr_{(1-n)}][X]_4$, $[CH_3NH_3]_2[Sm_nMg_{(1-n)}][X]_4$, $[CH_3NH_3]_2[Sm_nCa_{(1-n)}][X]_4$, $[CH_3NH_3]_2[Sm_nBa_{(1-n)}][X]_4$, $[CH_3NH_3]_2[Sm_nEu_{(1-n)}][X]_4$, $[CH_3NH_3]_2[Sm_nBi_{(1-n)}][X]_4$, $[CH_3NH_3]_2[Sm_nAg_{(1-n)}][X]_4$, $[CH_3NH_3]_2[Sm_nMn_{(1-n)}][X]_4$, $[CH_3NH_3]_2[Sm_nSn_{(1-n)}][X]_4$, $[CH_3NH_3]_2[Sm_nYb_{(1-n)}][X]_4$, $[CH_3NH_3]_2[Sm_nTm_{(1-n)}][X]_4$, $[CH_3NH_3]_2[Sm_nLa_{(1-n)}][X]_4$, $[CH_3NH_3]_2[Sm_nCe_{(1-n)}][X]_4$, $[CH_3NH_3]_2[Sm_nPr_{(1-n)}][X]_4$, $[CH_3NH_3]_2[Sm_nNd_{(1-n)}][X]_4$, $[CH_3NH_3]_2[Sm_nPm_{(1-n)}][X]_4$, $[CH_3NH_3]_2[Sm_nGd_{(1-n)}][X]_4$, $[CH_3NH_3]_2[Sm_nTb_{(1-n)}][X]_4$, $[CH_3NH_3]_2[Sm_nHO_{(1-n)}][X]_4$, and $[CH_3NH_3]_2[Sm_nEr_{(1-n)}][X]_4$;

$[Cs]_2[Sm][X]_4$, $[Cs]_2[Sm_nSr_{(1-n)}][X]_4$, $[Cs]_2[Sm_nMg_{(1-n)}][X]_4$, $[Cs]_2[Sm_nCa_{(1-n)}][X]_4$, $[Cs]_2[Sm_nBa_{(1-n)}][X]_4$, $[Cs]_2[Sm_nEu_{(1-n)}][X]_4$, $[Cs]_2[Sm_nBi_{(1-n)}][X]_4$, $[Cs]_2[Sm_nAg_{(1-n)}][X]_4$, $[Cs]2[Sm_nMn_{(1-n)}][X]_4$, $[Cs]2[Sm_nSn_{(1-n)}][X]_4$, $[Cs]2[Sm_nYb_{(1-n)}][X]_4$, $[Cs]2[Sm_nTm_{(1-n)}][X]_4$, $[Cs]_2[Sm_nLa_{(1-n)}][X]_4$, $[Cs]_2[Sm_nCe_{(1-n)}][X]_4$, $[Cs]_2[Sm_nPr_{(1-n)}][X]_4$, $[Cs]_2[Sm_nNd_{(1-n)}][X]_4$, $[Cs]2[Sm_nPm_{(1-n)}][X]_4$, $[Cs]2[Sm_nGd_{(1-n)}][X]_4$, $[Cs]2[Sm_nTb_{(1-n)}][X]_4$, $[Cs]2[Sm_nHO_{(1-n)}][X]_4$, and $[Cs]_2[Sm_nEr_{(1-n)}][X]_4$;

$[Rb]_2[Sm][X]_4$, $[Rb]_2[Sm_nSr_{(1-n)}][X]_4$, $[Rb]_2[Sm_nMg_{(1-n)}][X]_4$, $[Rb]_2[Sm_nCa_{(1-n)}][X]_4$, $[Rb]_2[Sm_nBa_{(1-n)}][X]_4$, $[Rb]_2[Sm_nEu_{(1-n)}][X]_4$, $[Rb]_2[Sm_nBi_{(1-n)}][X]_4$, $[Rb]_2[Sm_nAg_{(1-n)}][X]_4$, $[Rb]_2[Sm_nMn_{(1-n)}][X]_4$, $[Rb]_2[Sm_nYb_{(1-n)}][X]_4$, $[Rb]_2[Sm_nTm_{(1-n)}][X]_4$, $[Rb]_2[Sm_nLa_{(1-n)}][X]_4$, $[Rb]_2[Sm_nCe_{(1-n)}][X]_4$, $[Rb]_2[Sm_nPr_{(1-n)}][X]_4$, $[Rb]_2[Sm_nNd_{(1-n)}][X]_4$, $[Rb]_2[Sm_nPm_{(1-n)}][X]_4$, $[Rb]_2[Sm_nGd_{(1-n)}][X]_4$, $[Rb]_2[Sm_nTb_{(1-n)}][X]_4$, $[Rb]_2[Sm_nHO_{(1-n)}][X]_4$, and $[Rb]_2[Sm_nEr_{(1-n)}][X]_4$; and $[K]_2[Sm][X]_4$, $[K]_2[Sm_nSr_{(1-n)}][X]_4$, $[K]_2[Sm_nMg_{(1-n)}][X]_4$, $[K]_2[Sm_nCa_{(1-n)}][X]_4$, $[K]_2[Sm_nBa_{(1-n)}][X]_4$, $[K]_2[Sm_nEu_{(1-n)}][X]_4$, $[K]_2[Sm_nBi_{(1-n)}][X]_4$, $[K]_2[Sm_nAg_{(1-n)}][X]_4$, $[K]_2[Sm_nMn_{(1-n)}][X]_4$, $[K]_2[Sm_nSn_{(1-n)}][X]_4$, $[K]_2[Sm_nYb_{(1-n)}][X]_4$, $[K]_2[Sm_nTm_{(1-n)}][X]_4$, $[K]_2[Sm_nLa_{(1-n)}][X]_4$, $[K]_2[Sm_nCe_{(1-n)}][X]_4$, $[K]_2[Sm_nPr_{(1-n)}][X]_4$, $[K]_2[Sm_nNd_{(1-n)}][X]_4$, $[K]_2[Sm_nPm_{(1-n)}][X]_4$, $[K]_2[Sm_nGd_{(1-n)}][X]_4$, $[K]_2[Sm_nTb_{(1-n)}][X]_4$, $[K]_2[Sm_nHO_{(1-n)}][X]_4$, and $[K]_2[Sm_nEr_{(1-n)}][X]_4$, and n may be a real number satisfying $0<n<1$, but embodiments of the present disclosure are not limited thereto.

In one embodiment, the perovskite compound represented by Formula 3 may be selected from:

$[CH_3NH_3]_3[Sm]_2[X]_7$, $[CH_3NH_3]_3[Sm_nSr_{(1-n)}]_2[X]_7$, $[CH_3NH_3]_3[Sm_nMg_{(1-n)}]_2[X]_7$, $[CH_3NH_3]_3[Sm_nCa_{(1-n)}]_2[X]_7$, $[CH_3NH_3]_3[Sm_nBa_{(1-n)}]_2[X]_7$, $[CH_3NH_3]_3[Sm_nEu_{(1-n)}]_2[X]_7$, $[CH_3NH_3]_3[Sm_nBi_{(1-n)}]_2[X]_7$, $[CH_3NH_3]_3[Sm_nAg_{(1-n)}]_2[X]_7$, $[CH_3NH_3]_3[Sm_nMn_{(1-n)}]_2[X]_7$, $[CH_3NH_3]_3[Sm_nSn_{(1-n)}]_2[X]_7$, $[CH_3NH_3]_3[Sm_nYb_{(1-n)}]_2[X]_7$, $[CH_3NH_3]_3[Sm_nTm_{(1-n)}]_2[X]_7$, $[CH_3NH_3]_3[Sm_nLa_{(1-n)}]_2[X]_7$, $[CH_3NH_3]_3[Sm_nCe_{(1-n)}]_2[X]_7$, $[CH_3NH_3]_3[Sm_nPr_{(1-n)}]_2[X]_7$, $[CH_3NH_3]_3[Sm_nNd_{(1-n)}]_2[X]_7$, $[CH_3NH_3]_3[Sm_nPm_{(1-n)}]_2[X]_7$, $[CH_3NH_3]_3[Sm_nGd_{(1-n)}]_2[X]_7$, $[CH_3NH_3]_3[Sm_nTb_{(1-n)}]_2[X]_7$, $[CH_3NH_3]_3[Sm_nHO_{(1-n)}]_2[X]_7$, and $[CH_3NH_3]_3[Sm_nEr_{(1-n)}]_2[X]_7$;

$[Cs]_3[Sm]_2[X]_7$, $[Cs]_3[Sm_nSr_{(1-n)}]_2[X]_7$, $[Cs]_3[Sm_nMg_{(1-n)}]_2[X]_7$, $[Cs]_3[Sm_nCa_{(1-n)}]_2[X]_7$, $[Cs]_3[Sm_nBa_{(1-n)}]_2[X]_7$, $[Cs]_3[Sm_nEu_{(1-n)}]_2[X]_7$, $[Cs]_3[Sm_nBi_{(1-n)}]_2[X]_7$, $[Cs]_3[Sm_nAg_{(1-n)}]_2[X]_7$, $[Cs]_3[Sm_nMn_{(1-n)}]_2[X]_7$, $[Cs]_3[Sm_nSn_{(1-n)}]_2[X]_7$, $[Cs]_3[Sm_nYb_{(1-n)}]_2[X]_7$, $[Cs]_3[Sm_nTm_{(1-n)}]_2[X]_7$, $[Cs]_3[Sm_nLa_{(1-n)}]_2[X]_7$, $[Cs]_3[Sm_nCe_{(1-n)}]_2[X]_7$, $[Cs]_3[Sm_nPr_{(1-n)}]_2[X]_7$, $[Cs]_3[Sm_nNd_{(1-n)}]_2[X]_7$, $[Cs]_3

$[Sm_nPm_{(1-n)}]_2[X]_7$, $[Cs]_3[Sm_nGd_{(1-n)}]_2[X]_7$, $[Cs]_3[Sm_nTb_{(1-n)}]_2[X]_7$, $[Cs]_3[Sm_nHO_{(1-n)}]_2[X]_7$, and $[Cs]_3[Sm_nEr_{(1-n)}]_2[X]_7$;

$[Rb]_3[Sm]_2[X]_7$, $[Rb]_3[Sm_nSr_{(1-n)}]_2[X]_7$, $[Rb]_3[Sm_nMg_{(1-n)}]_2[X]_7$, $[Rb]_3[Sm_nCa_{(1-n)}]_2[X]_7$, $[Rb]_3[Sm_nBa_{(1-n)}]_2[X]_7$, $[Rb]_3[Sm_nEu_{(1-n)}]_2[X]_7$, $[Rb]_3[Sm_nBi_{(1-n)}]_2[X]_7$, $[Rb]_3[Sm_nAg_{(1-n)}]_2[X]_7$, $[Rb]_3[Sm_nMn_{(1-n)}]_2[X]_7$, $[Rb]_3[Sm_nSn_{(1-n)}]_2[X]_7$, $[Rb]_3[Sm_nYb_{(1-n)}]_2[X]_7$, $[Rb]_3[Sm_nTm_{(1-n)}]_2[X]_7$, $[Rb]_3[Sm_nLa_{(1-n)}]_2[X]_7$, $[Rb]_3[Sm_nCe_{(1-n)}]_2[X]_7$, $[Rb]_3[Sm_nPr_{(1-n)}]_2[X]_7$, $[Rb]_3[Sm_nNd_{(1-n)}]_2[X]_7$, $[Rb]_3[Sm_nPm_{(1-n)}]_2[X]_7$, $[Rb]_3[Sm_nGd_{(1-n)}]_2[X]_7$, $[Rb]_3[Sm_nTb_{(1-n)}]_2[X]_7$, $[Rb]_3[Sm_nHO_{(1-n)}]_2[X]_7$, and $[Rb]_3[Sm_nEr_{(1-n)}]_2[X]_7$; and $[K]_3[Sm]_2[X]_7$, $[K]_3[Sm_nSr_{(1-n)}]_2[X]_7$, $[K]_3[Sm_nMg_{(1-n)}]_2[X]_7$, $[K]_3[Sm_nCa_{(1-n)}]_2[X]_7$, $[K]_3[Sm_nBa_{(1-n)}]_2[X]_7$, $[K]_3[Sm_nEu_{(1-n)}]_2[X]_7$, $[K]_3[Sm_nBi_{(1-n)}]_2[X]_7$, $[K]_3[Sm_nAg_{(1-n)}]_2[X]_7$, $[K]_3[Sm_nMn_{(1-n)}]_2[X]_7$, $[K]_3[Sm_nSn_{(1-n)}]_2[X]_7$, $[K]_3[Sm_nYb_{(1-n)}]_2[X]_7$, $[K]_3[Sm_nTm_{(1-n)}]_2[X]_7$, $[K]_3[Sm_nLa_{(1-n)}]_2[X]_7$, $[K]_3[Sm_nCe_{(1-n)}]_2[X]_7$, $[K]_3[Sm_nPr_{(1-n)}]_2[X]_7$, $[K]_3[Sm_nNd_{(1-n)}]_2[X]_7$, $[K]_3[Sm_nPm_{(1-n)}]_2[X]_7$, $[K]_3[Sm_nGd_{(1-n)}]_2[X]_7$, $[K]_3[Sm_nTb_{(1-n)}]_2[X]_7$, $[K]_3[Sm_nHO_{(1-n)}]_2[X]_7$, and $[K]_3[Sm_nEr_{(1-n)}]_2[X]_7$, and n may be a real number satisfying 0<n<1, but embodiments of the present disclosure are not limited thereto.

In one embodiment, the perovskite compound represented by Formula 4 may be selected from:

$[CH_3NH_3]_4[Sm]_3[X]_{10}$, $[CH_3NH_3]_4[Sm_nSr_{(1-n)}]_3[X]_{10}$, $[CH_3NH_3]_4[Sm_nMg_{(1-n)}]_3[X]_{10}$, $[CH_3NH_3]_4[Sm_nCa_{(1-n)}]_3[X]_{10}$, $[CH_3NH_3]_4[Sm_nBa_{(1-n)}]_3[X]_{10}$, $[CH_3NH_3]_4[Sm_nEu_{(1-n)}]_3[X]_{10}$, $[CH_3NH_3]_4[Sm_nBi_{(1-n)}]_3[X]_{10}$, $[CH_3NH_3]_4[Sm_nAg_{(1-n)}]_3[X]_{10}$, $[CH_3NH_3]_4[Sm_nMn_{(1-n)}]_3[X]_{10}$, $[CH_3NH_3]_4[Sm_nSn_{(1-n)}]_3[X]_{10}$, $[CH_3NH_3]_4[Sm_nYb_{(1-n)}]_3[X]_{10}$, $[CH_3NH_3]_4[Sm_nTm_{(1-n)}]_3[X]_{10}$, $[CH_3NH_3]_4[Sm_nLa_{(1-n)}]_3[X]_{10}$, $[CH_3NH_3]_4[Sm_nCe_{(1-n)}]_3[X]_{10}$, $[CH_3NH_3]_4[Sm_nPr_{(1-n)}]_3[X]_{10}$, $[CH_3NH_3]_4[Sm_nNd_{(1-n)}]_3[X]_{10}$, $[CH_3NH_3]_4[Sm_nPm_{(1-n)}]_3[X]_{10}$, $[CH_3NH_3]_4[Sm_nGd_{(1-n)}]_3[X]_{10}$, $[CH_3NH_3]_4[Sm_nTb_{(1-n)}]_3[X]_{10}$, $[CH_3NH_3]_4[Sm_nHO_{(1-n)}]_3[X]_{10}$, and $[CH_3NH_3]_4[Sm_nEr_{(1-n)}]_3[X]_{10}$;

$[Cs]_4[Sm]_3[X]_{10}$, $[Cs]_4[Sm_nSr_{(1-n)}]_3[X]_{10}$, $[Cs]_4[Sm_nMg_{(1-n)}]_3[X]_{10}$, $[Cs]_4[Sm_nCa_{(1-n)}]_3[X]_{10}$, $[Cs]_4[Sm_nBa_{(1-n)}]_3[X]_{10}$, $[Cs]_4[Sm_nEu_{(1-n)}]_3[X]_{10}$, $[Cs]_4[Sm_nBi_{(1-n)}]_3[X]_{10}$, $[Cs]_4[Sm_nAg_{(1-n)}]_3[X]_{10}$, $[Cs]_4[Sm_nMn_{(1-n)}]_3[X]_{10}$, $[Cs]_4[Sm_nSn_{(1-n)}]_3[X]_{10}$, $[Cs]_4[Sm_nCe_{(1-n)}]_3[X]_{10}$, $[Cs]_4[Sm_nPr_{(1-n)}]_3[X]_{10}$, $[Cs]_4[Sm_nNd_{(1-n)}]_3[X]_{10}$, $[Cs]_4[Sm_nPm_{(1-n)}]_3[X]_{10}$, $[Cs]_4[Sm_nGd_{(1-n)}]_3[X]_{10}$, $[Cs]_4[Sm_nTb_{(1-n)}]_3[X]_{10}$, $[Cs]_4[Sm_nHO_{(1-n)}]_3[X]_{10}$, and $[Cs]_4[Sm_nEr_{(1-n)}]_3[X]_{10}$;

$[Rb]_4[Sm]_3[X]_{10}$, $[Rb]_4[Sm_nSr_{(1-n)}]_3[X]_{10}$, $[Rb]_4[Sm_nMg_{(1-n)}]_3[X]_{10}$, $[Rb]_4[Sm_nCa_{(1-n)}]_3[X]_{10}$, $[Rb]_4[Sm_nBa_{(1-n)}]_3[X]_{10}$, $[Rb]_4[Sm_nEu_{(1-n)}]_3[X]_{10}$, $[Rb]_4[Sm_nBi_{(1-n)}]_3[X]_{10}$, $[Rb]_4[Sm_nAg_{(1-n)}]_3[X]_{10}$, $[Rb]_4[Sm_nMn_{(1-n)}]_3[X]_{10}$, $[Rb]_4[Sm_nSn_{(1-n)}]_3[X]_{10}$, $[Rb]_4[Sm_nYb_{(1-n)}]_3[X]_{10}$, $[Rb]_4[Sm_nTm_{(1-n)}]_3[X]_{10}$, $[Rb]_4[Sm_nLa_{(1-n)}]_3[X]_{10}$, $[Rb]_4[Sm_nCe_{(1-n)}]_3[X]_{10}$, $[Rb]_4[Sm_nPr_{(1-n)}]_3[X]_{10}$, $[Rb]_4[Sm_nNd_{(1-n)}]_3[X]_{10}$, $[Rb]_4[Sm_nPm_{(1-n)}]_3[X]_{10}$, $[Rb]_4[Sm_nGd_{(1-n)}]_3[X]_{10}$, $[Rb]_4[Sm_nTb_{(1-n)}]_3[X]_{10}$, $[Rb]_4[Sm_nHO_{(1-n)}]_3[X]_{10}$, and $[Rb]_4[Sm_nEr_{(1-n)}]_3[X]_{10}$; and $[K]_4[Sm]_3[X]_{10}$, $[K]_4[Sm_nSr_{(1-n)}]_3[X]_{10}$, $[K]_4[Sm_nMg_{(1-n)}]_3[X]_{10}$, $[K]_4[Sm_nCa_{(1-n)}]_3[X]_{10}$, $[K]_4[Sm_nBa_{(1-n)}]_3[X]_{10}$, $[K]_4[Sm_nEu_{(1-n)}]_3[X]_{10}$, $[K]_4[Sm_nBi_{(1-n)}]_3[X]_{10}$, $[K]_4[Sm_nAg_{(1-n)}]_3[X]_{10}$, $[K]_4[Sm_nMn_{(1-n)}]_3[X]_{10}$, $[K]_4[Sm_nSn_{(1-n)}]_3[X]_{10}$, $[K]_4[Sm_nYb_{(1-n)}]_3[X]_{10}$, $[K]_4[Sm_nTm_{(1-n)}]_3[X]_{10}$, $[K]_4[Sm_nLa_{(1-n)}]_3[X]_{10}$, $[K]_4[Sm_nCe_{(1-n)}]_3[X]_{10}$, $[K]_4[Sm_nPr_{(1-n)}]_3[X]_{10}$, $[K]_4[Sm_nNd_{(1-n)}]_3[X]_{10}$, $[K]_4[Sm_nPm_{(1-n)}]_3[X]_{10}$, $[K]_4[Sm_nGd_{(1-n)}]_3[X]_{10}$, $[K]_4[Sm_nTb_{(1-n)}]_3[X]_{10}$, $[K]_4[Sm_nHO_{(1-n)}]_3[X]_{10}$, and $[K]_4[Sm_nEr_{(1-n)}]_3[X]_{10}$, and n may be a real number satisfying 0<n<1, but embodiments of the present disclosure are not limited thereto.

In one embodiment, the perovskite compound may be in the form of a nano particle, a nanowire, a nanolayer, a multi-layer nanolayer, a micro particle, a microwire, a microlayer, or a multi-layer microlayer.

The energy bandgap and the maximum emission wavelength of the perovskite may be adjusted by adjusting the shape or size of the perovskite compound. For example, the perovskite compound represented by one of Formulae 1 to 4 may variously control the maximum emission wavelength emitted by the perovskite compound by controlling i) the average grain size or ii) a composition ratio.

For example, the maximum emission wavelength may be controlled by controlling the type (that is, the grain size) and the composition ratio of one of A, $B^1$, $B^2$, and X. In one embodiment, even when the types and the composition ratios of A and X among A, $B^1$, $B^2$, and X are identical to each other, the maximum emission wavelength emitted by the perovskite compound may be controlled by controlling the types or the composition ratios of $B^1$ and $B^2$. In one embodiment, even when the types and the composition ratios of $B^1$, $B^2$, and X among A, $B^1$, $B^2$, and X are identical to each other, the maximum emission wavelength emitted by the perovskite compound may be controlled by controlling the type or the composition ratio of A. In one or more embodiments, even when the types and the composition ratios of A, $B^1$, and $B^2$ among A, $B^1$, $B^2$, and X are identical to each other, the maximum emission wavelength emitted by the perovskite compound may be controlled by controlling the type or the composition ratio of X.

n1 and n2 in Formulae 1 to 4 may not be 0. That is, the perovskite compound represented by one of Formulae 1 to 4 may essentially include $Sm^{2+}$. Since $Sm^{2+}$ has an ion radius similar to that of $Pb^{2+}$ used in a conventional perovskite compound, the perovskite compound represented by one of Formulae 1 to 4 has a Goldschmidt's tolerance factor of about 1 and has a stable cubic structure. Therefore, although not limited by a particular theory, high quantum yields may be obtained by a quantum confinement effect.

Therefore, for example, a thin film including the perovskite compound represented by one of Formulae 1 to 4 may have high photoluminescence (PL) quantum yields (PLQY) and a small full width at half maximum (FWHM), and a light-emitting device including the perovskite compound represented by one of Formulae 1 to 4 may have excellent external quantum efficiency and light efficiency.

Another aspect provides a thin film (thin layer) including the perovskite compound represented by one of Formulae 1 to 4.

The perovskite compound included in the thin film is the same as described above.

The thin film may be synthesized by a known synthesis method. Hereinafter, the synthesis method of the thin film including the perovskite compound will be described in detail.

The thin film may be manufactured by providing an A-containing precursor, a $B^1$-containing precursor, and a $B^2$-containing precursor on a predetermined substrate (for example, a region in which the thin film is to be formed) and performing thermal treatment thereon to form the thin film including the perovskite compound represented by one of Formulae 1 to 4.

The description of A, B$^1$, and B$^2$ in the A-containing precursor, the B$^1$-containing precursor, and the B$^2$-containing precursor is the same as the description of A, B$^1$, and B$^2$ in Formulae 1 to 4.

The A-containing precursor may be selected from halides of A (for example, (A)(X$^1$)), the B$^1$-containing precursor may be selected from halides of B$^1$ (for example, (B$^1$)(X$^2$)$_2$), and the B$^2$-containing precursor may be selected from halides of B$^2$ (for example, (B$^2$)(X$^3$)$_2$). In (A)(X$^1$), (B$^1$)(X$^2$)$_2$, and (B$^2$)(X$^3$)$_2$, A, B$^1$, and B$^2$ are the same as described above, and X$^1$ to X$^3$ may each independently be selected from —F, —Cl, —Br, and —I.

In one embodiment, the A-containing precursor may be CH$_3$NH$_3$I, the B$^1$-containing precursor may be SmI$_2$, and the B$^2$-containing precursor may be EuI$_2$, but embodiments of the present disclosure are not limited thereto.

In one embodiment, the thin film including the perovskite compound represented by one of Formulae 1 to 4 may be manufactured by providing an A-containing precursor, a B$^1$-containing precursor, and a B$^2$-containing precursor on a predetermined substrate and simultaneously performing thermal treatment thereon to form the thin film including the perovskite compound represented by one of Formulae 1 to 4 (that is, one-step method).

In one or more embodiments, the thin film including the perovskite compound represented by one of Formulae 1 to 4 may be manufactured by providing an A-containing precursor, a B$^1$-containing precursor, and a B$^2$-containing precursor on a predetermined substrate to form a precursor-containing film, and performing thermal treatment on the precursor-containing film to form the thin film including the perovskite compound represented by one of Formulae 1 to 4 (that is, two-step method).

The thermal treatment condition in the thin film manufacturing method may be selected under different conditions according to whether A in the A-precursor includes a monovalent inorganic cation.

For example, i) when A does not include a monovalent inorganic cation, the thermal treatment condition in the thin film manufacturing method may be selected in a time range of about 15 minutes to about 1 hour and in a temperature range of about 100° C. to 400° C., and ii) when A includes a monovalent inorganic cation, the thermal condition in the thin film manufacturing method may be selected in a time range of about 2 hours to 48 hours and a temperature range of about 400° C. to about 800° C., but embodiments of the present disclosure are not limited thereto.

In addition, various modifications may be possible. For example, the thin film including the perovskite compound represented by one of Formulae 1 to 4 may be manufactured by providing a mixture including the perovskite compound represented by one of Formulae 1 to 4 on a predetermined substrate and performing thermal treatment thereon.

Another aspect provides an electronic apparatus including the perovskite compound represented by one of Formulae 1 to 4.

In one embodiment, the electronic apparatus may include an optoelectronic device including the perovskite compound, and the optoelectronic device may be a photovoltaic device, a photodiode, a phototransistor, a photomultiplier, a photo resistor, a photo detector, a light sensitive detector, a solid-state triode, a battery electrode, a light-emitting device, a light-emitting diode, an organic light-emitting device, a quantum dot light-emitting diode, a transistor, a solar cell, a laser, or a diode injection laser.

The perovskite compound may be used as a light-emitting material of an electronic apparatus (for example, a light-emitting material of a light-emitting device including an emission layer), a charge transport material (for example, a material for a hole transport layer of a light-emitting device including a hole transport region), an electrode material, a light sensitive material, a light-absorbing material (for example, a material for an active layer of a solar cell), a light conversion material (for example, material for a color filter when a light-emitting device includes a color filter), or the like.

In one embodiment, the electronic apparatus may include a light-emitting device including: a first electrode; a second electrode facing the first electrode; and an intermediate layer between the first electrode and the second electrode and including an emission layer, wherein the emission layer includes a perovskite compound represented by one of Formulae 1 to 4:

$$[A][B^1_{n1}B^2_{(1-n1)}][X]_3 \qquad \text{<Formula 1>}$$

$$[A]_2[B^1_{n2}B^2_{(1-n2)}][X]_4 \qquad \text{<Formula 2>}$$

$$[A]_3[B^1_{n2}B^2_{(1-n2)}]_2[X]_7 \qquad \text{<Formula 3>}$$

$$[A]_4[B^1_{n2}B^2_{(1-n2)}]_3[X]_{10}. \qquad \text{<Formula 4>}$$

In Formula 1,

A may be at least one monovalent organic-cation, a monovalent inorganic cation, or any combination thereof, B$^1$ may be a Sm$^{2+}$ ion, B$^2$ may be at least one divalent inorganic cation, and B$^2$ may not include a Sm$^{2+}$ ion, n1 may be a real number satisfying 0<n1≤1, n2 may be a real number satisfying 0<n2≤1, and X may be at least one monovalent anion.

The description of the perovskite is the same as described herein.

In one embodiment, the electronic apparatus may be a display apparatus.

In one embodiment, the light-emitting device included in the electronic apparatus may be, for example, an organic light-emitting device or a quantum dot light-emitting diode. For example, the electronic apparatus may be an organic light-emitting display apparatus including an organic light-emitting device. In one or more embodiments, the electronic apparatus may be a quantum dot light-emitting display apparatus including a quantum dot light-emitting diode.

The intermediate layer in the light-emitting device may further include a hole transport region between the first electrode and the emission layer and an electron transport region between the emission layer and the second electrode.

At least one of the hole transport region and the electron transport region in the light-emitting device may include an inorganic material.

For example, at least one of the hole transport region and the electron transport region in the light-emitting device may include an inorganic material including a metal halide, a metal oxide, a metal chalcogenide, a metal selenide, or any combination thereof.

In one embodiment, at least one of the hole transport region and the electron transport region in the light-emitting device may include:

a group IV compound semiconductor (for example, silicon carbide);

a group III-V semiconductor (for example, gallium arsenide);

a group II-VI semiconductor (for example, cadmium selenide);

a group I-VII semiconductor (for example, copper (I) chloride or CuI);

a group IV-VI semiconductor (for example, lead selenide);

a group V-VI semiconductor (for example, bismuth telluride);

a group II-V semiconductor (for example, cadmium arsenide);

a ternary or quaternary semiconductor (for example, copper indium selenide, copper indium gallium diselenide, copper zinc tin sulfide, or copper zinc tin sulfide selenide (CZTSSe)); or any combination thereof, but embodiments of the present disclosure are not limited thereto.

For example, at least one of the hole transport region and the electron transport region in the light-emitting device may include:

an oxide of titanium, niobium, tin, zinc, cadmium, copper, lead, or any combination thereof (for example, an alloy);

a chalcogenide of antimony, copper, zinc, iron, bismuth, or any combination thereof (for example, an alloy) (for example, copper sulfide or iron sulfide);

a copper zinc tin chalcogenide (for example, copper zinc tin sulfide such as $Cu_2ZnSnS_4$ (CZTS) and copper zinc tin sulfur-selenide such as $Cu_2ZnSn(S_{1-x}Se_x)_4$ (CZTSSe));

a copper indium chalcogenide such as copper indium selenide (CIS);

a copper indium gallium selenide such as copper indium gallium selenide ($CuIn_{1-x}Ga_xSe_2$) (CIGS);

copper indium gallium diselenide; or any combination thereof, but embodiments of the present disclosure are not limited thereto. x may be a real number greater than 0 and less than or equal to 1.

In one embodiment, at least one of the hole transport region and the electron transport region may include an organic material.

In one embodiment, the hole transport region may include an amine-based compound, and the electron transport region may include a metal-free compound including at least one π electron-depleted nitrogen-containing ring, but embodiments of the present disclosure are not limited thereto.

An organic material and an additional material that may be included in the hole transport region and the electron transport region are the same as described below.

FIG. 1 is a schematic view of a light-emitting device 10 included in the electronic device according to an embodiment. The light-emitting device 10 includes a first electrode 11, a hole transport region 13, an emission layer 15, an electron transport region 17, and a second electrode 19.

Hereinafter, the structure of the light-emitting device 10 according to an embodiment and a method of manufacturing the light-emitting device 10 will be described in connection with FIG. 1.

[First Electrode 11]

In FIG. 1, a substrate may be additionally disposed under the first electrode 11 or above the second electrode 19. The substrate may be a glass substrate or a plastic substrate, each having excellent mechanical strength, thermal stability, transparency, surface smoothness, ease of handling, and water resistance.

The first electrode 11 may be formed by depositing or sputtering a material for forming the first electrode 11 on the substrate. When the first electrode 11 is an anode, the material for a first electrode may be selected from materials with a high work function to facilitate hole injection.

The first electrode 11 may be a reflective electrode, a semi-transmissive electrode, or a transmissive electrode. When the first electrode 11 is a transmissive electrode, a material for forming a first electrode may be selected from indium tin oxide (ITO), indium zinc oxide (IZO), tin oxide ($SnO_2$), zinc oxide (ZnO), and any combinations thereof, but embodiments of the present disclosure are not limited thereto. In one or more embodiments, when the first electrode 11 is a semi-transmissive electrode or a reflectable electrode, a material for forming a first electrode may be selected from magnesium (Mg), silver (Ag), aluminum (Al), aluminum-lithium (Al—Li), calcium (Ca), magnesium-indium (Mg—In), magnesium-silver (Mg—Ag), and any combinations thereof, but embodiments of the present disclosure are not limited thereto.

The first electrode 11 may have a single-layered structure, or a multi-layered structure including two or more layers. For example, the first electrode 11 may have a three-layered structure of ITO/Ag/ITO, but the structure of the first electrode 11 is not limited thereto.

[Hole Transport Region 13]

The hole transport region 13 may have i) a single-layered structure including a single layer including a single material, ii) a single-layered structure including a single layer including a plurality of different materials, or iii) a multi-layered structure having a plurality of layers including a plurality of different materials.

The hole transport region may include at least one layer selected from a hole injection layer, a hole transport layer, an emission auxiliary layer, and an electron blocking layer.

For example, the hole transport region may have a single-layered structure including a single layer including one type of a material (for example, a single-layered structure consisting of a hole transport layer including one type of a material), a single-layered structure including a single layer including a plurality of different materials, or a multi-layered structure having a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein for each structure, constituting layers are sequentially stacked from the first electrode 11 in this stated order, but the structure of the hole transport region is not limited thereto.

The hole transport region may include the inorganic material.

The hole transport region may include the perovskite compound represented by one of Formulae 1 to 4.

The hole transport region may include an organic material.

In one embodiment, examples of the organic material include m-MTDATA, TDATA, 2-TNATA, NPB(NPD), p-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201, and a compound represented by Formula 202:

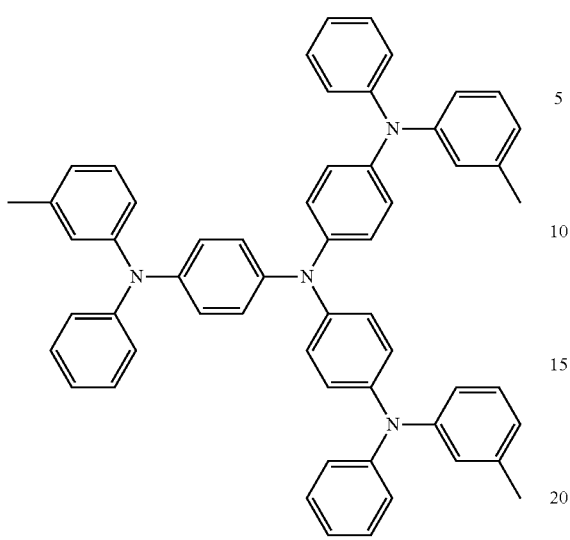
m-MTDATA
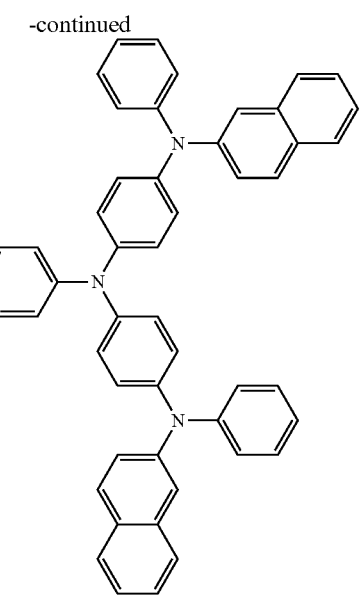
2-TNATA
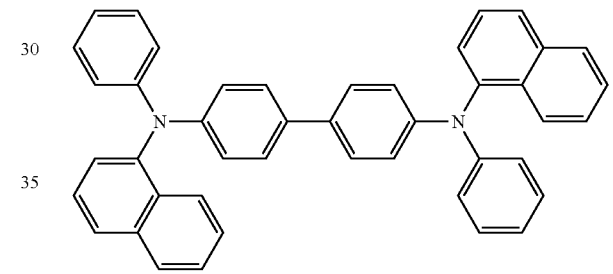
NPB
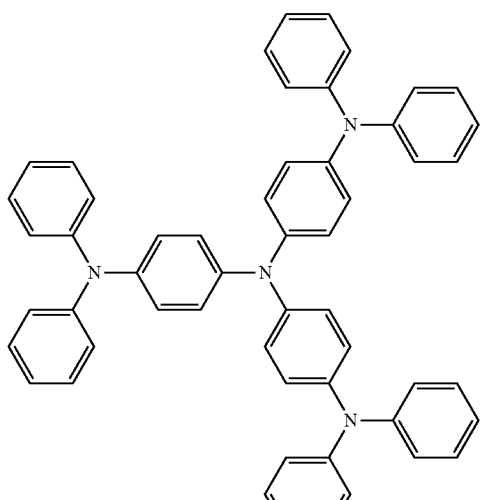
TDATA
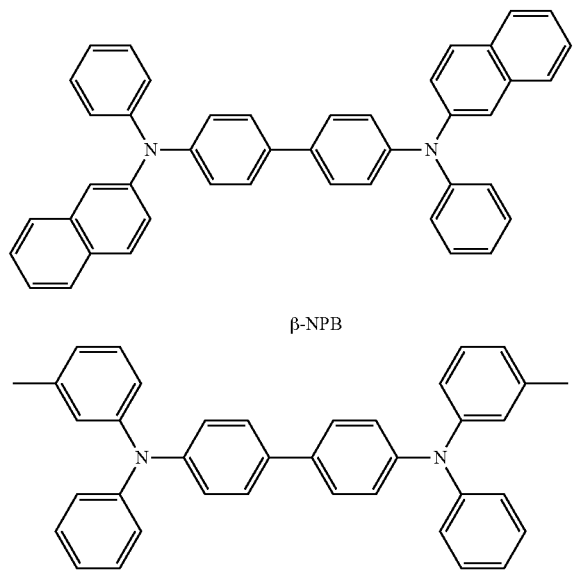
β-NPB
TPD

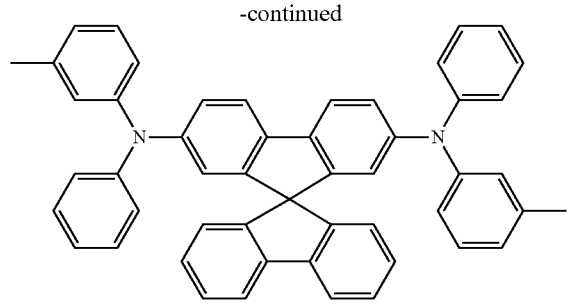

Spiro-TPD

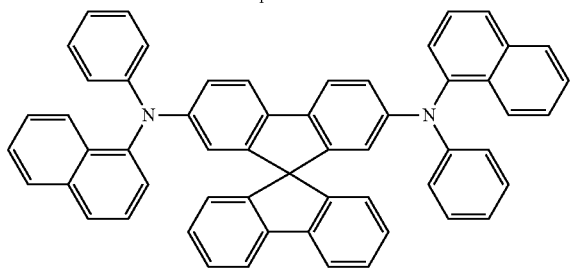

Spiro-NPB

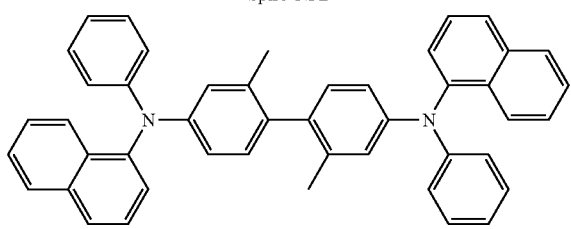

methylated NPB

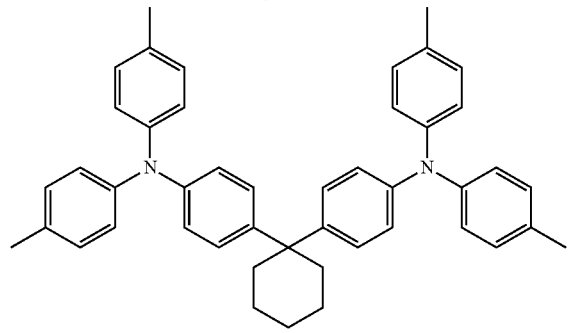

TAPC

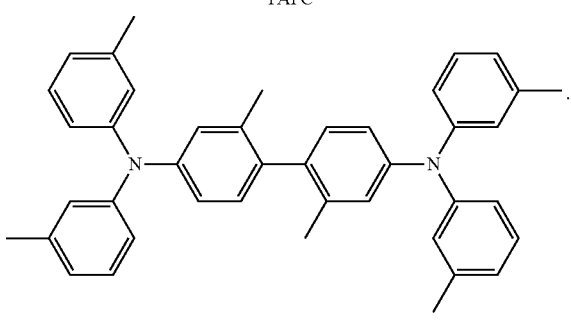

HMTPD

In one or more embodiments, an example of the organic material includes an amine-based compound.

In one or more embodiments, the hole transport layer may include at least one compound selected from a compound represented by Formula 201 and a compound represented by Formula 202 illustrated below:

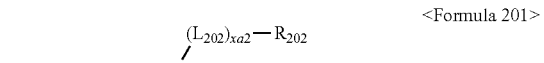

<Formula 201>

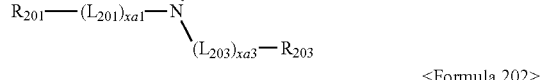

<Formula 202>

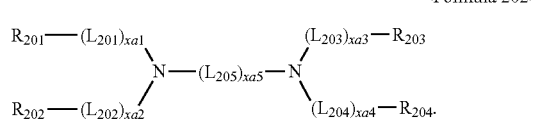

In Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*', *—N($Q_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer of 0 to 3, xa5 may be an integer of 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, in Formula 202, $R_{201}$ and $R_{202}$ may optionally be linked via a single bond, a dimethyl-methylene group, or a diphenyl-methylene group, and $R_{203}$ and $R_{204}$ may optionally be linked via a single bond, a dimethyl-methylene group, or a diphenyl-methylene group.

In one or more embodiments, in Formulae 201 and 202, $L_{201}$ to $L_{205}$ may each independently be selected from:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$) and —N($Q_{31}$)($Q_{32}$), and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more embodiments, xa1 to xa4 may each independently be 0, 1, or 2.

In one or more embodiments, xa5 may be 1, 2, 3, or 4.

In one or more embodiments, $R_{201}$ to $R_{204}$ and $Q_{201}$ may each independently be selected from a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), and $Q_{31}$ to $Q_{33}$ are respectively defined the same as described above.

A thickness of the hole transport region may be in a range of about 100 Å to about 10,000 Å, for example, about 100 Å to about 1,000 Å. When the hole transport region includes at least one of a hole injection layer and a hole transport layer, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block the flow of electrons from an electron transport region. The emission auxiliary layer and the electron blocking layer may include the materials as described above.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant.

In one embodiment, p-dopant may have a lowest unoccupied molecular orbital (LUMO) level of −3.5 eV or less.

The p-dopant may include at least one selected from a quinone derivative, a metal oxide, and a cyano group-containing compound, but embodiments of the present disclosure are not limited thereto.

For example, the p-dopant may include at least one selected from:

a quinone derivative, such as tetracyanoquinodimethane (TCNQ) or 2,3,5,6-tetrafluoro-7,7,8,8-tetracyanoquinodimethane (F4-TCNQ);

a metal oxide, such as tungsten oxide or molybdenum oxide;

1,4,5,8,9,11-hexaazatriphenylene-hexacarbonitrile (HAT-CN); and a compound represented by Formula 221 below:

but embodiments of the present disclosure are not limited thereto:

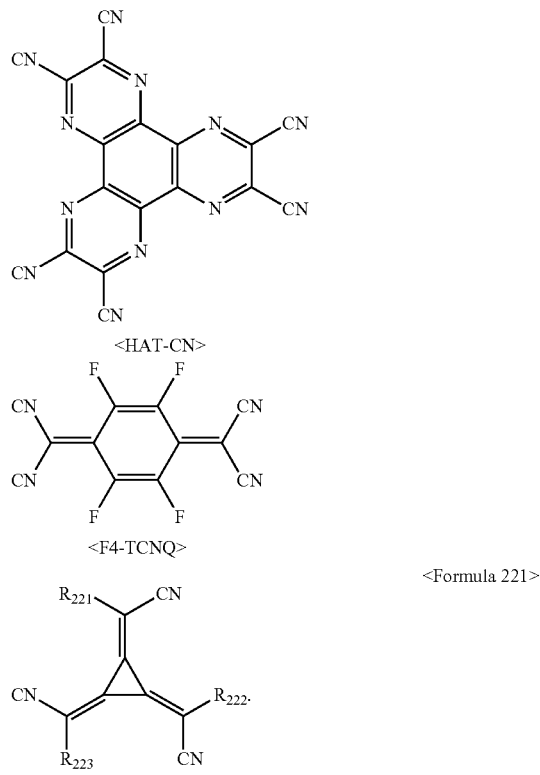

<Formula 221>

In Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one selected from $R_{221}$ to $R_{223}$ may have at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with –I.

[Emission Layer 15]

When the light-emitting diode is a quantum dot light-emitting diode, the emission layer 15 may include the perovskite compound represented by Formula 1. A method of forming the emission layer 15 may be referred by the description of a method of forming a thin film including the perovskite compound.

When the light-emitting diode is an organic light-emitting device, the emission layer 15 may include a host and a dopant. The dopant may include at least one selected from a phosphorescent dopant and a fluorescent dopant.

In the emission layer 15, an amount of the dopant may be generally in a range of about 0.01 parts by weight to about 15 parts by weight based on 100 parts by weight of the host, but embodiments of the present disclosure are not limited thereto.

A thickness of the emission layer 15 may be in a range of about 100 Å to about 1,000 Å, for example, about 200 Å to about 600 Å. When the thickness of the emission layer 15 is within this range, excellent light-emission characteristics may be obtained without a substantial increase in driving voltage.

When the organic light-emitting device 10 is a full-color organic light-emitting device, the emission layer may be patterned into a red emission layer, a green emission layer, or a blue emission layer, according to a sub-pixel. In one or more embodiments, the emission layer may have a stacked structure of two or more layers selected from a red emission layer, a green emission layer, and a blue emission layer, in which the two or more layers contact each other or are separated from each other. In one or more embodiments, the emission layer may include two or more materials selected from a red light-emitting material, a green light-emitting material, and a blue light-emitting material, in which the two or more materials are mixed with each other in a single layer to emit white light.

[Host in Emission Layer]

In one or more embodiments, the host may include a compound represented by Formula 301 below.

$$[Ar_{301}]_{xb11}-[(L_{301})_{xb1}-R_{301}]_{xb21}. \quad <Formula\ 301>$$

In Formula 301, $Ar_{301}$ may be a substituted or unsubstituted $C_5$-$C_{60}$ carbocyclic group or a substituted or unsubstituted $C_1$-$C_{60}$ heterocyclic group, xb11 may be 1, 2, or 3, $L_{301}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xb1 may be an integer of 0 to 5, $R_{301}$ may be selected from deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$) ($Q_{302}$), —B($Q_{301}$)($Q_{302}$), —C(=O)($Q_{301}$), —S(=O)$_2$ ($Q_{301}$), and —P(=O)($Q_{301}$)($Q_{302}$), xb21 may be an integer of 1 to 5, $Q_{301}$ to $Q_{303}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments of the present disclosure are not limited thereto.

In one embodiment, $Ar_{301}$ in Formula 301 may be selected from:

a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group; and a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$) and —P(=O)($Q_{31}$)($Q_{32}$), and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments of the present disclosure are not limited thereto.

When xb11 in Formula 301 is two or more, two or more Ar301(s) may be linked via a single bond.

In one or more embodiments, the compound represented by Formula 301 may be represented by Formula 301-1 or 301-2 below:

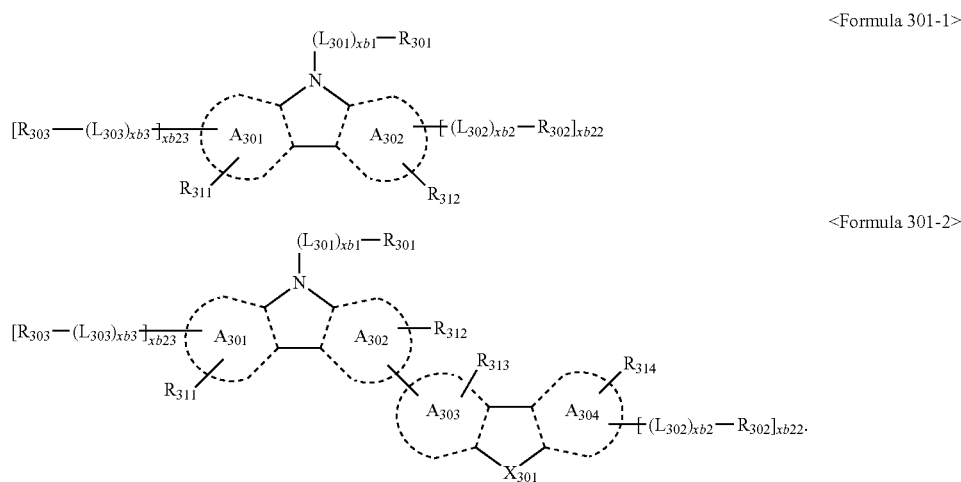

<Formula 301-1>

<Formula 301-2>

In Formulae 301-1 and 301-2, $A_{301}$ to $A_{304}$ may each independently be selected from a benzene, a naphthalene, a phenanthrene, a fluoranthene, a triphenylene, a pyrene, a chrysene, a pyridine, a pyrimidine, an indene, a fluorene, a spiro-bifluorene, a benzofluorene, a dibenzofluorene, an indole, a carbazole, a benzocarbazole, a dibenzocarbazole, a furan, a benzofuran, a dibenzofuran, a naphthofuran, a benzonaphthofuran, a dinaphthofuran, a thiophene, a benzothiophene, a dibenzothiophene, a naphthothiophene, a benzonaphthothiophene group, and a dinaphthothiophene group, $X_{301}$ may be O, S, or N-[($L_{304}$)$_{xb4}$-$R_{304}$], $R_{311}$ to $R_{314}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), xb22 and xb23 may each independently be 0, 1, or 2, $L_{301}$, xb1, $R_{301}$, and $Q_{31}$ to $Q_{33}$ are respectively defined the same as described above, $L_{302}$ to $L_{304}$ may each independently be defined the same as described in connection with $L_{301}$, xb2 to xb4 may each independently be defined the same as described in connection with xb1, $R_{302}$ to $R_{304}$ may each independently be defined the same as described in connection with $R_{301}$.

For example, in Formulae 301, 301-1, and 301-2, $L_{301}$ to $L_{304}$ may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$) and —P(=O)($Q_{31}$)($Q_{32}$), and $Q_{31}$ to $Q_{33}$ are respectively defined the same as described above.

In one embodiment, in Formulae 301, 301-1, and 301-2, $R_{301}$ to $R_{304}$ may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), and $Q_{31}$ to $Q_{33}$ are respectively defined the same as described above.

In one or more embodiments, the host may include an alkaline earth metal complex. For example, the host may be selected from a Be complex (for example, Compound H55), a Mg complex, and a Zn complex.

The host may include at least one selected from 9,10-di(2-naphthyl)anthracene (ADN), 2-methyl-9,10-bis(naphthalen-2-yl)anthracene(MADN), 9,10-di-(2-naphthyl)-2-t-butyl-anthracene (TBADN), 4,4″-bis(N-carbazolyl)-1,1′-biphenyl(CBP), 1,3-di-9-carbazolylbenzene (mCP), 1,3,5-tri(carbazol-9-yl)benzene (TCP), and Compounds H1 to H55, but embodiments of the present disclosure are not limited thereto:

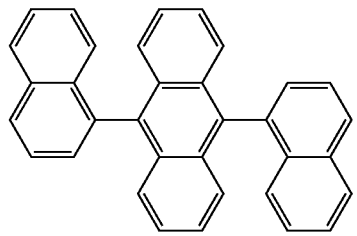

H1

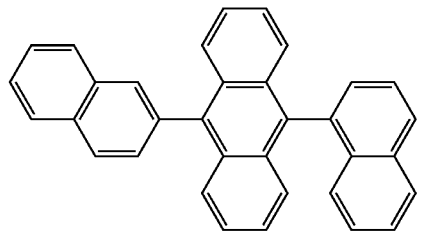

H2

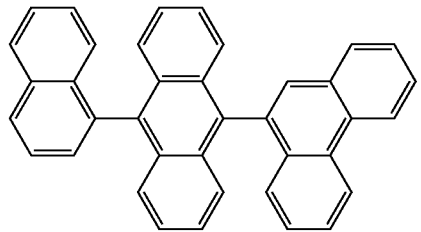

H3

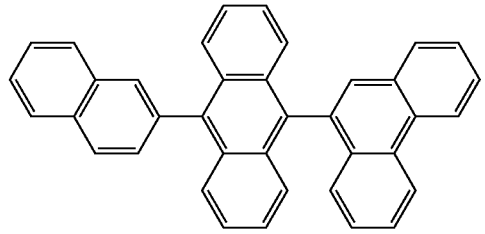

H4

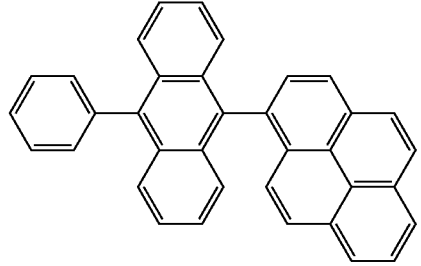

H5

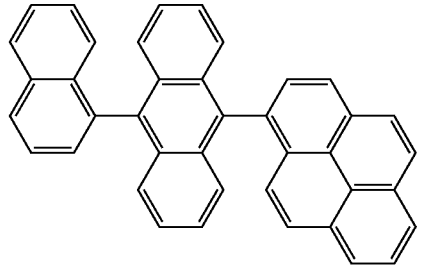

H6

-continued
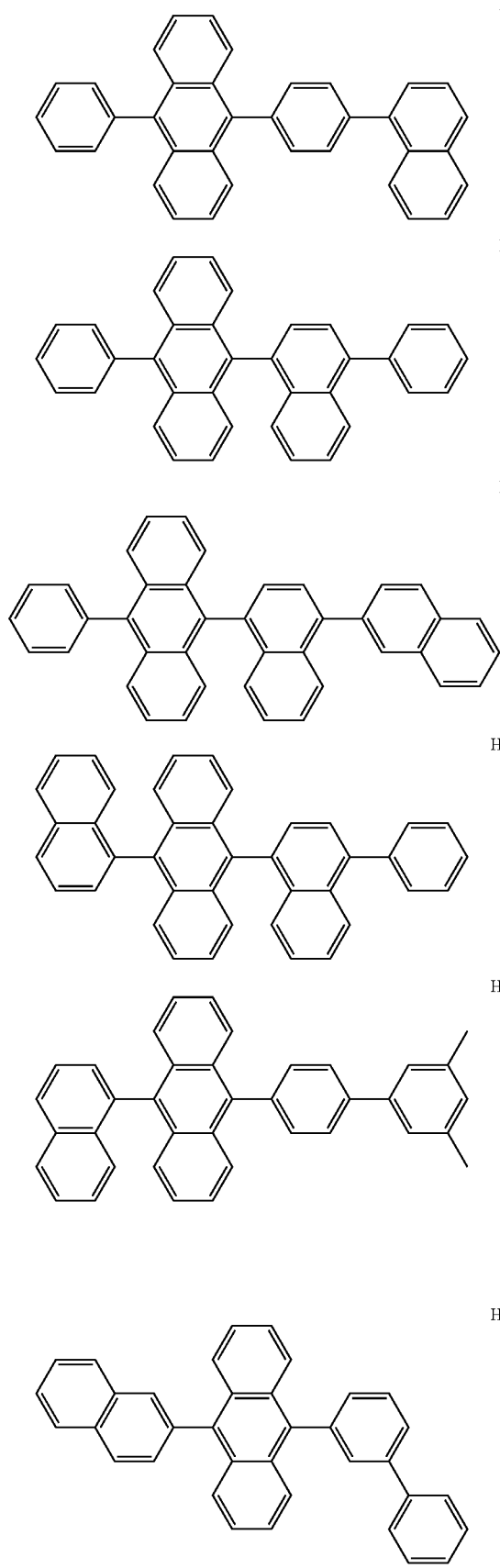
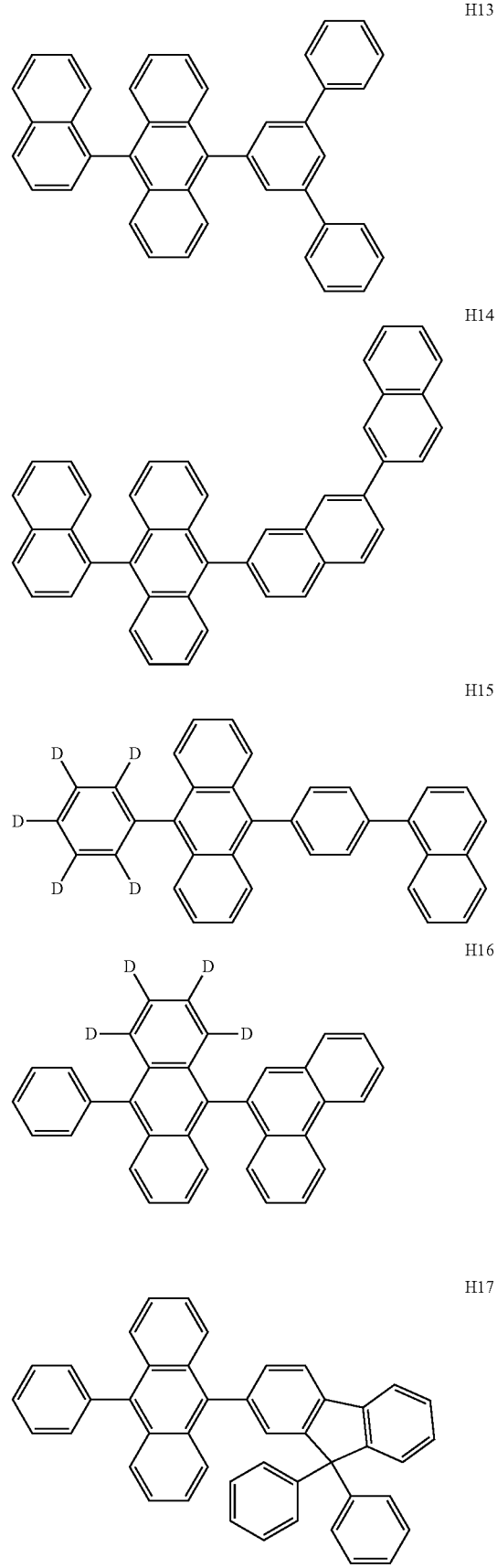

H18
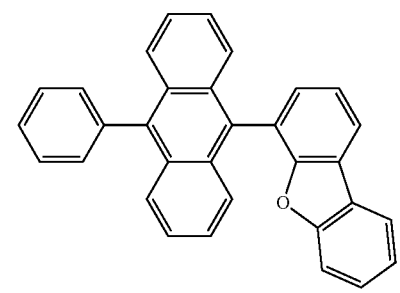
H19
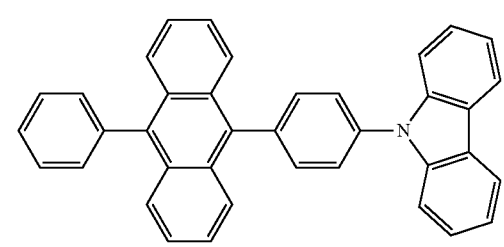
H20
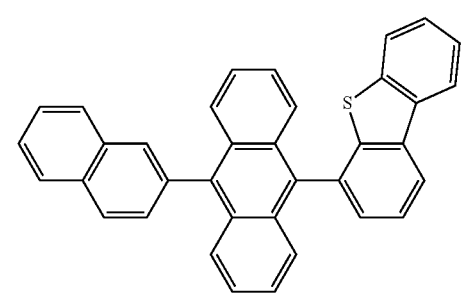
H21
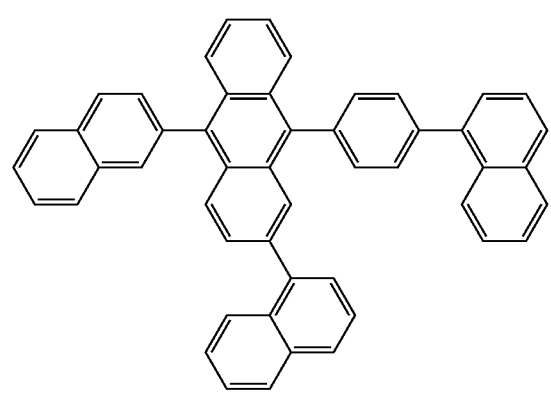
H22
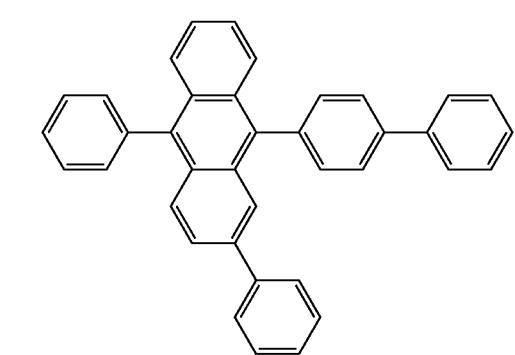
H23
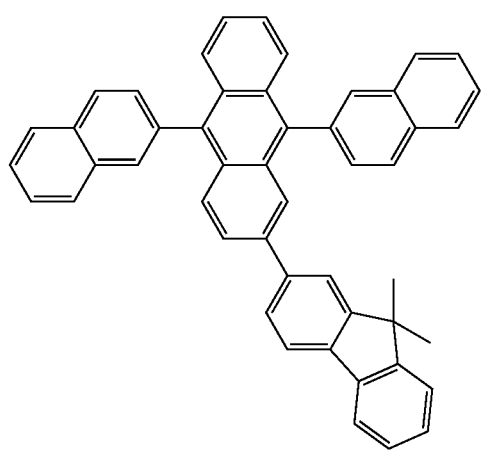
H24
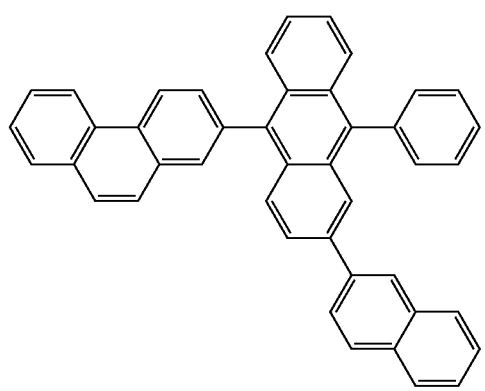
H25
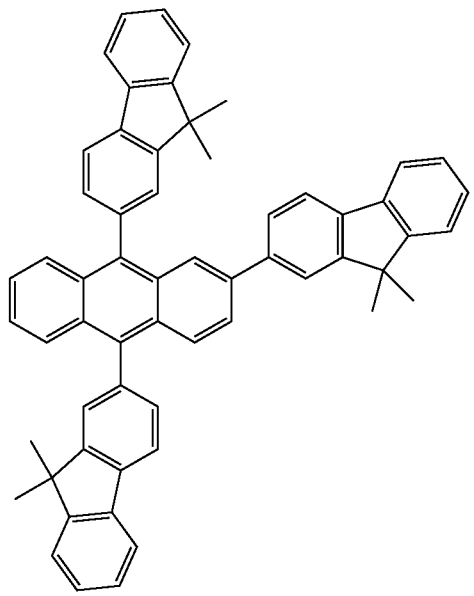

H26
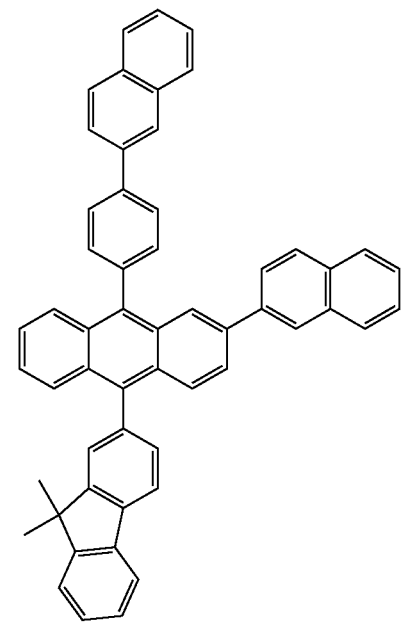
H27
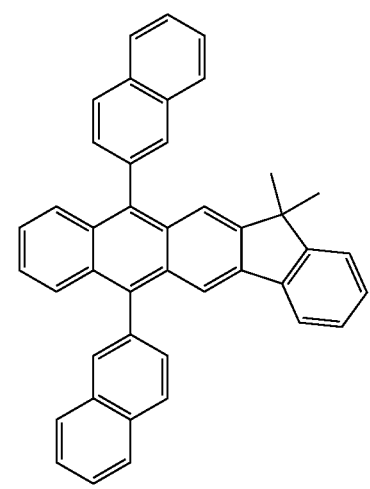
H28
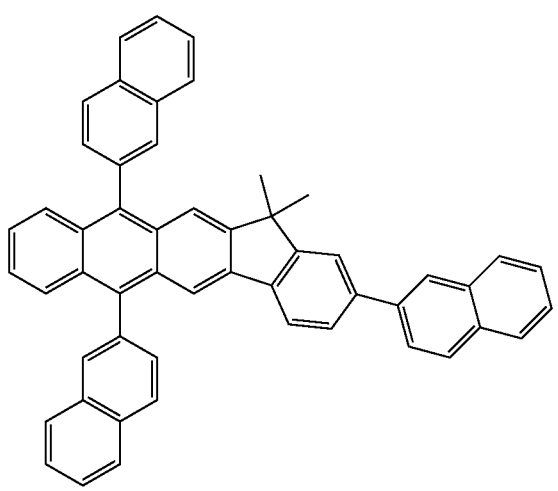
H29
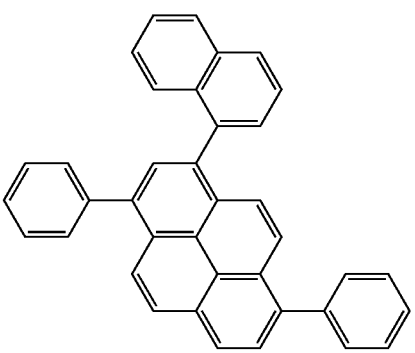
H30
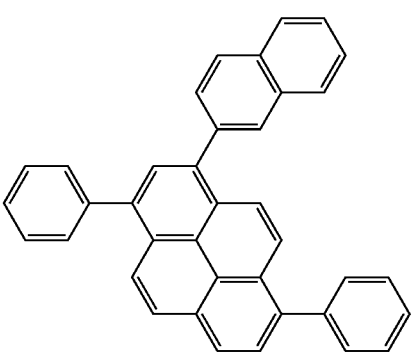
H31
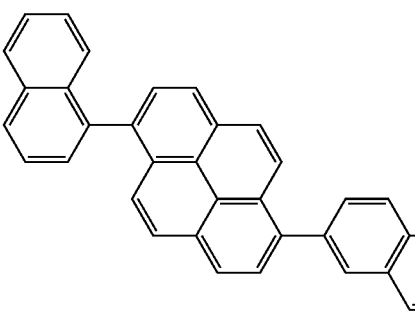
H32
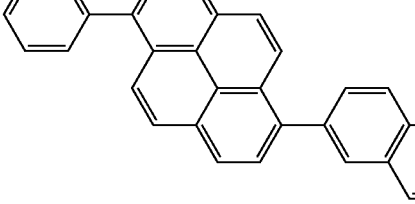
H33
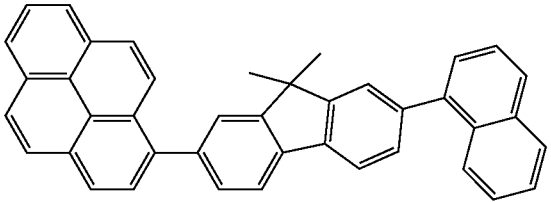

-continued
H34
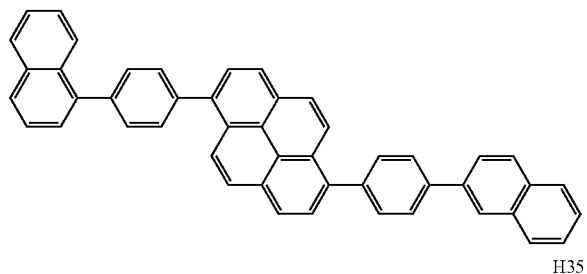
H35
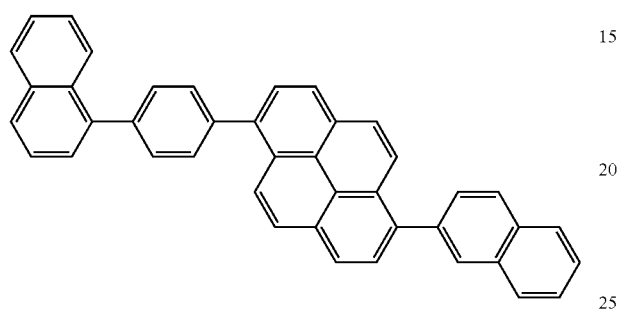
H36
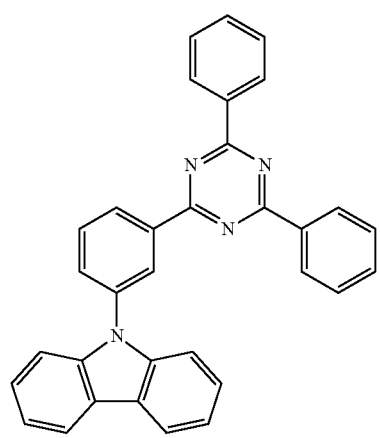
H37
-continued
H38
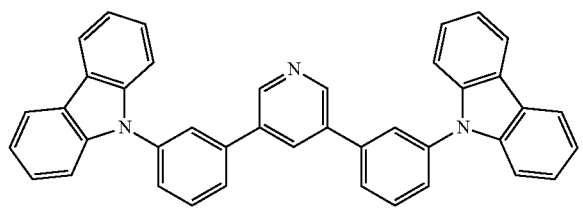
H39
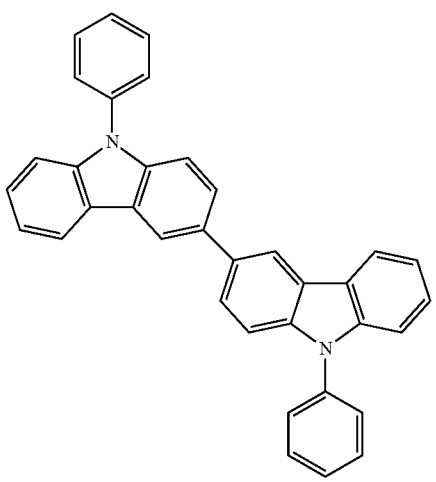
H40
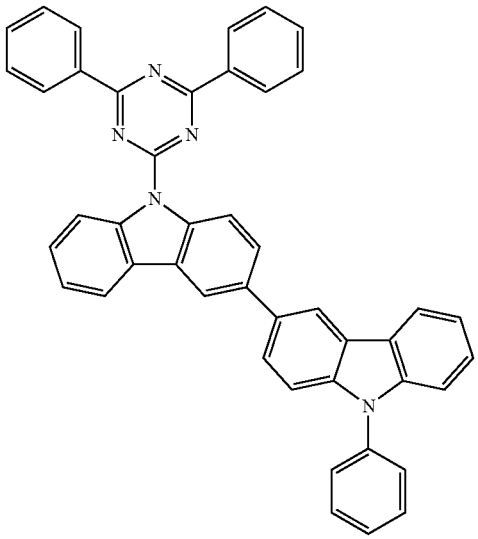

H41 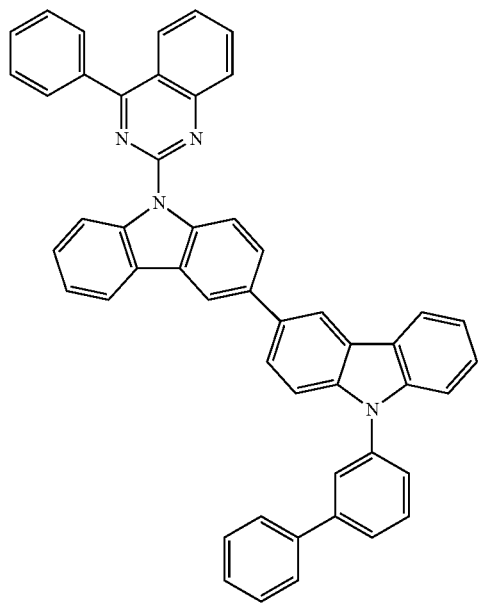
H42 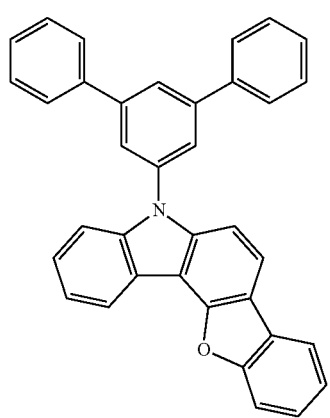
H43 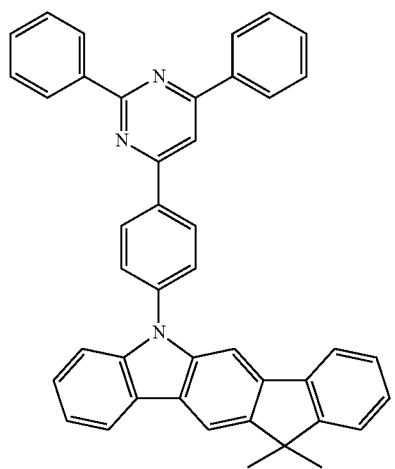
H44 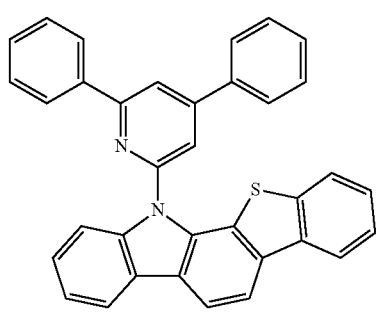
H45 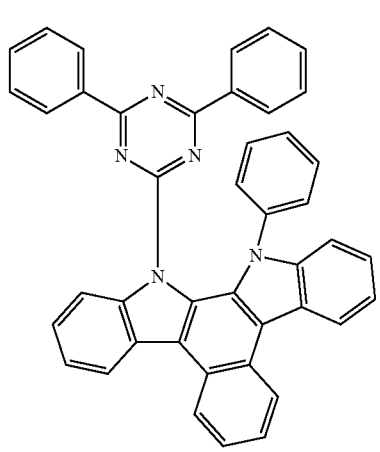
H46 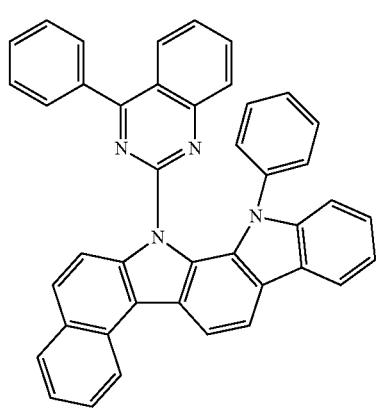
H47 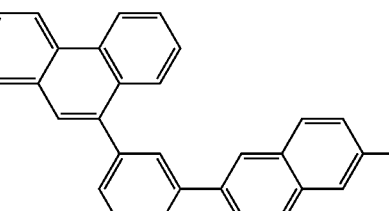
H48 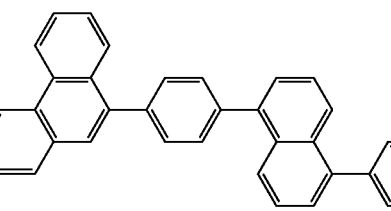

-continued

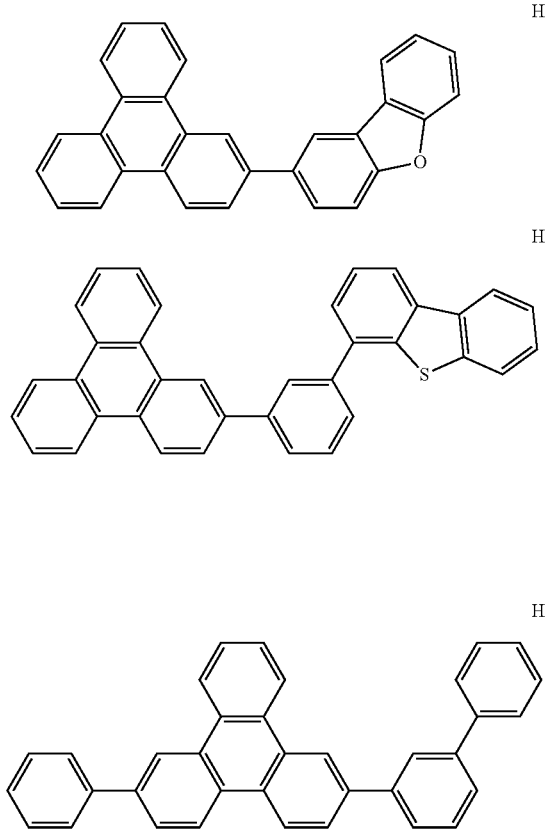

H49

H50

H51

H52

H53

-continued

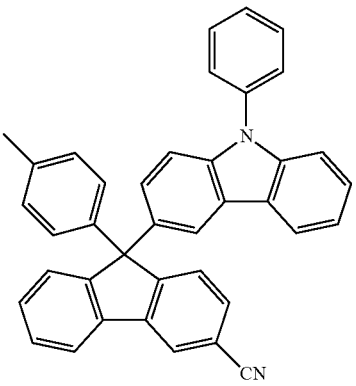

H54

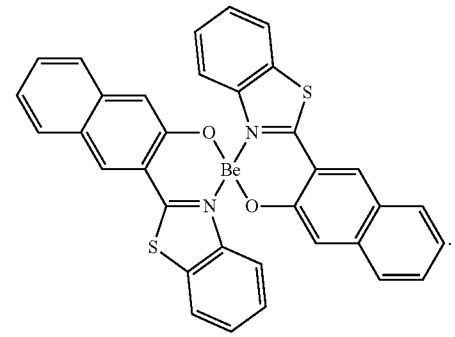

H55

[Phosphorescent Dopant Included in Emission Layer in Organic Layer 150]

The phosphorescent dopant may include an organometallic complex represented by Formula 401 below:

$$M(L_{401})_{xc1}(L_{402})_{xc2}$$  <Formula 401>

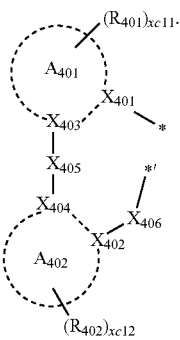  <Formula 402>

In Formulae 401 and 402,

M may be selected from iridium (Ir), platinum (Pt), palladium (Pd), osmium (Os), titanium (Ti), zirconium (Zr), hafnium (Hf), europium (Eu), terbium (Tb), rhodium (Rh), and thulium (Tm), $L_{401}$ may be selected from ligands represented by Formula 402, and xc1 may be 1, 2, or 3, wherein, when xc1 is two or more, two or more $L_{401}$(S) may be identical to or different from each other, $L_{402}$ may be an organic ligand, and xc2 may be an integer of 0 to 4, wherein, when xc2 is two or more, two or more $L_{402}$(s) may be identical to or different from each other, $X_{401}$ to $X_{404}$ may each independently be nitrogen or carbon;

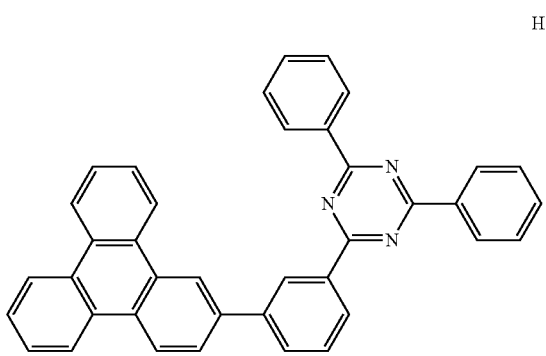

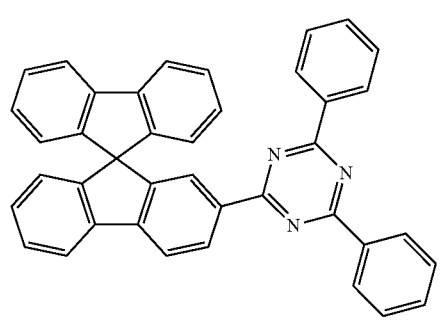

$X_{401}$ and $X_{403}$ may be linked via a single bond or a double bond, and $X_{402}$ and $X_{404}$ may be linked via a single bond or a double bond, $A_{401}$ and $A_{402}$ may each independently be selected from a $C_5$-$C_{60}$ carbocyclic group or a $C_1$-$C_{60}$ heterocyclic group, $X_{405}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C($Q_{411}$)=*', wherein $Q_{411}$ and $Q_{412}$ may each independently be hydrogen, deuterium, a $C_1$-$C_{20}$ alkyl group, a $C_1$-$C_{20}$ alkoxy group, a phenyl group, a biphenyl group, a terphenyl group or a naphthyl group, $X_{406}$ may be a single bond, O, or S, $R_{401}$ and $R_{402}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), and —P(=O)($Q_{401}$)($Q_{402}$), wherein $Q_{401}$ to $Q_{403}$ may each independently be selected from a $C_1$-$C_{10}$ alkyl group, a $C_1$-$C_{10}$ alkoxy group, a $C_6$-$C_{20}$ aryl group, and a $C_1$-$C_{20}$ heteroaryl group, xc11 and xc12 may each independently be an integer of 0 to 10, and

* and *' in Formula 402 each indicate a binding site to M of Formula 401.

In one embodiment, in Formula 402, $A_{401}$ and $A_{402}$ may each independently be selected from a benzene group, a naphthalene group, a fluorene group, a spiro-bifluorene group, an indene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, a quinoline group, an isoquinoline group, a benzoquinoline group, a quinoxaline group, a quinazoline group, a carbazole group, a benzimidazole group, a benzofuran group, a benzothiophene group, an isobenzothiophene group, a benzoxazole group, an isobenzoxazole group, a triazole group, a tetrazole group, an oxadiazole group, a triazine group, a dibenzofuran group, and a dibenzothiophene group.

In one or more embodiments, in Formula 402, i) $X_{401}$ may be nitrogen, and $X_{402}$ may be carbon, or ii) $X_{401}$ and $X_{402}$ may each be nitrogen at the same time.

In one or more embodiments, in Formula 402, $R_{401}$ and $R_{402}$ may each independently be selected from:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amidino group, a hydrazino group, a hydrazono group, a phenyl group, a naphthyl group, a cyclopentyl group, a cyclohexyl group, an adamantanyl group, a norbornanyl group, and a norbornenyl group;

a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group;

a cyclopentyl group, a cyclohexyl group, an adamantanyl group, a norbornanyl group, a norbornenyl group a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group; and —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), and —P(=O)($Q_{401}$)($Q_{402}$), and $Q_{401}$ to $Q_{403}$ may each independently be selected from a $C_1$-$C_{10}$ alkyl group, a $C_1$-$C_{10}$ alkoxy group, a phenyl group, a biphenyl group, and a naphthyl group, but embodiments of the present disclosure are not limited thereto.

In one or more embodiments, in Formula 401, when xc1 is two or more, two $A_{401}$(s) among a plurality of $L_{401}$(s) may optionally be linked via a linking group, $X_{407}$, or two $A_{402}$(s) may optionally be linked via a linking group, $X_{408}$ (see Compounds PD1 to PD4 and PD7). $X_{407}$ and $X_{408}$ may each independently be a single bond, *—O—*', *—S—*', *—C(=O)—*', *—N($Q_{413}$)-*, *—C($Q_{413}$)($Q_{414}$)-*', or *—C($Q_{413}$)=C($Q_{414}$)-*' (wherein $Q_{413}$ and $Q_{414}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group), but embodiments of the present disclosure are not limited thereto.

$L_{402}$ in Formula 401 may be a monovalent, divalent, or trivalent organic ligand. For example, $L_{402}$ may be selected from halogen, diketone (for example, acetylacetonate), carboxylic acid (for example, picolinate), —C(=O), isonitrile, —CN, and phosphorus (for example, phosphine, or phosphite), but embodiments of the present disclosure are not limited thereto.

In one or more embodiments, the phosphorescent dopant may be selected from, for example, Compounds PD1 to PD25, but embodiments of the present disclosure are not limited thereto:

PD1 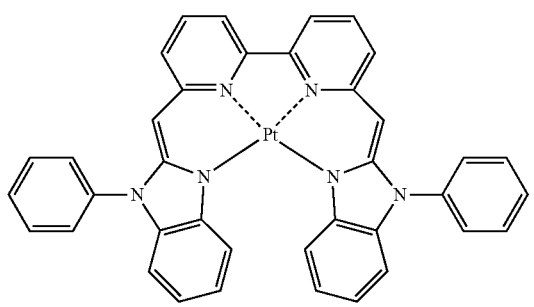
PD6 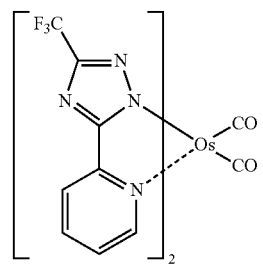
PD2 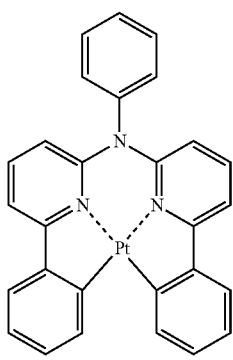
PD7 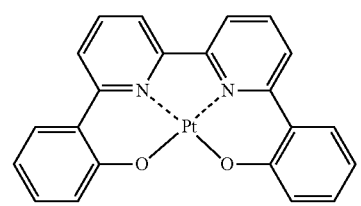
PD3 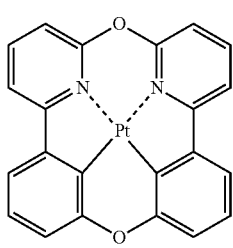
PD8 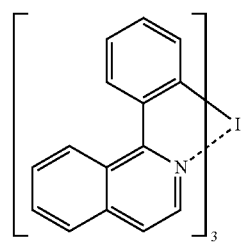
PD4 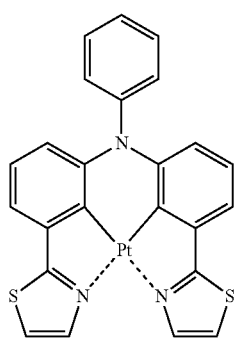
PD9 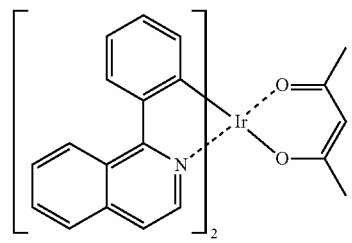
PD10 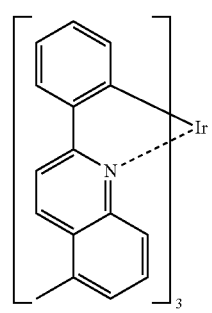
PD5 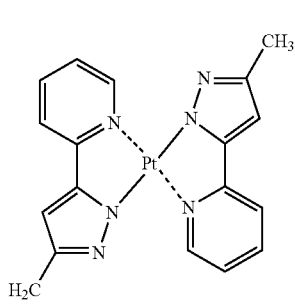
PD11 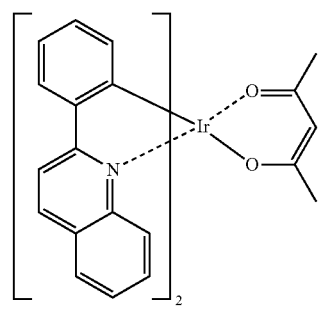

PD12 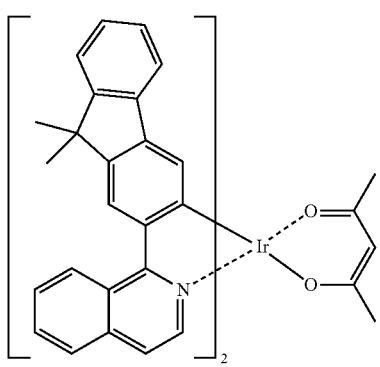
PD13 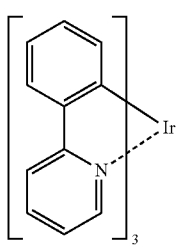
PD14 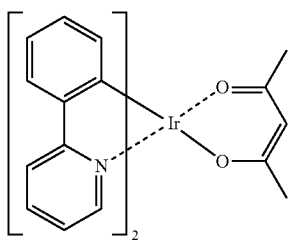
PD15 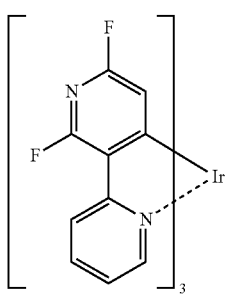
PD16 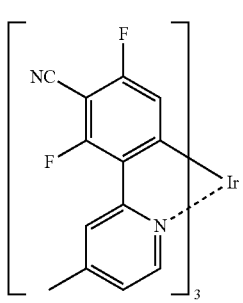
PD17 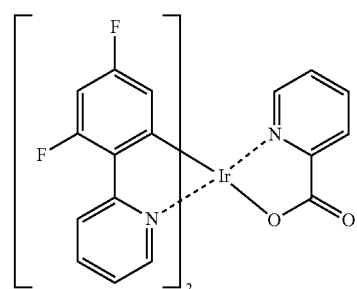
PD18 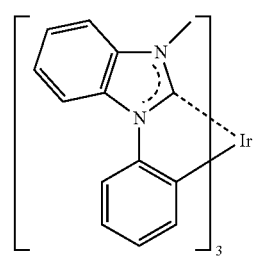
PD19 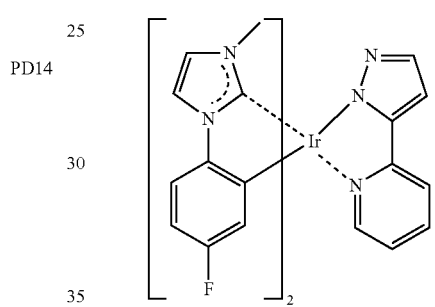
PD20 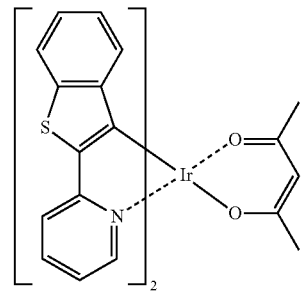
PD21 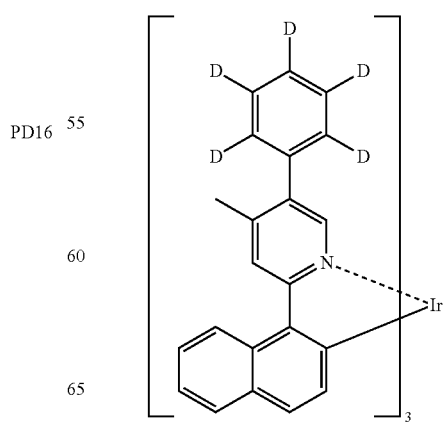

PD22

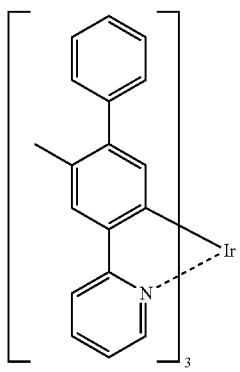

PD23

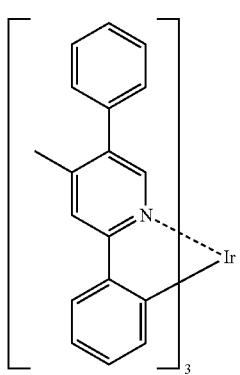

PD24

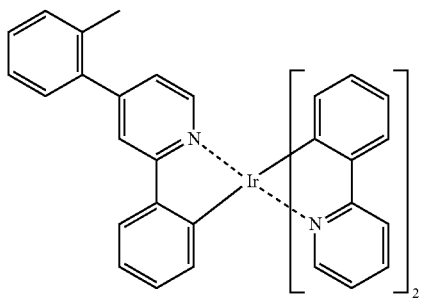

PD25

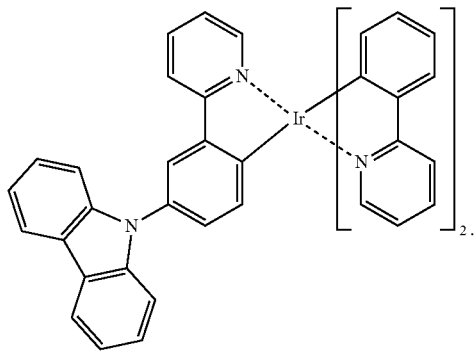

[Fluorescent Dopant in Emission Layer]

The fluorescent dopant may include an arylamine compound or a styrylamine compound.

The fluorescent dopant may include a compound represented by Formula 501 below.

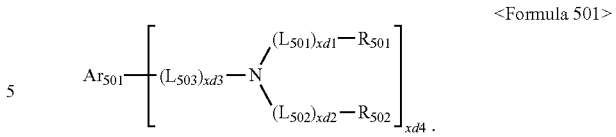

<Formula 501>

In Formula 501, $Ar_{501}$ may be a substituted or unsubstituted $C_5$-$C_{60}$ carbocyclic group or a substituted or unsubstituted $C_1$-$C_{60}$ heterocyclic group, $L_{501}$ to $L_{503}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xd1 to xd3 may each independently be an integer of 0 to 3, $R_{501}$ and $R_{502}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and xd4 may be an integer of 1 to 6.

In one embodiment, $Ar_{501}$ in Formula 501 may be selected from:

a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group; and a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one or more embodiments, $L_{501}$ to $L_{503}$ in Formula 501 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

In one or more embodiments, in Formula 501, $R_{501}$ and $R_{502}$ may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, and —Si($Q_{31}$)($Q_{32}$)($Q_{33}$), and $Q_{31}$ to $Q_{33}$ may each independently selected from a $C_1$-$C_{10}$ alkyl group, a $C_1$-$C_{10}$ alkoxy group, a phenyl group, a biphenyl group, a terphenyl group, and a naphthyl group.

In one or more embodiments, xd4 in Formula 501 may be 2, but embodiments of the present disclosure are not limited thereto.

For example, the fluorescent dopant may be selected from Compounds FD1 to FD22:

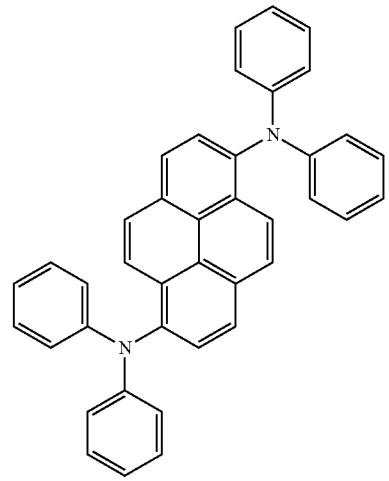

FD1

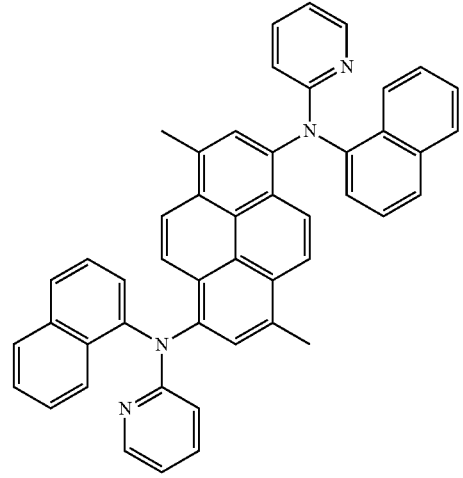

FD2

-continued
FD3
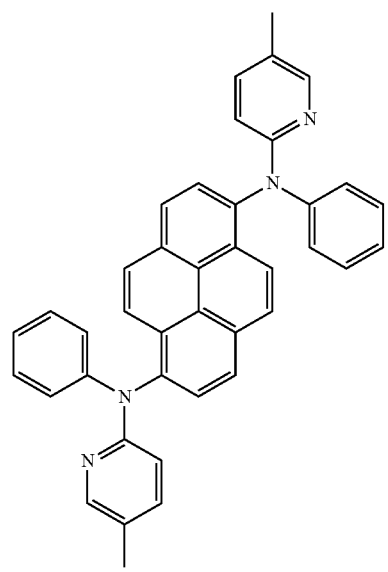
FD4
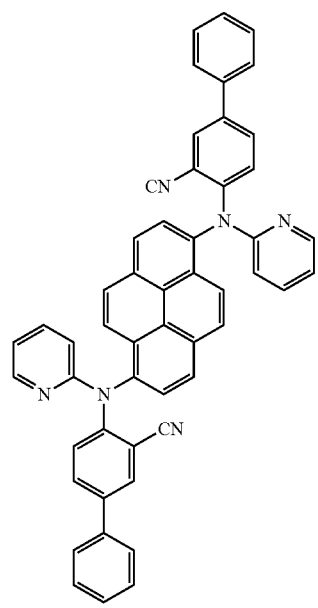
FD5
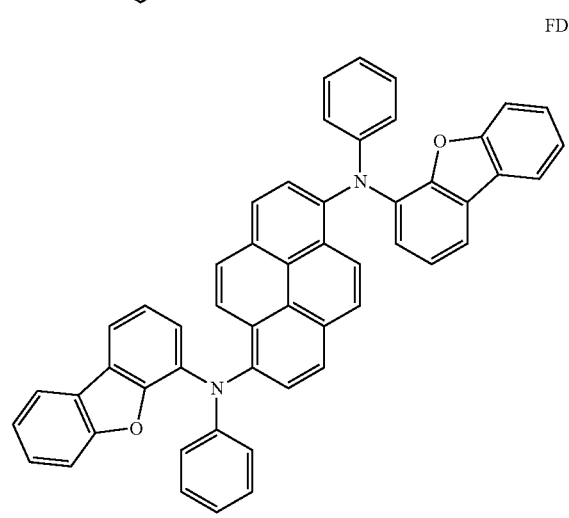
-continued
FD6
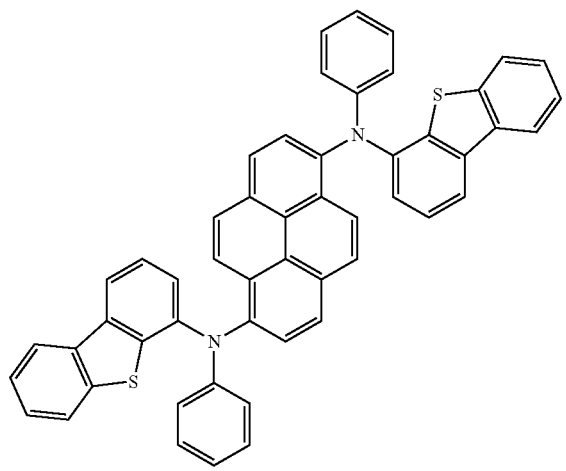
FD7
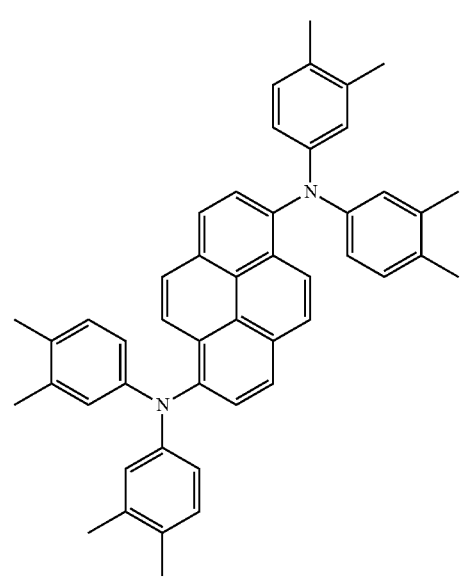
FD8
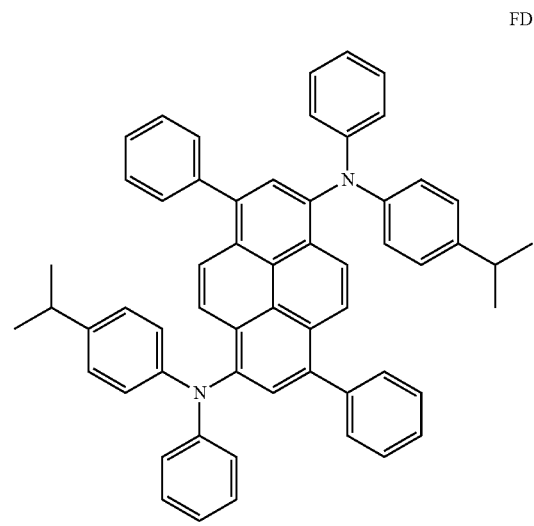

FD9 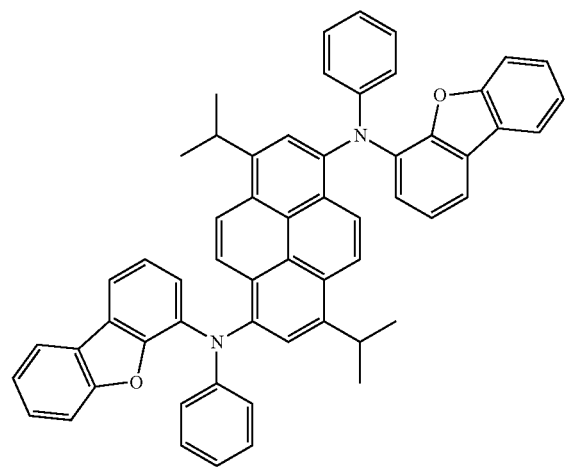
FD10 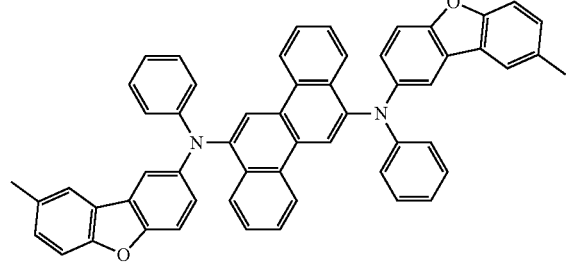
FD11 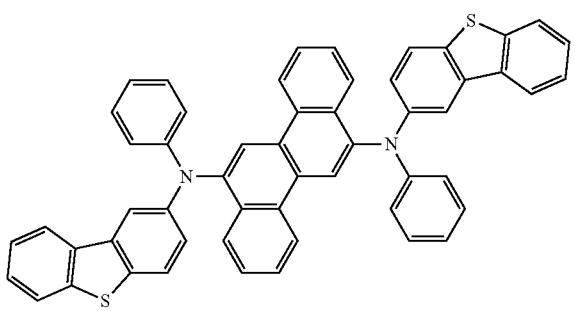
FD12 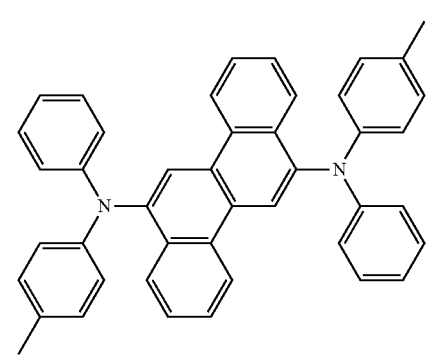
FD13 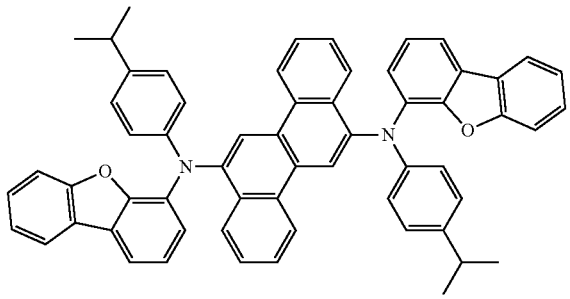
FD14 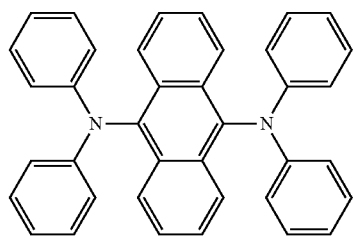
FD15 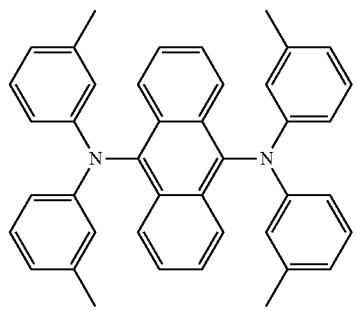
FD16 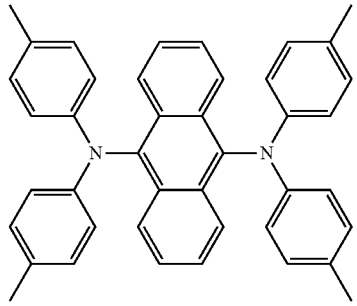
FD17 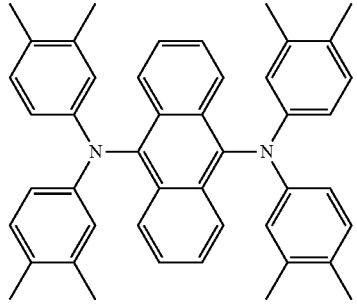

FD18
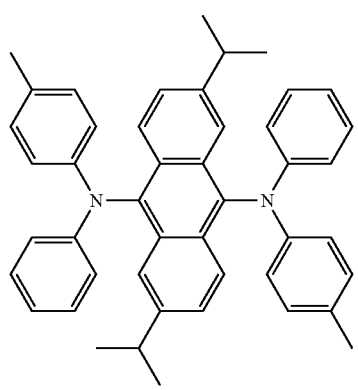
FD20
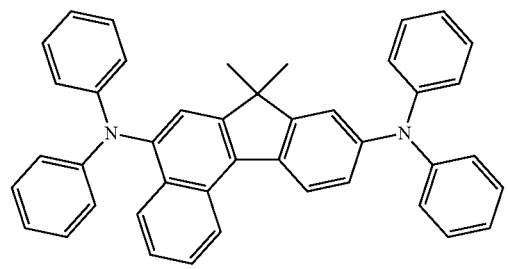
FD21
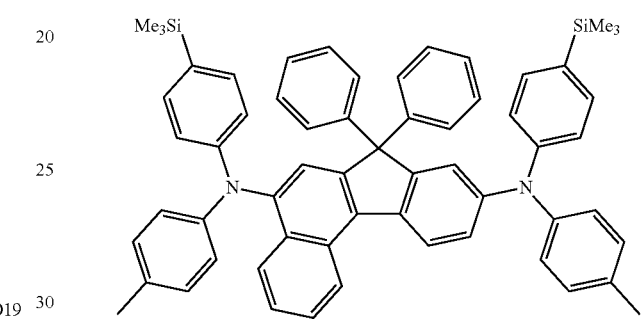
FD19
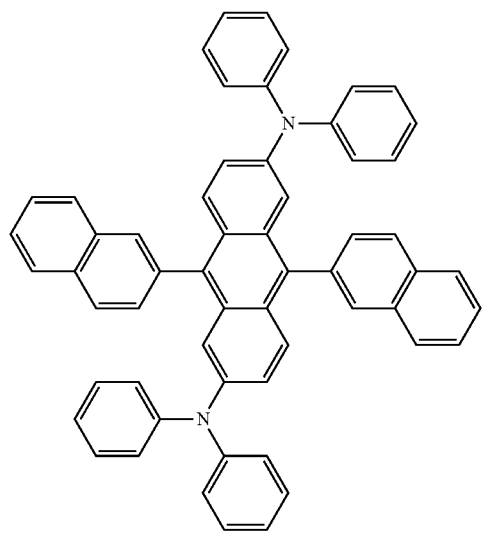
FD22
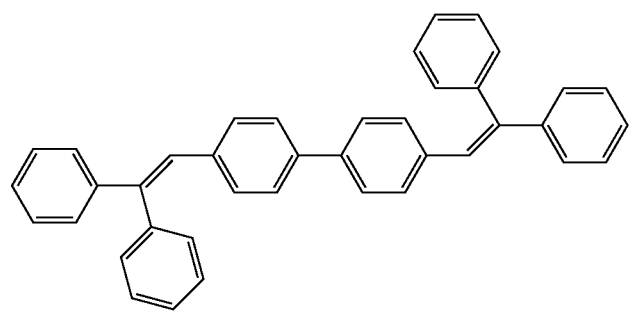
In one or more embodiments, the fluorescent dopant may be selected from the following compounds, but embodiments of the present disclosure are not limited thereto.
DPVBi

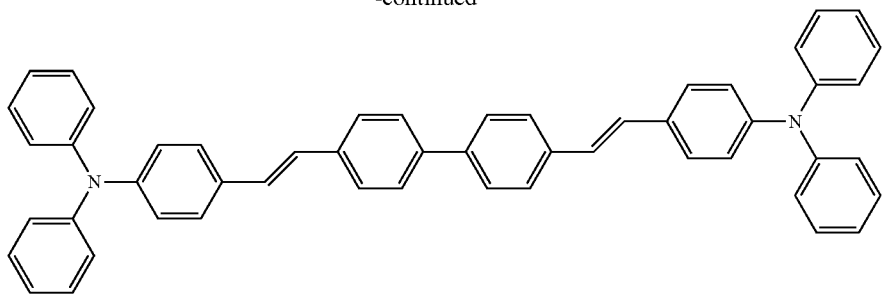

DPAVBi

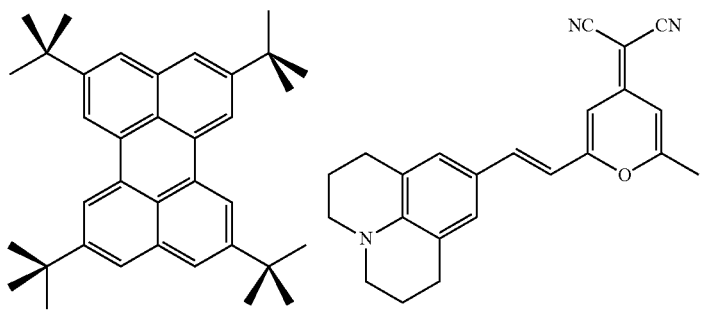

TBPe        DCM

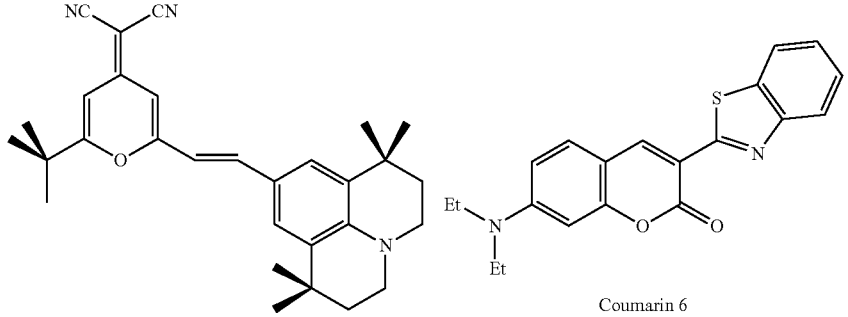

DCJTB        Coumarin 6

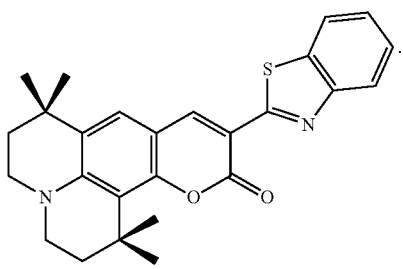

C545T

[Electron Transport Region 17]

The electron transport region 17 may have i) a single-layered structure including a single layer including a single material, ii) a single-layered structure including a single layer including a plurality of different materials, or iii) a multi-layered structure having a plurality of layers including a plurality of different materials.

The electron transport region 17 may include at least one selected from a buffer layer, a hole blocking layer, an electron control layer, an electron transport layer, and an electron injection layer, but embodiments of the present disclosure are not limited thereto.

For example, the electron transport region 17 may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein for each structure, constituting layers are sequentially stacked from an emission layer. However, embodiments of the structure of the electron transport region are not limited thereto.

The electron transport region 17 may include an inorganic material, and the inorganic material is defined the same as described above.

In one embodiment, the electron transport region 17 may include the perovskite compound represented by one of Formulae 1 to 4.

In one or more embodiments, the electron transport region 17 may include an organic material.

The organic material included in the electron transport region 17 may be a metal-free compound including at least one π electron-depleted nitrogen-containing ring.

The "π electron-depleted nitrogen-containing ring" indicates a $C_1$-$C_{60}$ heterocyclic group having at least one *—N=*' moiety as a ring-forming moiety.

For example, the "π electron-depleted nitrogen-containing ring" may be i) a 5-membered to 7-membered heteromonocyclic group having at least one *—N=*' moiety, ii) a heteropolycyclic group in which two or more 5-membered to 7-membered heteromonocyclic groups each having at least one *—N=*' moiety are condensed with each other, or iii) a heteropolycyclic group in which at least one of 5-membered to 7-membered heteromonocyclic groups, each having at least one *—N=*' moiety, is condensed with at least one $C_5$-$C_{60}$ carbocyclic group.

Examples of the π electron-depleted nitrogen-containing ring include an imidazole, a pyrazole, a thiazole, an isothiazole, an oxazole, an isoxazole, a pyridine, a pyrazine, a pyrimidine, a pyridazine, an indazole, a purine, a quinoline, an isoquinoline, a benzoquinoline, a phthalazine, a naphthyridine, a quinoxaline, a quinazoline, a cinnoline, a phenanthridine, an acridine, a phenanthroline, a phenazine, a benzimidazole, an isobenzothiazole, a benzoxazole, an isobenzoxazole, a triazole, a tetrazole, an oxadiazole, a triazine, thiadiazol, an imidazopyridine, an imidazopyrimidine, and an azacarbazole, but are not limited thereto.

For example, the electron transport region 17 may include a compound represented by Formula 601.

$$[Ar_{601}]_{xe11}-[(L_{601})_{xe1}-R_{601}]_{xe21}. \quad <\text{Formula 601}>$$

In Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer of 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{601}$)($Q_{602}$)($Q_{603}$), —C(=O)($Q_{601}$), —S(=O)$_2$($Q_{601}$), and —P(=O)($Q_{601}$)($Q_{602}$), $Q_{601}$ to $Q_{603}$ may each independently be a $C_1$-$C_{10}$ alkyl group, a $C_1$-$C_{10}$ alkoxy group, a phenyl group, a biphenyl group, a terphenyl group or a naphthyl group, and xe21 may be an integer of 1 to 5.

In one embodiment, at least one of $Ar_{601}$(s) in the number of xe11 and $R_{601}$(s) in the number of xe21 may include the π electron-depleted nitrogen-containing ring.

In one embodiment, in Formula 601, ring $Ar_{601}$ may be selected from:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(=O)$_2$($Q_{31}$), and —P(=O)($Q_{31}$)($Q_{32}$), and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is two or more, two or more Ar601(s) may be linked via a single bond.

In one embodiment, $L_{601}$ and $L_{611}$ to $L_{613}$ in Formula 601 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

but embodiments of the present disclosure are not limited thereto.

In one or more embodiments, in Formula 601, xe1 and xe611 to xe613 may each independently be 0, 1, or 2.

In one or more embodiments, in Formula 601, $R_{601}$ and $R_{611}$ to $R_{613}$ may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —S(=O)$_2$(Q$_{601}$) and —P(=O)(Q$_{601}$)(Q$_{602}$), and Q$_{601}$ and Q$_{602}$ are respectively defined the same as described above.

In one embodiment, the electron transport region 17 may include at least one compound selected from 2,9-dimethyl-4,7-diphenyl-1,10-phenanthroline (BCP), 4,7-diphenyl-1, 10-phenanthroline (Bphen), Alq$_3$, BAlq, TAZ(3-(Biphenyl-4-yl)-5-(4-tert-butylphenyl)-4-phenyl-4H-1,2,4-triazole), NTAZ, and TPBi, but embodiments of the present disclosure are not limited thereto:

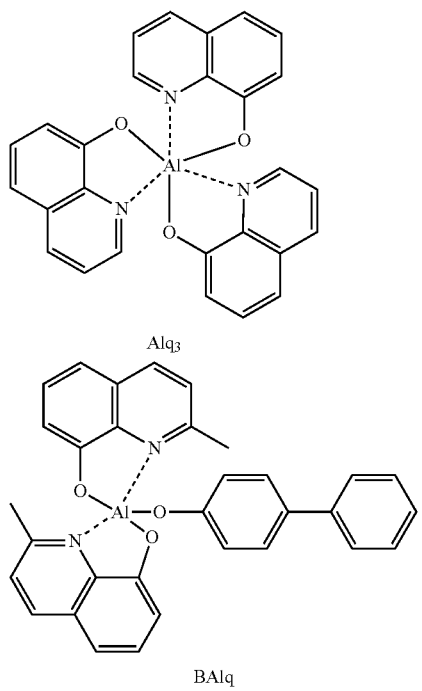

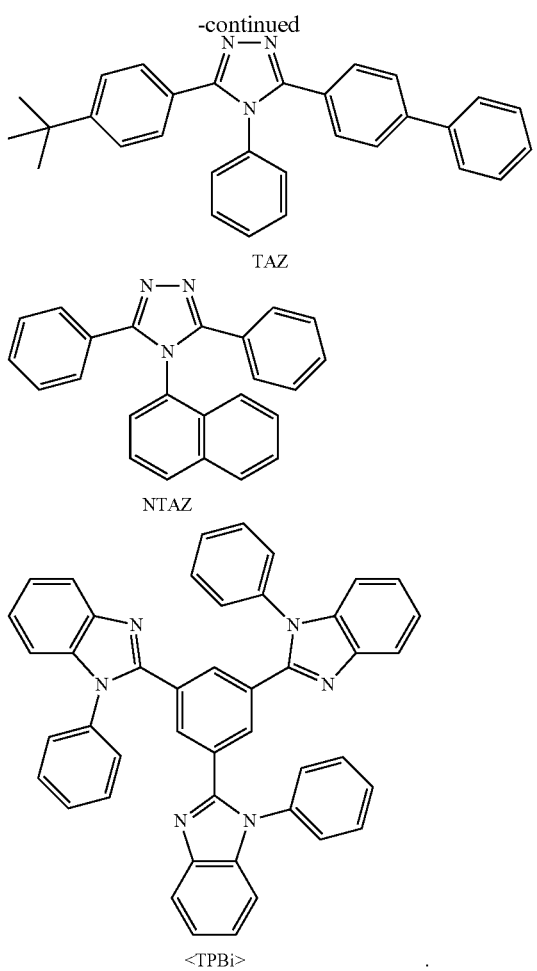

A thickness of the electron transport layer may be in a range of about 100 Å to about 1,000 Å, for example, about 150 Å to about 700 Å. When the thickness of the electron transport layer is within the range described above, the electron transport layer may have satisfactory electron transport characteristics without a substantial increase in driving voltage.

The electron transport region 17 (for example, the electron transport layer in the electron transport region) may further include, in addition to the materials described above, a metal-containing material.

The metal-containing material may include at least one selected from alkali metal complex and alkaline earth-metal complex. The alkali metal complex may include a metal ion selected from a Li ion, a Na ion, a K ion, a Rb ion, and a Cs ion, and the alkaline earth-metal complex may include a metal ion selected from a Be ion, a Mg ion, a Ca ion, a Sr ion, and a Ba ion. A ligand coordinated with the metal ion of the alkali metal complex or the alkaline earth-metal complex may be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazol, a hydroxy phenylpyridine, a hydroxy phenylbenzimidazole, a hydroxy phenylbenzothiazole, a bipyridine, a phenanthroline, and a cyclopentadiene, but embodiments of the present disclosure are not limited thereto.

For example, the metal-containing material may include a Li complex. The Li complex may include, for example, Compound ET-D1 (lithium quinolate, LiQ) or ET-D2.

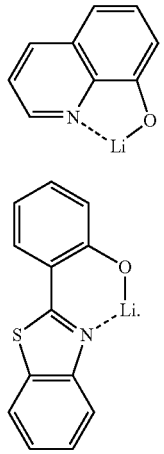

ET-D1

ET-D2

The electron transport region 17 may include an electron injection layer that facilitates injection of electrons from the second electrode 19. The electron injection layer may directly contact the second electrode 19.

The electron injection layer may have i) a single-layered structure including a single layer including a single material, ii) a single-layered structure including a single layer including a plurality of different materials, or iii) a multi-layered structure having a plurality of layers including a plurality of different materials.

The electron injection layer may include an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof.

The alkali metal may be selected from Li, Na, K, Rb, and Cs.

The alkaline earth metal may be selected from Mg, Ca, Sr, and Ba.

The rare earth metal may be selected from Sc, Y, Ce, Tb, Yb, and Gd.

The alkali metal compound, the alkaline earth-metal compound, and the rare earth metal compound may be selected from oxides and halides (for example, fluorides, chlorides, bromides, or iodides) of the alkali metal, the alkaline earth-metal, and the rare earth metal.

The alkali metal compound may be selected from alkali metal oxides, such as $Li_2O$, $Cs_2O$, or $K_2O$, and alkali metal halides, such as LiF, NaF, CsF, KF, LiI, NaI, CsI, KI, or RbI. In one embodiment, the alkali metal compound may be selected from LiF, $Li_2O$, NaF, LiI, NaI, CsI, KI, and RbI but embodiments of the present disclosure are not limited thereto.

The alkaline earth-metal compound may be selected from alkaline earth-metal oxides, such as BaO, SrO, CaO, $Ba_xSr_{1-x}O$ (0<x<1), or $Ba_xCa_{1-x}O$ (0<x<1). In one embodiment, the alkaline earth-metal compound may be selected from BaO, SrO, and CaO, but embodiments of the present disclosure are not limited thereto.

The rare earth metal compound may be selected from $YbF_3$, $ScF_3$, $Sc_2O_3$, $Y_2O_3$, $Ce_2O_3$, $GdF_3$, and $TbF_3$. In one embodiment, the rare earth metal compound may be selected from YbF3, $ScF_3$, $TbF_3$, $YbI_3$, $ScI_3$, and $TbI_3$, but embodiments of the present disclosure are not limited thereto.

For example, the electron injection layer may include an alkali metal compound (for example, RbI) and a rare earth metal compound (for example, Yb), but embodiments of the present disclosure are not limited thereto.

The alkali metal complex, the alkaline earth-metal complex, and the rare earth metal complex may include an ion of alkali metal, alkaline earth-metal, and rare earth metal as described above, and a ligand coordinated with a metal ion of the alkali metal complex, the alkaline earth-metal complex, or the rare earth metal complex may be selected from hydroxy quinoline, hydroxy isoquinoline, hydroxy benzoquinoline, hydroxy acridine, hydroxy phenanthridine, hydroxy phenyloxazole, hydroxy phenylthiazole, hydroxy diphenyloxadiazole, hydroxy diphenylthiadiazol, hydroxy phenylpyridine, hydroxy phenylbenzimidazole, hydroxy phenylbenzothiazole, bipyridine, phenanthroline, and cyclopentadiene, but embodiments of the present disclosure are not limited thereto.

The electron injection layer may consist of an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof, as described above. In one or more embodiments, the electron injection layer may further include an organic material. When the electron injection layer further includes an organic material, an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof may be homogeneously or non-homogeneously dispersed in a matrix including the organic material.

A thickness of the electron injection layer may be in a range of about 1 Å to about 100 Å, for example, about 3 Å to about 90 Å. When the thickness of the electron injection layer is within the range described above, the electron injection layer may have satisfactory electron injection characteristics without a substantial increase in driving voltage.

[Second Electrode 19]

The second electrode 19 may be disposed on the electron transport region 17 having such a structure. The second electrode 19 may be a cathode which is an electron injection electrode, and in this regard, a material for forming the second electrode 19 may be selected from metal, an alloy, an electrically conductive compound, and a combination thereof, which have a relatively low work function.

The second electrode 19 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), silver-magnesium (Ag—Mg), ITO, and IZO, but embodiments of the present disclosure are not limited thereto. The second electrode 19 may be a transmissive electrode, a semi-transmissive electrode, or a reflective electrode.

The second electrode 19 may have a single-layered structure, or a multi-layered structure including two or more layers.

Layers constituting the hole transport region 13 and layers constituting the electron transport region 17 may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region 13 and layers constituting the electron transport region 17 are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec by taking into account a material to be included in a layer to be formed, and the structure of a layer to be formed.

When layers constituting the hole transport region 13 and layers constituting the electron transport region 17 are formed by spin coating, the spin coating may be performed at a coating speed of about 2,000 rpm to about 5,000 rpm and at a heat treatment temperature of about 80° C. to about 200° C. by taking into account a material to be included in a layer to be formed, and the structure of a layer to be formed.

In one embodiment, an electronic apparatus includes: a first substrate; an organic light-emitting device; and a thin film disposed on at least one traveling direction of light emitted from the organic light-emitting device, and
the thin film may include a perovskite compound:

$[A][B^1{}_{n1}B^2{}_{(1-n1)}][X]_3$ <Formula 1>

$[A]_2[B^1{}_{n2}B^2{}_{(1-n2)}][X]_4$ <Formula 2>

$[A]_3[B^1{}_{n2}B^2{}_{(1-n2)}]_2[X]_7$ <Formula 3>

$[A]_4[B^1{}_{n2}B^2{}_{(1-n2)}]_3[X]_{10}.$ <Formula 4>

In Formula 1,

A may be at least one monovalent organic-cation, a monovalent inorganic cation, or any combination thereof, $B^1$ may be a $Sm^{2+}$ ion, $B^2$ may be at least one divalent inorganic cation, and $B^2$ may not include a $Sm^{2+}$ ion, n1 may be a real number satisfying $0<n1\leq 1$, n2 may be a real number satisfying $0<n2\leq 1$, and X may be at least one monovalent anion.

The perovskite compound is the same as described above.

The description of the organic light-emitting device may be understood by referring to the others of the description of the light-emitting device, except for the description of the quantum dot light-emitting diode.

In one embodiment, the electronic apparatus may be an organic light-emitting display apparatus.

FIG. 2 is a schematic cross-sectional view of an organic light-emitting display apparatus according to an embodiment. FIGS. 3 to 6 are schematic partial enlarged cross-sectional views of organic light-emitting display apparatuses according to embodiments.

Referring to FIG. 2, the organic light-emitting display apparatus 100 according to the embodiment includes a first substrate 110. The first substrate 110 may be a glass substrate or a plastic substrate, each having excellent mechanical strength, thermal stability, transparency, surface smoothness, ease of handling, and water resistance. In one embodiment, since the organic light-emitting display apparatus 100 is a top-emission type display apparatus, the first substrate 110 may include iron, chromium, manganese, nickel, titanium, molybdenum, stainless steel, an Invar alloy, an Inconel alloy, a Kovar alloy, or any combination thereof, but embodiments of the present disclosure are not limited thereto.

An organic light-emitting device 120 may be disposed on the first substrate 110. The organic light-emitting device 120 may include: a first electrode; a second electrode facing the first electrode; and an organic layer between the first electrode and the second electrode and including an emission layer. The description of the first electrode, the second electrode, the emission layer, and the organic layer of the organic light-emitting device 120 may be understood by referring to the description of the light-emitting device 10.

For example, the first electrode may be an anode, and the material for forming the first electrode may be selected from materials with a high work function to facilitate hole injection. In addition, the first electrode may be a reflective electrode, and the first electrode may include a material selected from magnesium (Mg), silver (Ag), aluminum (Al), aluminum-lithium (Al—Li), calcium (Ca), magnesium-indium (Mg—In), magnesium-silver (Mg—Ag), and any combination thereof, but embodiments of the present disclosure are not limited thereto.

In one embodiment, the first electrode may include a transparent electrode material such as indium tin oxide (ITO) or indium zinc oxide (IZO).

In one or more embodiments, the first electrode may include a reflective electrode material, such as magnesium (Mg), silver (Ag), aluminum (Al), aluminum-lithium (Al—Li), calcium (Ca), magnesium-indium (Mg—In), magnesium-silver (Mg—Ag), and any combination thereof, and may further include a transparent electrode material such as ITO or IZO.

In one embodiment, the first electrode may have a single-layered structure or a multi-layered structure including a transmissive layer and a reflective layer. For example, the first electrode may have a multi-layered structure of ITO/Ag/ITO.

In addition, the first electrode may further include an inclined surface having a predetermined angle with respect to the first substrate 110 around the first electrode, so that light emitted from the organic layer in the horizontal direction of the organic light-emitting display apparatus illustrated in FIG. 2 travels toward the thin film 130. The inclined surface of the first electrode may be disposed on a pixel defining film. In this case, light emitted from the organic layer may be reflected from the inclined surface of the first electrode and travels toward the thin film 130, thereby improving light efficiency of the organic light-emitting display apparatus.

For example, the organic layer may further include a hole transport region between the first electrode and the emission layer and an electron transport region between the emission layer and the second electrode.

For example, the second electrode may be a cathode, and a material for forming the second electrode may be selected from a metal, an alloy, an electrical conductive compound, and any combination thereof, which have a low work function. In addition, the second electrode may be a transmissive electrode or a semi-transmissive electrode, and a material for forming the second electrode may be selected from ITO, IZO, tin oxide ($SnO_2$), zinc oxide (ZnO), magnesium (Mg), silver (Ag), aluminum (Al), aluminum-lithium (Al—Li), calcium (Ca), magnesium-indium (Mg—In), magnesium-silver (Mg—Ag), and any combination thereof.

A thin film 130 may be disposed on the organic light-emitting device 120 on at least one traveling direction of light emitted from the organic light-emitting device 120, and the thin film may include the perovskite compound.

The description of the thin film 130 comprising a perovskite compound is the same as described herein.

That the thin film 130 is disposed on at least one traveling direction of the light emitted from the organic light-emitting device 120 does not exclude a case where other elements are further included between the thin film 130 and the organic light-emitting device 120.

A barrier film (not illustrated) may be further included on at least one surface of the thin film 130 so as to prevent contact with oxygen or moisture. Since the light conversion layer includes the barrier film, the perovskite compound that is vulnerable to oxygen and/or moisture may be maintained in a stable state.

For example, the barrier film may be formed on a light incidence surface of the thin film 130 (that is, a surface which absorbs light emitted from the organic light-emitting device 120) and/or a light exit surface of the thin film 130 (that is, a surface from which light exits from the organic light-emitting device 120). In one embodiment, the barrier film may surround the entire thin film 130.

The barrier film may include, for example, polyester, polycarbonate, polyolefin, cyclic olefin copolymer (COC), or polyimide, but embodiments of the present disclosure are not limited thereto.

The barrier film may further include a single-layered or multi-layered inorganic coating layer on the surface thereof. An inorganic material in the inorganic coating layer may include an inorganic oxide, for example, silica, alumina, titania, zirconia, or any combination thereof. Since the inorganic coating layer suppresses penetration of oxygen or moisture, the oxygen and/or moisture blocking function of the barrier film may be further reinforced by the inorganic coating layer.

Figure 3:
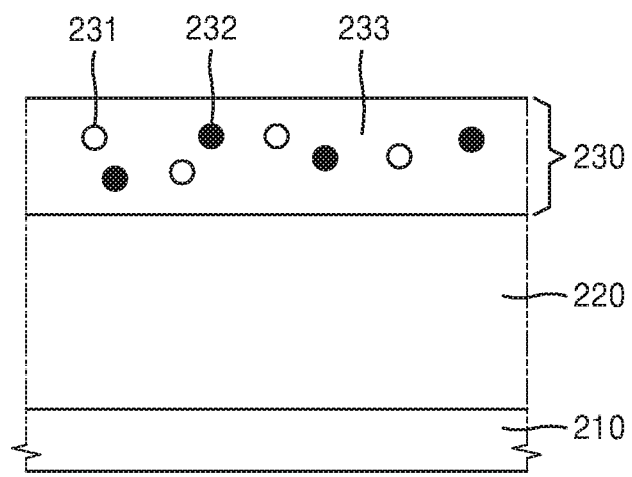
FIGS. 3 to 6 are schematic partial enlarged cross-sectional views of organic light-emitting display apparatuses according to embodiments.

Referring to FIG. 3, an organic light-emitting device 220 may emit first light, and a thin film 230 may absorb the first light and emit second light. The first light and the second light may have different maximum emission wavelengths.

For example, the maximum emission wavelength of the first light may be less than the maximum emission wavelength of the second light.

In one embodiment, the first light and the second light may be combined to emit white light.

The first light may be blue light, and the second light may be at least one selected from green light, yellow light, and red light, but embodiments of the present disclosure are not limited thereto. For example, the first light may be blue light, and the second light may be yellow light or mixed light of green light and red light, but embodiments of the present disclosure are not limited thereto.

The first light may be ultraviolet (UV) light, the second light may be at least one selected from blue light, green light, and red light, but embodiments of the present disclosure are not limited thereto. For example, the first light may be UV light, and the second light may be mixed light of blue light (for example, light having a wavelength band between about 400 nm to about 490 nm), green light (for example, light having a wavelength band between about 490 nm to about 570 nm), and red light (for example, light having a wavelength band between about 570 nm to about 680 nm), but embodiments of the present disclosure are not limited thereto.

In one embodiment, the organic light-emitting device may emit blue light or UV light.

For example, (i) the organic light-emitting device may emit blue light, and the thin film may include:

a first perovskite compound that absorbs the blue light and emits green light; and a second perovskite compound that absorbs the blue light and/or the green light and emits red light, or (ii) the organic light-emitting device may emit UV light, and the thin film may include:

a first perovskite compound that absorbs the UV light and emits blue light;

a second perovskite compound that absorbs the UV light and/or the blue light and emits green light; and a third perovskite compound that absorbs the UV light, the blue light, and/or the green light and emits red light.

For example, the thin film 230 may include a first perovskite compound 231 represented by one of Formulae 1 to 4 and a second perovskite compound 232 represented by one of Formulae 1 to 4. The maximum emission wavelengths of the first and second perovskite compounds may be different by differently adjusting the average grain sizes of the first and second perovskite compounds.

The thin film 230 may be a monolayer film in which the first and second perovskite compounds are uniformly dispersed. The thin film 230 may further include a binder resin 233 in which the first and second perovskite compounds are uniformly dispersed. A mixing ratio of the first and second perovskite compounds is not particularly limited and may be controlled in an appropriate range by taking into account desired optical characteristics.

The binder resin 233 may include, for example, an epoxy resin, a silicone epoxy resin, a silicone resin, a polystyrene resin, a (meth)acrylate resin, or any combination thereof, but embodiments of the present disclosure are not limited thereto.

When the first light is blue light, the first perovskite compound 231 may emit red light, and the second perovskite compound 232 may emit green light. In this case, the average grain size of the first perovskite compound may be greater than the average grain size of the second perovskite compound and may be, for example, about 7 nm to about 10 nm. The average grain size of the second perovskite compound may be, for example, about 5 nm to about 7 nm.

As described above, the average grain size of the perovskite compound may be different according to the type of the monovalent anion used as X. For example, when the monovalent halide anion is used as X, the energy bandgap may be adjusted and the light-emitting characteristics may be changed by changing the halide anion to $I^-$, $Br^-$, $Cl^-$, or the like.

The first light, the red light emitted from the first perovskite compound, and the green light emitted from the second perovskite compound may be combined to emit white light.

In one embodiment, the organic light-emitting device may emit blue light, and the thin film may include:

a first layer including a first perovskite compound that absorbs blue light and emit green light; and a second layer including a second perovskite compound that absorbs blue light and/or the green light and emits red light.

Figure 4:
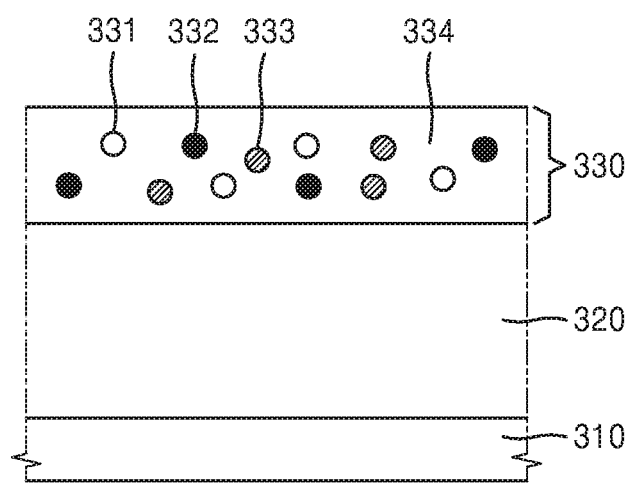

In one embodiment, referring to FIG. 4, a thin film 330 may include a first perovskite compound 331 represented by one of Formulae 1 to 4, a second perovskite compound 332 represented by one of Formulae 1 to 4, and a third perovskite compound 333 represented by one of Formulae 1 to 4. The maximum emission wavelengths emitted by the first, second, and third perovskite compounds may be different by differently adjusting the average grain sizes of the first, second, and third perovskite compounds. The thin film 330 may be a monolayer film in which the first, second, and third perovskite compounds are uniformly dispersed. The thin film 330 may further include a binder resin 334 in which the first, second, and third perovskite compounds are uniformly dispersed. A mixing ratio of the first, second, and third perovskite compounds is not particularly limited and may be controlled in an appropriate range by taking into account desired optical characteristics.

When the first light is UV light, the first perovskite compound 331 may emit red light, the second perovskite compound 332 may emit green light, and the third perovskite compound 333 may emit blue light. In this case, the average grain size of the first perovskite compound may be greater than the average grain size of the second perovskite compound and may be, for example, about 7 nm to about 10 nm. The average grain size of the second perovskite compound may be greater than the average grain size of the third perovskite compound and may be, for example, about 5 nm to about 7 nm. The average grain size of the third perovskite compound may be, for example, about 2 nm to about 5 nm. The first light, the red light emitted from the first perovskite compound, the green light emitted from the second perovskite compound, and the blue light emitted from the third perovskite compound may be combined to emit white light.

Figure 5:
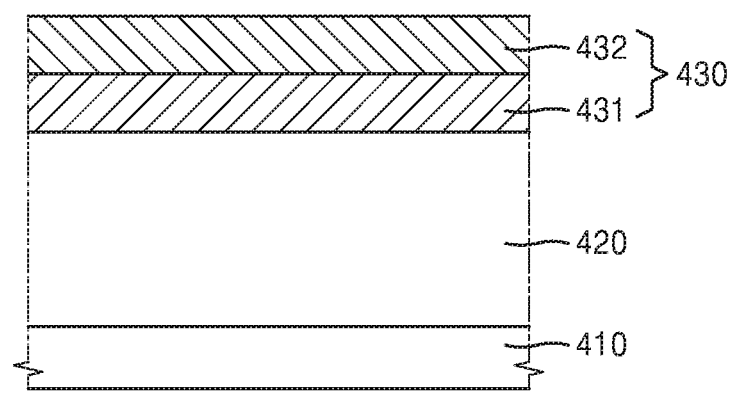

Referring to FIG. 5, a thin film 430 may include a first thin film 431 and a second thin film 432. An organic light-emitting device 420 may emit first light. The first thin film may absorb the first light and emit second light. The second thin film may absorb the first light and/or the second light and emit third light. The first light, the second light, and the third light may have different maximum emission wavelengths.

For example, the maximum emission wavelength of the first light may be less than the maximum emission wavelength of the second light and the maximum emission wavelength of the third light. In addition, the maximum emission wavelength of the second light may be less than the maximum emission wavelength of the third light.

In one embodiment, the first light, the second light, and the third light may be combined to emit white light.

The first light may be blue light, and the second light and the third light may each independently be at least one selected from green light and red light, but embodiments of the present disclosure are not limited thereto. For example, the first light may be blue light, the second light may be green light, and the third light may be red light.

The first light may be UV light, and the second light and the third light may each independently be at least one selected from blue light, cyan light, green light, yellow light, red light, and magenta light, but embodiments of the present disclosure are not limited thereto. For example, the first light may be UV light, the second light may be cyan light, and the third light may be red light. In one embodiment, the first light may be UV light, the second light may be green light, and the third light may be magenta light. In one embodiment, the first light may be UV light, the second light may be blue light, and the third light may be yellow light.

The first thin film 431 may include a first perovskite compound represented by one of Formulae 1 to 4, and the second thin film 432 may include a second perovskite compound represented by one of Formulae 1 to 4, but embodiments of the present disclosure are not limited thereto.

For example, the first light may be blue light, the first perovskite compound may emit green light, and the second perovskite compound may emit red light, but embodiments of the present disclosure are not limited thereto.

Figure 6:
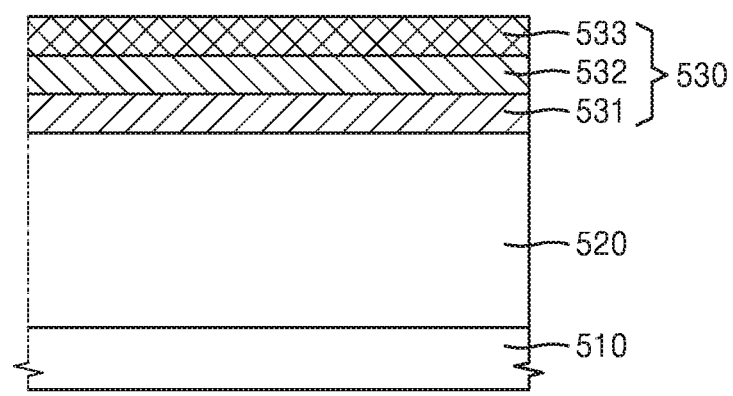

Referring to FIG. 6, a thin film 530 may include a first thin film 531, a second thin film 532, and a third thin film 533. An organic light-emitting device 520 may emit first light. The first thin film 531 may absorb the first light and emit second light. The second thin film 532 may absorb the first light and/or the second light and emit third light. The third thin film 533 may absorb the first light, the second light, and/or the third light and emit fourth light. The first light, the second light, the third light, and the fourth light may have different maximum emission wavelengths.

For example, the maximum emission wavelength of the first light may be less than the maximum emission wavelength of the second light, the maximum emission wavelength of the third light, and the maximum emission wavelength of the fourth light, but embodiments of the present disclosure are not limited thereto. In addition, the maximum emission wavelength of the second light may be less than the maximum emission wavelength of the third light and the maximum emission wavelength of the fourth light, but embodiments of the present disclosure are not limited thereto. In addition, the maximum emission wavelength of the third light may be less than the maximum emission wavelength of the fourth light, but embodiments of the present disclosure are not limited thereto.

In one embodiment, the first light, the second light, the third light, and the fourth light may be combined to emit white light.

The first light may be blue light, and the second light, the third light, and the fourth light may each independently be at least one selected from green light and red light, but embodiments of the present disclosure are not limited thereto.

The first light may be UV light, and the second light, the third light, and the fourth light may each independently be at least one selected from blue light, green light, and red light, but embodiments of the present disclosure are not limited thereto. For example, the first light may be UV light, the second light may be blue light, the third light may be green light, and the fourth light may be red light.

The first thin film 531 may include a first perovskite compound represented by one of Formulae 1 to 4, the second thin film 532 may include a second perovskite compound represented by one of Formulae 1 to 4, and the third thin film 533 may include a third perovskite compound represented by one of Formulae 1 to 4, but embodiments of the present disclosure are not limited thereto.

For example, the first light may be UV light, the first perovskite compound may emit blue light, the second perovskite compound may emit green light, and the third perovskite compound may emit red light, but embodiments of the present disclosure are not limited thereto.

The above description has been provided for the top-emission type light-emitting device and may be provided for a bottom-emission type light-emitting device. In this case, as opposed to the top-emission type light-emitting device, a first electrode may be a semi-transmissive electrode or a transparent electrode, and a second electrode may be a reflective electrode. In this case, a thin film including the perovskite compound represented by one of Formulae 1 to 4 may be disposed on a substrate.

Figure 7:
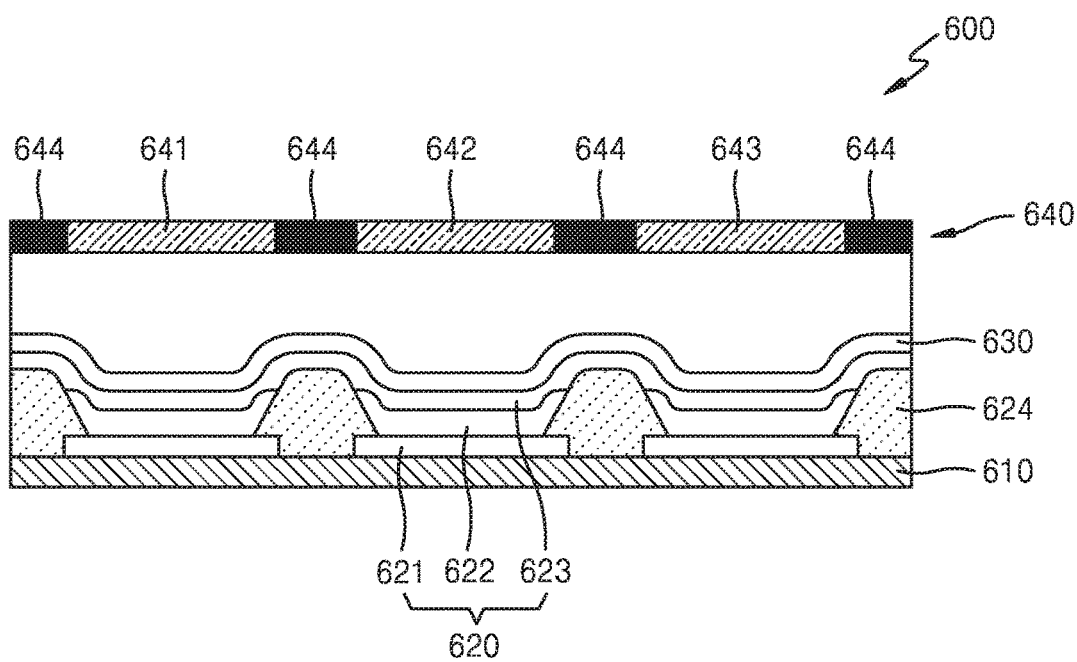
FIG. 7 is a schematic cross-sectional view of an organic light-emitting display apparatus according to an embodiment.

FIG. 7 is a schematic cross-sectional view of an organic light-emitting display apparatus 600 according to an embodiment.

Referring to FIG. 7, a color filter 640 may be disposed on at least one traveling direction of light emitted from a thin film 630.

A first substrate 610 may include a plurality of sub-pixel regions, and the color filter 640 may include a plurality of color filter regions respectively corresponding to the plurality of sub-pixel regions.

A pixel defining film 624 may be formed between the sub-pixel regions to define the sub-pixel regions.

The color filter 640 may include light blocking patterns 644 between the color filter regions.

The color filter regions may include a first color filter region 641 emitting first color light, a second color filter region 642 emitting second color light, and a third color filter region 643 emitting third color light. The first color light, the second color light, and the third color light may be different from one another. For example, the first color light may be red light, the second color light may be green light, and the third color light may be blue light, but embodiments of the present disclosure are not limited thereto.

The organic light-emitting display apparatuses illustrated in FIGS. 2 to 7 are an example of the electronic apparatus, and the electronic apparatus may have various known forms. To this end, various known configurations may be further included.

Hereinafter, a lighting apparatus according to an embodiment will be described.

The lighting apparatus includes: a light source; and a light conversion layer that absorbs at least part of light emitted from the light source and emits light having a wavelength band different from that of the absorbed light, wherein the light conversion layer includes the perovskite compound.

The perovskite compound is the same as described above.

The perovskite compound may absorb at least part of light emitted from the light source. In this case, the type of the light source is not particularly limited. For example, the light source may receive an external voltage and emit light. In one embodiment, the light source may be a fluorescent lamp, a light emitting diode (LED), an organic light emitting diode (OLED), a quantum dot light emitting diode (QLED), or any combination thereof. The fluorescent lamp may include, for example, a cold cathode fluorescent lamp (CCFL) and/or an external electrode fluorescent lamp (EEFL), but embodiments of the present disclosure are not limited thereto.

The light source may emit blue light (for example, light having a wavelength band between about 420 nm to about 490 nm) or UV light (for example, light having a wavelength band between about 300 nm to about 420 nm). For example, the light source may be a blue LED that emits blue light or a UV LED that emits UV light, but embodiments of the present disclosure are not limited thereto.

In one embodiment, the light source may emit blue light, and the light conversion layer may include a perovskite compound that absorbs blue light emitted from the light source and emits light having a wavelength band different from that of the blue light.

For example, the light source may emit blue light, and the light conversion layer may include a perovskite compound that absorbs the blue light and emits yellow light (for example, light having a wavelength band between about 540 nm to about 620 nm). In this case, the blue light emitted from the light source and the yellow light emitted from the perovskite compound may be combined to emit white light.

The light conversion layer may be thin film including the perovskite compound. For example, the light conversion layer may be understood by referring to the description of the thin film provided herein.

In one embodiment, the light conversion layer may be a thin film in which the perovskite compound that emits the yellow light is stacked in a monocrystal form.

In one or more embodiments, the light conversion layer may be a thin film including the perovskite compound emitting the yellow light and having a nanostructure of less than about 500 nm. The nanostructure may be a particle form, for example, nanoparticles, nanorods, nanowires, nanotubes, branched nanostructures, nanotetrapods, nanotripods, or nanobipods. The nanostructure may be surrounded by, for example, at least one ligand or matrix resin. The ligand or matrix resin may improve the stability of the perovskite nanostructure and may protect the perovskite nanostructure from harmful external conditions including high temperature, high strength, external gas or moisture, or the like. The ligand may be, for example, a molecule having an amine group (oleylamine, triethylamine, hexylamine, naphtylamine, or the like) or polymer, a molecule having a carboxyl group (oleic acid or the like) or polymer, a molecule having a thiol group (butanethiol, hexanethiol, dodecanethiol, or the like) or polymer, a molecule having a pyridine group (pyridine or the like) or polymer, a molecule having a phosphine group (triphenylphosphine or the like), a molecule having a phosphine oxide group (trioctylphosphine oxide or the like), a molecule having a carbonyl group (alkyl ketone or the like), a molecule having a benzene ring (benzene, styrene, or the like) or polymer, or a molecule having a hydroxy group (butanol, hexanol, or the like) or polymer. The matrix resin may include, for example, an epoxy resin, a silicone epoxy resin, a silicone resin, a polystyrene resin, a (meth)acrylate resin, or any combination thereof, but embodiments of the present disclosure are not limited thereto.

In one embodiment, the light source may emit blue light, and the light conversion layer may include a first perovskite compound that absorbs the blue light and emits green light (for example, light having a wavelength band between about 490 nm to about 570 nm) and a second perovskite compound that absorbs the blue light and/or the green light and emits red light (for example, light having a wavelength band between about 570 nm to about 680 nm). In this case, the blue light emitted from the light source, the green light emitted from the first perovskite compound, and the red light emitted from the second perovskite compound may be combined to emit white light.

In one embodiment, the light source may emit blue light, and the light conversion layer may include a monofilm in which the first perovskite compound that emits the green light and the second perovskite compound that emits the red light are uniformly dispersed. In this case, both the first perovskite compound and the second perovskite compound may have a nanostructure form.

In one or more embodiments, the light source may emit blue light, and the light conversion layer may include: a first layer including a first perovskite compound that absorbs the blue light and emits green light; and a second layer including a second perovskite compound that absorbs the blue light and/or the green light and emits red light. In this case, the first layer may be disposed so that at least part of light emitted from the light source is incident on the first layer, and the second layer may be disposed so that light emitted from the light source and passing through the first layer and/or light emitted from the first layer is incident on the second layer. The first layer and the second layer may each independently be a thin film in which the perovskite compound is stacked in a monocrystal form, or a thin film including the perovskite compound in a nanostructure form.

In one or more embodiments, the light source may emit UV light, and the light conversion layer may include a perovskite compound that absorbs the UV light emitted from the light source and emits light having a wavelength band different from that of the UV light.

For example, the light source may emit UV light, and the light conversion layer may include: a first perovskite compound that absorbs the UV light and emits blue light; a second perovskite compound that absorbs the UV light and/or the blue light and emits green light; and a third perovskite compound that absorbs the UV light, the blue light, and/or the green light and emits red light. In this case, the blue light emitted from the first perovskite compound, the green light emitted from the second perovskite compound, and the red light emitted from the third perovskite compound may be combined to emit white light.

In one embodiment, the light source may emit UV light, and the light conversion layer may be a monofilm in which a first perovskite compound that absorbs the UV light and emits blue light, a second perovskite compound that absorbs the UV light and/or the blue light and emits green light, and a third perovskite compound that absorbs the UV light, the blue light, and/or the green light and emits red light are uniformly dispersed. In this case, the first perovskite compound, the second perovskite compound, and the third perovskite compound may have a nanostructure form.

In one or more embodiments, the light source may emit UV light, and the light conversion layer may include: a first layer including a first perovskite compound that absorbs the UV light and emits blue light and a second perovskite compound that absorbs the UV light and/or the blue light and emits green light; and a second layer including a third perovskite compound that absorbs the UV light, the blue light, and/or the green light and emits red light. In this case, the first layer may be disposed so that at least part of light emitted from the light source is incident on the first layer, and the second layer may be disposed so that light emitted from the light and passing through the first layer and/or light emitted from the first layer is incident on the second layer. The first layer may be a thin film including the first and second perovskite compounds in the nanostructure form, and the second layer may be a thin film in which the third perovskite compound is stacked in a monocrystal form, or a thin film including the third perovskite compound in a nanostructure form.

In one embodiment, the light source may emit UV light, and the light conversion layer may include: a first layer including a first perovskite compound that absorbs the UV light and emits blue light; and a second layer including a second perovskite compound that absorbs the UV light and/or the blue light and emits green light and a third perovskite compound that absorbs the UV light, the blue light, and/or the green light and emits red light. In this case, the first layer may be disposed so that at least part of light emitted from the light source is incident on the first layer, and the second layer may be disposed so that light emitted from the light source and passing through the first layer and/or light emitted from the first layer is incident on the second layer. The first layer may be a thin film in which the first perovskite compound is stacked in a monocrystal form, or a thin film including the first perovskite compound in a nanostructure form, and the second layer may be a thin film including the second and third perovskite compounds in a nanostructure form.

In one or more embodiments, the light source may emit UV light, and the light conversion layer may include: a first layer including a first perovskite compound that absorbs the UV light and emits blue light; a second layer including a second perovskite compound that absorbs the UV light and/or the blue light and emits green light; and a third layer including a third perovskite compound that absorbs the UV light, the blue light, and/or the green light and emits red light. In this case, the first layer may be disposed so that at least part of light emitted from the light source is incident on the first layer, the second layer may be disposed so that light emitted from the light source and passing through the first layer and/or light emitted from the first layer are incident on the second layer, and the third layer may be disposed so that light emitted from the light source and passing through the first layer and the second layer, light emitted from the first layer and passing through the second layer, and/or light emitted from the second layer are incident on the third layer. The first layer, the second layer, and the third layer may each independently be a thin film in which the perovskite compound is stacked in a monocrystal form, or a thin film including the perovskite compound in a nonastructure form.

The thicknesses of the layers included in the light conversion layers, the mixing ratios of the perovskite compounds when the light conversion layer includes at least two perovskite compounds, and the like are not particularly limited and may be set in appropriate ranges by taking into account desired optical characteristics.

The layer(s) including the perovskite compound included in the light conversion layer may be synthesized according to a known synthesis method. For example, the layer(s) including the perovskite compound may be synthesized by referring to the synthesis method of the thin film including the perovskite compound.

In one embodiment, the layer(s) including the perovskite compound included in the light conversion layer may be manufactured by providing a mixture including a perovskite compound, which is mixed on a matrix resin, on a predetermined substrate and performing drying or thermal treatment thereon. Various modifications may be made thereto.

In one embodiment, a barrier film may be further included on at least one surface of the light conversion layer so as to prevent contact with oxygen or moisture. Since the light conversion layer includes the barrier film, the perovskite compound may be maintained in a stable state.

For example, the barrier film may be formed on a light incidence surface of the light conversion layer (that is, a surface which absorbs light emitted from the light source) and/or a light exit surface of the light conversion layer (that is, a surface from which light exits from the light conversion layer). In one embodiment, the barrier film may surround the entire light conversion layer.

The barrier film may include, for example, polyester, polycarbonate, polyolefin, cyclic olefin copolymer (COC), or polyimide.

The barrier film may further include a single-layered or multi-layered inorganic coating layer on the surface thereof. An inorganic material in the inorganic coating layer may include an inorganic oxide, for example, silica, alumina, titania, zirconia, or any combination thereof. Since the inorganic coating layer suppresses penetration of oxygen or moisture, the oxygen and/or moisture blocking function of the barrier film may be further reinforced by the inorganic coating layer.

The light conversion layer is disposed so that at least part of light emitted from the light source is incident on the light conversion layer.

That the light conversion layer is disposed so that light emitted from the light source is incident on the light conversion layer does not exclude a case where other means is further included between the light source and the light conversion layer. Therefore, other means may be further included between the light source and the light conversion layer.

For example, the light source may directly contact the light conversion layer. Therefore, light emitted from the light source may be directly incident on the light conversion layer.

In one embodiment, the light source may be separated from the light conversion layer. For example, the light source may be separated from the light conversion layer, and other means may be included between the light source and the light conversion layer. That other means is included between the light source and the light conversion layer includes a case where the light source faces the light conversion layer and other means is disposed therebetween, and a case where other means is disposed on a traveling path of light emitted from the light source and incident on the light conversion layer.

The means may be, for example, a light guide plate that guides light, a diffusion plate that diffuses light, a predetermined optical sheet that improves optical characteristics such as luminance, a reflective film that reflects light from the light source so as to improve externally extracted optical efficiency, or any combination thereof.

The optical sheet may be, for example, a prism sheet, a micro lens sheet, a brightness enhancement sheet, or any combination thereof, but embodiments of the present disclosure are not limited thereto. Therefore, the optical sheet may include sheets having various functions.

In one embodiment, the light guide plate, the diffusion plate, the prism sheet, the micro lens sheet, the brightness enhancement sheet, the reflective film, or any combination thereof may be disposed between the light source and the light conversion layer. That the light guide plate, the diffusion plate, the prism sheet, the micro lens sheet, the brightness enhancement sheet, the reflective film, or any combination thereof is disposed between the light source and the light conversion layer means that the light guide plate, the diffusion plate, the prism sheet, the micro lens sheet, the brightness enhancement sheet, the reflective film, or any combination thereof is disposed on the traveling path of light emitted from the light source and incident on the light conversion layer.

In one or more embodiments, the light guide plate, the diffusion plate, the prism sheet, the micro lens sheet, the brightness enhancement sheet, the reflective film, or any combination thereof may be disposed on the light conversion layer.

For example, the lighting apparatus may further include the diffusion plate on the light source. In this case, the light conversion layer may be disposed between the light source and the diffusion plate, or may be disposed on the diffusion plate. The diffusion plate may be separated from the light conversion layer, or the diffusion plate may directly contact the light conversion layer.

In addition, the lighting apparatus may further include, in addition to the diffusion plate, a predetermined optical sheet. The lighting apparatus including the diffusion plate and the optical sheet may have, for example, a stacked structure of the light source/light conversion layer/diffusion layer/optical sheet, the light source/diffusion plate/light conversion layer/optical sheet, or the light source/diffusion plate/light conversion layer, but embodiments of the present disclosure are not limited thereto.

In one embodiment, the lighting apparatus may further include a light guide plate that guides light. The light guide plate may be disposed on the light source, or may be disposed on one side surface of the light source. In this case, the light conversion layer may be disposed between the light source and the light guide plate, or may be disposed on the light guide plate. The light guide plate may be separated from the light conversion layer, or the light guide plate may directly contact the light conversion layer.

In addition, the lighting apparatus may further include, in addition to the light guide plate on one surface of the light source, a diffusion plate and/or an optical sheet. For example, the diffusion plate and the optical sheet may be stacked on the light guide plate in this stated order. In this case, the light conversion layer may be disposed between the light source and the light guide plate, between the light guide plate and the diffusion plate, between the diffusion plate and the optical sheet, or on the optical sheet.

In one embodiment, the lighting apparatus may further include a reflective film that reflects light. The reflective film may be disposed between the light source and the light conversion layer, or may be disposed on the light conversion layer. The reflective film may be separated from the light conversion layer, or the reflective film may directly contact the light conversion layer.

In addition, the lighting apparatus may include a light conversion layer, a light guide plate, and a reflective film. In this case, the light guide plate may be disposed between the light conversion layer and the reflective film, but embodiments of the present disclosure are not limited thereto.

Figure 8:
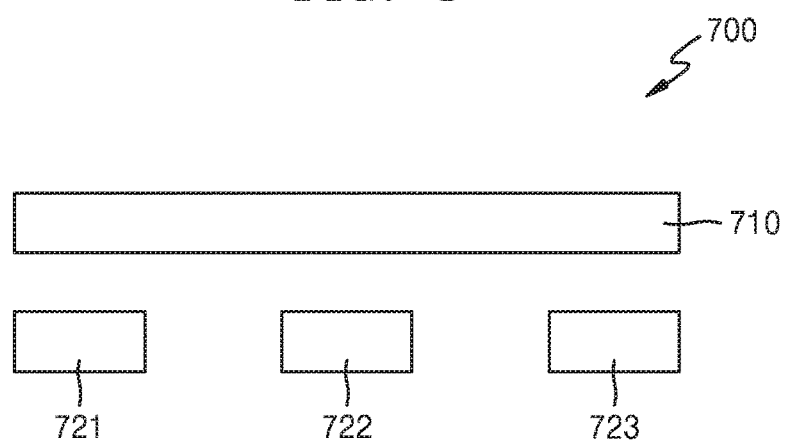
FIGS. 8 and 9 are schematic views of lighting apparatuses according to embodiments.
Figure 9:
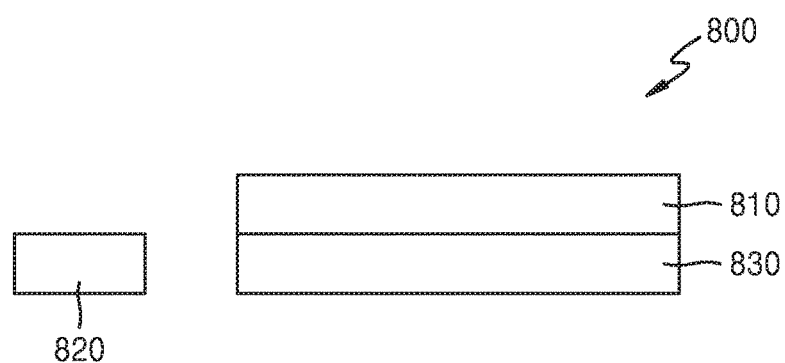

FIGS. 8 and 9 are schematic views of lighting apparatuses 700 and 800 according to embodiments.

As illustrated in FIGS. 8 and 9, light sources 721, 722, 723, and 820 and light conversion layers 710 and 810 in the lighting apparatuses are disposed so that light emitted from the light sources 721, 722, 723, and 820 is incident on the light conversion layers 710 and 810.

In FIG. 8, the light sources 721, 722, and 723 may be disposed below the light conversion layer 710, so that light emitted upward from the light sources 721, 722, and 723 is incident on the light conversion layer 710.

In FIG. 9, the light source 820 is disposed on the side of the light conversion layer 810. In this case, like the light guide plate 830 that guides light, other means may be included so that light emitted from the light source 820 is more efficiently incident on the light conversion layer 810.

The lighting apparatuses illustrated in FIGS. 8 and 9 are merely an example, and the lighting apparatuses may have various known forms. To this end, various known configurations may be further included.

The above-described lighting apparatuses may be used for various purposes. For example, the lighting apparatuses may be used as backlight units of liquid crystal displays (LCDs). In addition, the lighting apparatuses may be used indoor or outdoor lighting, stage lighting, decorative lighting, and the like. The applications of the lighting apparatuses are not limited thereto.

Hereinafter, thin films and electronic apparatuses according embodiments will be described in more detail.

EXAMPLES

Examples 1 to 36 and Comparative Examples 1 to 4

Films of Examples 1 to 36 and Comparative Examples 1 to 4 were manufactured by perovskite compounds shown in Table 1 on a glass substrate to a thickness of 40 nm.

Evaluation Example 1: Evaluation of PLQY and FWHM in Films

The PLQY and FWHM of the films manufactured according to Examples 1 to 36 and Comparative Examples 1 to 4 were evaluated, and results thereof are shown in Table 1. The PLQY of each film was evaluated by using a Hamamatsu Photonics absolute PL quantum yield measurement system including a xenon light source, a monochromator, a photonic multichannel analyzer, and an integrating sphere and employing PLQY measurement software (Hamamatsu Photonics, Ltd., Shizuoka, Japan), and the FWHM each film was evaluated by analyzing a PL spectrum by using ISC PC1 Spectrofluorometer.

TABLE 1

| | Perovskite compound | PLQY(%) | FWHM (nm) |
|---|---|---|---|
| Example 1 | $CsSmI_3$ | 67 | 38 |
| Example 2 | $Cs(Sm_{0.05}Eu_{0.95})I_3$ | 78 | 32 |
| Example 3 | $Cs(Sm_{0.05}Bi_{0.95})I_3$ | 72 | 35 |
| Example 4 | $Cs(Sm_{0.05}Ag_{0.95})I_3$ | 75 | 32 |
| Example 5 | $Cs(Sm_{0.05}Sn_{0.95})I_3$ | 77 | 31 |
| Example 6 | $Cs(Sm_{0.05}Mn_{0.95})I_3$ | 68 | 36 |
| Example 7 | $Cs(Sm_{0.25}Eu_{0.75})I_3$ | 67 | 32 |
| Example 8 | $Cs(Sm_{0.25}Bi_{0.75})I_3$ | 58 | 34 |
| Example 9 | $Cs(Sm_{0.25}Ag_{0.75})I_3$ | 71 | 35 |
| Example 10 | $Cs(Sm_{0.25}Sn_{0.75})I_3$ | 63 | 32 |
| Example 11 | $Cs(Sm_{0.25}Mn_{0.75})I_3$ | 52 | 34 |
| Comparative Example 1 | $(CH_3NH_3)EuI_3$ | 31 | 21 |
| Example 12 | $CsSmBrI_2$ | 78 | 30 |
| Comparative Example 2 | $CsPbBrI_2$ | 70 | 35 |
| Example 13 | $CsSmBr_2I$ | 90 | 20 |
| Example 14 | $CsSmBr_3$ | 98 | 19 |
| Comparative Example 3 | $CsPbBr_3$ | 95 | 20 |
| Example 15 | $CsSmBr_{1.5}I_{1.5}$ | 55 | 15 |
| Comparative Example 4 | $CsPbBr_{1.5}I_{1.5}$ | 37 | 16 |
| Example 16 | $Cs(Sm_{0.05}Eu_{0.95})Br_3$ | 80 | 31 |
| Example 17 | $Cs(Sm_{0.05}Bi_{0.95})Br_3$ | 75 | 34 |
| Example 18 | $Cs(Sm_{0.05}Ag_{0.95})Br_3$ | 74 | 34 |
| Example 19 | $Cs(Sm_{0.05}Sn_{0.95})Br_3$ | 83 | 36 |
| Example 20 | $Cs(Sm_{0.05}Mn_{0.95})Br_3$ | 69 | 35 |
| Example 21 | $Cs(Sm_{0.25}Eu_{0.75})Br_3$ | 78 | 35 |
| Example 22 | $Cs(Sm_{0.25}Bi_{0.75})Br_3$ | 61 | 32 |
| Example 23 | $Cs(Sm_{0.25}Ag_{0.75})Br_3$ | 71 | 32 |
| Example 24 | $Cs(Sm_{0.25}Sn_{0.75})Br_3$ | 72 | 32 |
| Example 25 | $Cs(Sm_{0.25}Mn_{0.75})Br_3$ | 59 | 35 |
| Example 26 | $CsSmBr_2Cl$ | 75 | 20 |
| Example 27 | $Cs(Sm_{0.05}Eu_{0.95})Cl_3$ | 54 | 32 |
| Example 28 | $Cs(Sm_{0.05}Bi_{0.95})Cl_3$ | 48 | 34 |
| Example 29 | $Cs(Sm_{0.05}Ag_{0.95})Cl_3$ | 41 | 35 |
| Example 30 | $Cs(Sm_{0.05}Sn_{0.95})Cl_3$ | 58 | 35 |
| Example 31 | $Cs(Sm_{0.05}Mn_{0.95})Cl_3$ | 39 | 32 |
| Example 32 | $Cs(Sm_{0.25}Eu_{0.75})Cl_3$ | 41 | 36 |
| Example 33 | $Cs(Sm_{0.25}Bi_{0.75})Cl_3$ | 39 | 33 |
| Example 34 | $Cs(Sm_{0.25}Ag_{0.75})Cl_3$ | 32 | 34 |
| Example 35 | $Cs(Sm_{0.25}Sn_{0.75})Cl_3$ | 47 | 34 |
| Example 36 | $Cs(Sm_{0.25}Mn_{0.75})Cl_3$ | 29 | 36 |

It is confirmed from Table 1 that the films of Examples 1 to 36 show PLQY and FWHM suitable for use in organic light-emitting devices. In particular, in the condition that the compositions of a metal and halogen X are the same, the film using the perovskite compound including Sm showed high PLQY and small FWHM, as compared with the film using the perovskite compound including Pb.

Example 41

As a substrate and an anode, a glass substrate, in which a Corning 15 $\Omega/cm^2$ (100 nm) ITO was formed, was cut to a size of 50 mm×50 mm×0.5 mm, sonicated with acetone, isopropyl alcohol, and pure water each for 15 minutes, and then cleaned by exposure to ultraviolet rays and ozone for 30 minutes. Then, the glass substrate was provided to a vacuum deposition apparatus.

CuI was deposited on the ITO anode to form a hole transport layer having a thickness of 80 nm, thereby forming a hole transport region.

An emission layer including $CsSmI_3$ and having a thickness of 40 nm was formed on the hole transport region.

TPBi was deposited on the emission layer to form an electron transport layer having a thickness of 50 nm, and RbI and Yb were co-deposited on the electron transport layer at a volume ratio of 1:1 to form an electron injection layer having a thickness of 1.5 nm, thereby forming an electron transport region.

Ag and Mg were co-deposited on the electron transport region at a volume ratio of 9:1 to form a cathode having a thickness of 10 nm, thereby completing the manufacture of a light-emitting device having a structure of ITO (100 nm)/CuI (80 nm)/$CsSmI_3$ (40 nm)/TPBi (50 nm)/RbI:Yb (1.5 nm)/AgMg (Mg 10 vol %, 10 nm).

Examples 42 to 49 and Comparative Examples 41 and 42

Light-emitting devices were manufactured in the same manner as in Example 41, except that Compounds shown in Table 2 were each used instead of $CsSmI_3$ in forming an emission layer.

Evaluation Example 2: Evaluation of Current Efficiency of Organic Light-Emitting Device The driving voltage (at 5 $mA/cm^2$), external quantum efficiency, and current efficiency of the organic light-emitting devices manufactured according to Examples 41 to 49 and Comparative Examples 41 and 42 were measured by using Keithley MU 236 and a luminance meter PR650, and results thereof are shown in Table 2.

TABLE 2

| | Emission layer | Current efficiency (cd/A) |
|---|---|---|
| Example 41 | $CsSmI_3$ | 0.82 |
| Example 42 | $CsSmBrI_2$ | 1.01 |
| Example 43 | $CsSmBr_2I$ | 1.80 |
| Example 44 | $CsSmBr_3$ | 1.10 |
| Example 45 | $CsSmBr_2Cl$ | 1.03 |
| Example 46 | $CsSmBr_{1.5}I_{1.5}$ | 0.8 |
| Example 47 | $Cs(Sm_{0.05}Eu_{0.95})I_3$ | 0.8 |
| Example 48 | $Cs(Sm_{0.05}Bi_{0.95})Cl_3$ | 0.7 |
| Example 49 | $Cs(Sm_{0.05}Ag_{0.95})Cl_3$ | 0.9 |
| Comparative Example 41 | $CsPbBrI_2$ | 0.21 |
| Comparative Example 42 | $CsPbBr_3$ | 0.51 |

It is confirmed from Table 2 that the organic light-emitting devices of Examples 41 to 49 have significantly higher current efficiency, as compared with the organic light-emitting devices of Comparative Examples 41 and 42.

Example 51

A light conversion layer was formed by forming a first layer including $CsSmBrI_2$ and having a thickness of 40 nm on a glass substrate and forming a second layer including CsSmBr$_3$ and having a thickness of 40 nm on the first layer.

Comparative Example 51

A solution including InP/ZnS ($\lambda_{em}$=530 nm) quantum dots was spin-coated on a glass substrate at a speed of 3,000 rpm for 20 seconds to form a first layer having a thickness of 40 nm, and a solution including InP/ZnS ($\lambda_{em}$=650 nm) quantum dots was spin-coated on the first layer at a speed of 3,000 rpm to 4,000 rpm for 30 seconds to form a second layer having a thickness of 40 nm, thereby forming a light conversion layer.

Evaluation Example 3: Evaluation of Color Reproducibility of Lighting Apparatus

With respect to the light conversion layers manufactured according to Example 51 and Comparative Example 51, and Comparative Example 52 in which the light conversion layer was not formed, the color reproducibility of each lighting apparatus was evaluated by using a blue LCD as a light source and using the NTSC 1931 standard, and results thereof are shown in Table 3.

In addition, with respect to the light conversion layers manufactured according to Example 51 and Comparative Example 51, and Comparative Example 52 in which the light conversion layer was not formed, the color reproducibility of each lighting apparatus was evaluated by using a blue LED as a light source and using the NTSC 1931 standard, and results thereof are shown in Table 4.

TABLE 3

| | Compound included in light conversion layer | Emission color | Color reproducibility |
|---|---|---|---|
| Comparative Example 51 | InP/ZnS | | 103% |
| Comparative Example 52 | Case where light conversion layer is not formed | | 72% |
| Example 51 | CsSmBrI$_2$/CsSmI$_3$ | | 129% |

TABLE 4

| | Compound included in light conversion layer | Emission color | Color reproducibility |
|---|---|---|---|
| Comparative Example 51 | InP/ZnS | | 110% |
| Comparative Example 52 | Case where light conversion layer is not formed | | 105% |
| Example 51 | CsSmBrI$_2$/CsSmI$_3$ | | 131% |

It is confirmed from Tables 3 and 4 that the lighting apparatus including the light conversion layer of Example 51 has excellent color reproducibility, as compared with Comparative Examples 51 and 52.

An electronic apparatus including a thin film including the perovskite compound may have high efficiency and/or a long lifespan. A lighting apparatus including a light conversion layer including the perovskite compound may have high color reproducibility.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. An electronic apparatus comprising:
a light-emitting device comprising:
a first electrode;
a second electrode facing the first electrode; and
an intermediate layer between the first electrode and the second electrode and comprising an emission layer,
wherein the emission layer comprises a perovskite compound represented by one of Formulae 1 to 4:

$$[A][B^1_{n1}B^2_{(1-n1)}][X]_3 \qquad \text{<Formula 1>}$$

$$[A]_2[B^1_{n2}B^2_{(1-n2)}][X]_4 \qquad \text{<Formula 2>}$$

$$[A]_3[B^1_{n2}B^2_{(1-n2)}]_2[X]_7 \qquad \text{<Formula 3>}$$

$$[A]_4[B^1_{n2}B^2_{(1-n2)}]_3[X]_{10}, \qquad \text{<Formula 4>}$$

wherein, in Formula 1,
A is at least one monovalent organic-cation, a monovalent inorganic cation, or any combination thereof,
B$^1$ is a Sm$^{2+}$ ion,
B$^2$ is at least one of La$^{2+}$, ce$^{2+}$, Pr$^{2+}$, Nd$^{2+}$, Pm$^{2+}$, Eu$^{2+}$, Bi$^{2+}$, Ag$^{2+}$, Mn$^{2+}$, Sn$^{2+}$, Gd$^{2+}$, Tb$^{2+}$, Dy$^{2+}$, Ho$^{2+}$, Er$^{2+}$, Yb$^{2+}$, Lu$^{2+}$, Be$^{2+}$, Mg$^{2+}$, Ca$^{2+}$, Sr$^{2+}$, Ba$^{2+}$, Ra$^{2+}$ and does not include a Sm$^{2+}$ ion,
n1 is a real number satisfying 0<n1≤1,
n2 is a real number satisfying 0<n2≤1, and
X is at least one monovalent anion.

2. The electronic apparatus of claim 1, wherein
A is (R$_1$R$_2$R$_3$C)$^+$, (R$_1$R$_2$R$_3$R$_4$N)$^+$, (R$_1$R$_2$R$_3$R$_4$P)$^+$, (R$_1$R$_2$R$_3$R$_4$As)$^+$, (R$_1$R$_2$R$_3$R$_4$Sb)$^+$, (R$_1$R$_2$N=C(R$_3$)—NR$_4$R$_5$)$^+$, a substituted or unsubstituted cycloheptatrienyl cation, a monovalent cation of a substituted or unsubstituted 5-membered nitrogen-containing ring, a monovalent cation of a substituted or unsubstituted 6-membered nitrogen-containing ring, Li$^+$, Na$^+$, K$^+$, Rb$^+$, Cs$^+$, Fr$^+$, or any combination thereof,
R$_1$ to R$_5$ are each independently selected from hydrogen, deuterium, —F, —Cl, —Br, —I, a hydroxyl group, a substituted or unsubstituted C$_1$-C$_{60}$ alkyl group, a substituted or unsubstituted C$_2$-C$_{60}$ alkenyl group, a substituted or unsubstituted C$_2$-C$_{60}$ alkynyl group, a substituted or unsubstituted C$_1$-C$_{60}$ alkoxy group, a substituted or unsubstituted C$_6$-C$_{60}$ aryl group, and —N(Q$_1$)(Q$_2$),
at least one substituent of the substituted cycloheptatrienyl cation, the monovalent cation of the substituted 5-membered nitrogen-containing ring, and the monovalent cation of the substituted 6-membered nitrogen-containing ring are each independently selected from deuterium —F, —Cl, —Br, —I, a hydroxyl group, a substituted or unsubstituted C$_1$-C$_{60}$ alkyl group, a substituted or unsubstituted C$_2$-C$_{60}$ alkenyl group, a substituted or unsubstituted C$_2$-C$_{60}$ alkynyl group, a substituted or unsubstituted C$_1$-C$_{60}$ alkoxy group, a substituted or unsubstituted C$_6$-C$_{60}$ aryl group, and —N(Q$_3$)(Q$_4$), and
Q$_1$ to Q$_4$ are each independently selected from hydrogen, deuterium, a hydroxyl group, a C$_1$-C$_{60}$ alkyl group, a $C_2$-$C_{60}$ alkenyl group, a $C_2$-$C_{60}$ alkynyl group, a $C_1$-$C_{60}$ alkoxy group, and a $C_6$-$C_{60}$ aryl group.

3. The electronic apparatus of claim 1, wherein
(i) n1 is a real number satisfying 0.01<n1≤0.2, and blue light is emitted from the perovskite compound;
n1 is a real number satisfying 0.21<n1≤0.4, and green light is emitted from the perovskite compound; or
n1 is a real number satisfying 0.41<n1≤1, and red light is emitted from the perovskite compound, and
(ii) n2 is a real number satisfying 0.01<n2≤0.2, and blue light is emitted from the perovskite compound;
n2 is a real number satisfying 0.21<n2≤0.4, and green light is emitted from the perovskite compound; or
n2 is a real number satisfying 0.41<n2≤1, and red light is emitted from the perovskite compound.

4. The electronic apparatus of claim 1, wherein
X is at least one halide anion selected from Cl⁻, Br⁻, and I⁻.

5. The electronic apparatus of claim 1, wherein
the electronic apparatus is a display apparatus.

6. An electronic apparatus comprising:
a light-emitting device comprising:
a first electrode;
a second electrode facing the first electrode; and
an intermediate layer between the first electrode and the second electrode and comprising an emission layer,
wherein the emission layer comprises a perovskite compound represented by one of Formulae 1 to 4:

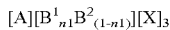 <Formula 1>

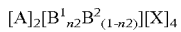 <Formula 2>

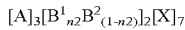 <Formula 3>

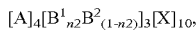 <Formula 4> wherein, in Formula 1,
A is at least one monovalent organic-cation, a monovalent inorganic cation, or any combination thereof,
$B^1$ is a $Sm^{2+}$ ion,
$B^2$ is a divalent cation of a rare earth metal, a divalent cation of an alkali earth metal, or any combination thereof,
n1 is a real number satisfying 0<n1≤1,
n2 is a real number satisfying 0<n2≤1, and
X is at least one monovalent anion.

7. An electronic apparatus comprising:
a first substrate;
an organic light-emitting device; and
a thin film located in at least one traveling path of light emitted from the organic light-emitting device,
wherein the thin film comprises the following perovskite compound:

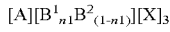 <Formula 1>

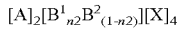 <Formula 2>

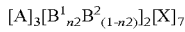 <Formula 3>

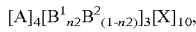 <Formula 4> wherein, in Formula 1,
A is at least one monovalent organic-cation, a monovalent inorganic cation, or any combination thereof,
$B^1$ is a $Sm^{2+}$ ion,
$B^2$ is at least one of $La^{2+}$, $ce^{2+}$, $Pr^{2+}$, $Nd^{2+}$, $Pm^{2+}$, $Eu^{2+}$, $Bi^{2+}$, $Ag^{2+}$, $Mn^{2+}$, $Sn^{2+}$, $Gd^{2+}$, $Tb^{2+}$, $Dy^{2+}$, $Ho^{2+}$, $Er^{2+}$, $Yb^{2+}$, $Lu^{2+}$, $Be^{2+}$, $Mg^{2+}$, $Ca^{2+}$, $Sr^{2+}$, $Ba^{2+}$, $Ra^{2+}$ and does not include a $Sm^{2+}$ ion,
n1 is a real number satisfying 0<n1≤1,
n2 is a real number satisfying 0<n2≤1, and
X is at least one monovalent anion.

8. The electronic apparatus of claim 7, wherein
$B^2$ is a divalent cation of a rare earth metal, a divalent cation of an alkali earth metal, or any combination thereof.

9. The electronic apparatus of claim 7, wherein
(i) n1 is a real number satisfying 0.01<n1≤0.2, and blue light is emitted from the perovskite compound;
n1 is a real number satisfying 0.21<n1≤0.4, and green light is emitted from the perovskite compound; or
n1 is a real number satisfying 0.41<n1≤1, and red light is emitted from the perovskite compound, and
(ii) n2 is a real number satisfying 0.01<n2≤0.2, and blue light is emitted from the perovskite compound;
n2 is a real number satisfying 0.21<n2≤0.4, and green light is emitted from the perovskite compound; or
n2 is a real number satisfying 0.41<n2≤1, and red light is emitted from the perovskite compound.

10. The electronic apparatus of claim 7, wherein
X is at least one halide anion selected from Cl⁻, Br⁻, and I⁻.

11. The electronic apparatus of claim 7, wherein
the electronic apparatus is an organic light-emitting display apparatus.

12. The electronic apparatus of claim 7, wherein
the organic light-emitting device emits first light,
the thin film absorbs the first light and emits second light, and
the first light and the second light have different maximum emission wavelengths from each other.

13. The electronic apparatus of claim 7, wherein
the thin film comprises:
a first perovskite compound represented by one of Formulae 1 to 4, and a second perovskite compound represented by one of Formulae 1 to 4; or
the first perovskite compound represented by one of Formulae 1 to 4, the second perovskite compound represented by one of Formulae 1 to 4, and a third perovskite compound represented by one of Formulae 1 to 4.

14. The electronic apparatus of claim 7, wherein
(i) the thin film comprises a first thin film comprising a first perovskite compound represented by one of Formulae 1 to 4, and a second thin film comprising a second perovskite compound represented by one of Formulae 1 to 4,
the organic light-emitting device emits first light,
the first thin film absorbs the first light and emits second light,
the second thin film absorbs at least one of the first light and the second light and emits third light, and
the first light, the second light, and the third light have different maximum emission wavelengths from each other, or
(ii) the thin film comprises a first thin film comprising a first perovskite compound represented by one of Formulae 1 to 4, a second thin film comprising a second perovskite compound represented by one of Formulae 1 to 4, and a third thin film comprising a third perovskite compound represented by one of Formulae 1 to 4, the organic light-emitting device emits first light, the first thin film absorbs the first light and emits second light, the second thin film absorbs at least one of the first light and the second light and emits third light, the third thin film absorbs at least one of the first light, the second light, and the third light and emits fourth light, and the first light, the second light, the third light, and the fourth light have different maximum emission wavelengths from each other.

15. A lighting apparatus comprising:

a light source; and a light conversion layer that absorbs at least part of light emitted from the light source and emits light having a wavelength band different from that of the absorbed light, wherein the light conversion layer comprises a perovskite compound represented by one of Formulae 1 to 4:

$[A][B^1_{n1}B^2_{(1-n1)}][X]_3$   <Formula 1>

$[A]_2[B^1_{n2}B^2_{(1-n2)}][X]_4$   <Formula 2>

$[A]_3[B^1_{n2}B^2_{(1-n2)}]_2[X]_7$   <Formula 3>

$[A]_4[B^1_{n2}B^2_{(1-n2)}]_3[X]_{10}$,   <Formula 4> wherein, in Formula 1,

A is at least one monovalent organic-cation, a monovalent inorganic cation, or any combination thereof, $B^1$ is a $Sm^{2+}$ ion, $B^2$ is at least one divalent inorganic cation and does not include a $Sm^{2+}$ ion, n1 is a real number satisfying $0<n1\leq 1$, n2 is a real number satisfying $0<n2\leq 1$, and X is at least one monovalent anion.

16. The lighting apparatus of claim 15, wherein $B^2$ is a divalent cation of a rare earth metal, a divalent cation of an alkali metal, or any combination thereof.

17. The lighting apparatus of claim 15, wherein (i) n1 is a real number satisfying $0.01<n1\leq 0.2$, and blue light is emitted from the perovskite compound;

n1 is a real number satisfying $0.21<n1\leq 0.4$, and green light is emitted from the perovskite compound; or n1 is a real number satisfying $0.41<n1\leq 1$, and red light is emitted from the perovskite compound, (ii) n2 is a real number satisfying $0.01<n2\leq 0.2$, and blue light is emitted from the perovskite compound;

n2 is a real number satisfying $0.21<n2\leq 0.4$, and green light is emitted from the perovskite compound; or n2 is a real number satisfying $0.41<n2\leq 1$, and red light is emitted from the perovskite compound.

18. The lighting apparatus of claim 15, wherein

X is at least one halide anion selected from $Cl^-$, $Br^-$, and $I^-$.

19. The lighting apparatus of claim 15, wherein the light source is a fluorescent lamp, a light-emitting diode (LED), an organic light-emitting diode (OLED), a quantum dot light-emitting diode (QLED), or any combination thereof.

20. The lighting apparatus of claim 15, wherein (i) the light source emits blue light, and the thin film comprises:

a first perovskite compound that absorbs the blue light and emits green light; and a second perovskite compound that absorbs at least one of the blue light and the green light and emits red light, or (ii) the light source emits ultraviolet (UV) light, and the thin film comprises:

a first perovskite compound that absorbs the UV light and emits blue light;

a second perovskite compound that absorbs at least one of the UV light and the blue and emits green light; and a third perovskite compound that absorbs at least one of the UV light, the blue light, and the green light and emits red light.

21. The lighting apparatus of claim 15, wherein (i) the light source emits blue light, and the thin film comprises:

a first layer comprising a first perovskite compound that absorbs the blue light and emits green light; and a second layer comprising a second perovskite compound that absorbs at least one of the blue light and the green light and emits red light, (ii) the light source emits UV light, and the thin film comprises:

i) a first layer comprising a first perovskite compound that absorbs the UV light and emits blue light and a second perovskite compound that absorbs at least one of the UV light and the blue light and emits green light; and a second layer comprising a third perovskite compound that absorbs at least one of the UV light, the blue light, and the green light and emits red light, or ii) a first layer comprising a first perovskite compound that absorbs the UV light and emits blue light; and a second layer comprising a second perovskite compound that absorbs at least one of the UV light and the blue light and emits green light and a third perovskite compound that absorbs the UV light, the blue light, and/or the green light and emits red light, or (iii) the light source emits UV light, and the thin film comprises:

a first layer comprising a first perovskite compound that absorbs the UV light and emits blue light;

a second layer comprising a second perovskite compound that absorbs at least one of the UV light and the blue light and emits green light; and a third layer comprising a third perovskite compound that absorbs at least one of the UV light, the blue light, and the green light and emits red light.

22. The lighting apparatus of claim 15, wherein the light conversion layer is in direct contact with at least one surface of the light source, or the light source and the light conversion layer are separated from each other.

23. The lighting apparatus of claim 15, wherein a light guide plate, a diffusion plate, a prism sheet, a microlens sheet, a brightness enhancement sheet, a reflective film, or any combination thereof is between the light source and the light conversion layer, or a light guide plate, a diffusion plate, a prism sheet, a microlens sheet, a brightness enhancement sheet, a reflective film, or any combination thereof is on the light conversion layer.

* * * * *